(12) United States Patent
Harada et al.

(10) Patent No.: US 6,476,491 B2
(45) Date of Patent: Nov. 5, 2002

(54) SEMICONDUCTOR DEVICE HAVING A MULTILAYER WIRING STRUCTURE AND PAD ELECTRODES PROTECTED FROM CORROSION AND METHOD FOR FABRICATING THE SAME

(75) Inventors: Shigeru Harada, Tokyo (JP); Yoshifumi Takata, Tokyo (JP); Junko Izumitani, Tokyo (JP)

(73) Assignee: Mitsubishi Denki Kabushiki Kaihsa, Tokyo (JP)

( * ) Notice: Subject to any disclaimer, the term of this patent is extended or adjusted under 35 U.S.C. 154(b) by 0 days.

(21) Appl. No.: 09/756,908

(22) Filed: Jan. 10, 2001

(65) Prior Publication Data

US 2001/0008311 A1 Jul. 19, 2001

(30) Foreign Application Priority Data

Jan. 12, 2000 (JP) ........................................ 2000-003708

(51) Int. Cl.⁷ .......................... H01L 23/48; H01L 23/52; H01L 29/40
(52) U.S. Cl. ......................... 257/758; 257/768; 438/622
(58) Field of Search ................................. 257/758, 211, 257/324, 768; 438/622

(56) References Cited

U.S. PATENT DOCUMENTS 5,488,542 A * 1/1996 Ito ............................. 361/793
5,645,887 A * 7/1997 Byun ......................... 427/248.1
5,719,416 A * 2/1998 Yoshimori et al. ........... 257/295
6,303,478 B1 * 10/2001 Nakamura et al. ........... 438/570

OTHER PUBLICATIONS

"Electro–Chemical Deposition of Copper for ULSI Metallization," by Dubin et al., 1997 VMIC Conference, Jun. 10–12, 1997 ISMIC–107/97/0069(c), pp. 69–74.
"Copper Integration in a Dual Damascene Architecture for Sub–Quarter Micron Technology," by Morand et al., 1997 VMIC Conference, Jun. 10–12, 1997, 1997 ISMIC–107/97/0075(c), pp. 75–81.
VLSI Technology, 1983, ISBN 0–07–066594, pp. 554–559. (Month Unknown).

* cited by examiner

Primary Examiner—David Nelms
Assistant Examiner—Tu-Tu Ho
(74) Attorney, Agent, or Firm—McDermott, Will & Emery

(57) ABSTRACT

The present invention provides a semiconductor device which can prevent the oxidization of the surfaces of pad electrodes to enhance the connecting strength between the pad electrodes and external terminals. The semiconductor device according to the present invention comprises pad electrodes for use in connecting external electrodes and a multilayer wiring structure connected to the pad electrodes, wherein one surface of an insulating layer covering the pad electrodes and having openings over the pad electrodes for exposing the surfaces of the pad electrodes is in contact with a metal layer. formed from one selected from precious metals and alloys containing the precious metals as main components.

13 Claims, 44 Drawing Sheets

SEMICONDUCTOR DEVICE HAVING A MULTILAYER WIRING STRUCTURE AND PAD ELECTRODES PROTECTED FROM CORROSION AND METHOD FOR FABRICATING THE SAME

BACKGROUND OF THE INVENTION

The present invention relates to a semiconductor device having a multilayer wiring structure, and particularly to a semiconductor device having a multilayer wiring structure and pad electrodes protected from corrosion, and a process for fabricating the same.

In semiconductor devices having multilayer wiring structures, wiring formed from aluminum-based alloys has been widely used. In such multilayer wiring, in general, pad electrodes are formed on the wiring on the uppermost layer, and external terminals are electrically connected to the pad electrodes through bonding wires or the like.

Recently, to achieve high speed and high performance of semiconductor devices, there is a tendency to use wiring formed from an alloy comprising, as a main component, copper which has low resistance and high reliability, so as to decrease wiring delay (or wiring resistance) or to increase the permissible current density of wiring.

FIGS. 20A to 20L show the steps of fabricating a semiconductor device using copper for wiring.

Referring to FIG. 20A, first, a semiconductor element 6 such as an MOS transistor comprising an insulating layer 2 for isolating the element, a gate-insulating layer 3, gate electrodes 4 and an impurity-diffusion layer 5 is formed on a semiconductor substrate 1. Then, an underlying insulating film 51 is deposited over a whole surface of the semiconductor element 6 by the thermal chemical vapor deposition process (thermal-CVD) or the plasma chemical vapor deposition process (plasma CVD). The underlying insulating film 51 has a three-layer structure which comprises an insulating layer 51a composed of a silicon oxide layer or a silicon oxide layer containing impurities such as phosphorous (P) and boron (B), a silicon nitride layer 51b serving to stop etching in the course of forming a wiring groove, and an insulating layer 51c such as a silicon oxide layer for forming the wiring groove.

Next, as shown in FIG. 20B, a contact hole 52 and a first wiring groove 53 are formed at predetermined positions on the underlying insulating film 51 by photolithography and etching. In this stage, the silicon nitride layer 51b has a high etching selective ratio with respect to the silicon oxide layer 51c, and thus serves as the stopper layer in the step of forming the first wiring groove 53.

Next, as shown in FIG. 20C, a barrier metal layer 54a and a tungsten (W) layer 54b are deposited on the overall surface to fill the contact hole 52 and the first wiring groove 53. As the barrier metal layer 54a, for example, a laminated film of a titanium (Ti) layer with a thickness of 10 to 50 nm and a titanium nitride (TiN) layer with a thickness of 50 to 100 nm is used to achieve good ohmic contact with the impurity-diffusion region 5 of the semiconductor device 6.

Next, as shown in FIG. 20D, the tungsten layer 54b and the barrier metal layer 54a except for the contact hole 52 and the first wiring groove 53 are removed by chemical mechanical polishing (hereinafter referred to as CMP) using a hydrogen peroxide-based alumina abrasive so as to form a first buried metal wiring layer 54 which has a thickness of about 100 to about 300 nm.

Next, as shown in FIG. 20E, a first interlayer insulating film 55 having a three-layer structure consisting of an insulating layer 55a of a silicon oxide or the like, a silicon nitride layer 55b and an insulating layer 55c of a silicon oxide or the like is deposited on the surface of the first metal wiring layer 54 in the same manner as in FIG. 20B. Subsequently, a first via hole 56 and a second wiring groove 57 are formed at predetermined positions on the first interlayer insulating film 55 by photolithography and etching.

Next, as shown in FIG. 20F, an underlying layer 58a and copper layers 58b and 58c are deposited on the overall surface so as to fill the first via hole 56 and the second wiring groove 57. The underlying layer 58a serves to prevent the copper from diffusing into the ambient insulating layer of silicon oxide or the like. As the underlying layer 58a, generally, a tantalum (Ta) layer, a tantalum nitride (TaN) layer, a lamination (TaN/Ta) of tantalum and tantalum nitride layers, a titanium nitride layer (TiN), a lamination (TiN/Ti) of a titanium layer and a titanium nitride layer or the like is used.

Further, a copper seed layer 58b is deposited on the overall surface as an underlying layer for electrolytic plating, and then, a copper plating layer 58c is deposited on the overall surface by the electrolytic plating process using a plating solution containing, for example, copper sulfate as a main component.

Next, as shown in FIG. 20G, the copper layers 58c and 58b and the underlying layer 58a except for the first via hole 56 and the second wiring groove 57 are removed by CMP to form a second buried metal wiring layer 58. The thickness of the second metal wiring layer 58 is, for example, about 300 to about 500 nm.

Next, as shown in FIG. 20H, a second interlayer insulating film having a four-layer structure consisting of a silicon nitride layer 59a for preventing copper from diffusing, an insulating layer 59b of silicon oxide or the like, a silicon nitride layer 59c and an insulating layer 59d of silicon oxide or the like is formed on the surface of the second metal wiring layer. 58. Subsequently, a second via hole 60 and a third wiring groove 61 are formed at predetermined positions on the second interlayer insulating film 59 by photolithography and etching.

Similarly, an underlying layer 62a and copper layers 62b and 62c are deposited on the overall surface so as to fill the second via hole 60 and the third wiring groove 61, and then, the copper layers 62c and 62b and the underlying layer 62a except for the second via hole 60 and the third wiring groove 61 are removed by CMP to form a third buried metal wiring layer 62.

Next, as shown in FIG. 20I, a third interlayer insulating film 63 having a four-layer structure consisting of a silicon nitride layer 63a, an insulating layer 63b of silicon oxide or the like, a silicon nitride layer 63c and an insulating layer 63d of silicon oxide or the like is deposited on the surface of the third metal wiring layer 62 in the same manner as in FIG. 20H. Subsequently, a third via hole 64 and a fourth wiring groove 65 are formed at predetermined positions on the third interlayer insulating film 63 by photolithography and etching. Then, an underlying layer 66a and copper layers 66b and 66c are deposited on the overall surface so as to fill the above hole and groove. Then, unnecessary portions of the copper layers 66c and 66b and the underlying layer 66a are removed by CMP so as to form a fourth buried metal wiring layer 66.

In this connection, the fourth and the fifth metal wiring layers are used as long-distance wiring and a power source line, and therefore have higher thickness as compared with the underlying first to third metal wiring layers.

Next, as shown in FIG. 20J, a forth interlayer insulating film 67 having a four-layer structure consisting of a silicon nitride layer 67a, an insulating layer 67b of silicon oxide or the like, a silicon nitride layer 67c and an insulating layer 67d of silicon oxide or the like is deposited on the forth metal wiring layer 66 in the same manner as in FIG. 20I. Subsequently, a forth via hole 68 and a fifth wiring groove 69 are formed at predetermined positions on the forth interlayer insulating film 67, and then, an underlying layer 70a and copper layers 70b and 70c are deposited on the overall surface to fill the above hole and the above groove. Then, unnecessary portions of the copper layers 70c and 70b and the underlying layer 70a are removed by CMP to form a fifth buried metal wiring layer 70.

Usually, a pad electrode 71 for use in connecting an external terminal is concurrently formed on the uppermost layer. Metal wiring with a thickness of at least 1.0 μm is usually used for the pad electrode, taking into account a wire bonding step.

Next, as shown in FIG. 20K, a dense silicon nitride layer 72a as a copper diffusion-preventive layer is deposited on the fifth metal wiring layer 70, and then, a protective insulating layer 72b such as a silicon nitride layer, silicon oxide layer, or their laminated film is deposited with a thickness of about 1.0 μm.

Subsequently, if necessary, a buffer coating layer 73 of polyimide or the like may be formed with a thickness of about 5 to about 10 μm as a second protective insulating layer on the above protective insulating layer, and an opening 74 is formed at a predetermined position on the pad electrode 71.

Next, the reverse side of the chip divided from the semiconductor substrate 1 is bonded to a lead frame or a mount substrate with a resin or solder (not shown). Then, as shown in FIG. 20L, a wire 75 of gold or copper is bonded to an exposed portion of the copper wiring layer in the opening 74 of the pad electrode by means of ultrasonic waves, thermo compression bonding or the like, so that an intermetallic compound layer or an inter diffusion layer 76 is formed on the contact interface between the pad electrode 71 and the bonding wire 75.

Finally, a whole of the surface of the chip is sealed with a mold resin 77 to complete the semiconductor device shown in FIG. 19.

However, the conventional semiconductor device with the above structure has a problem in that, as shown in FIG. 21A, the pad electrode 71 is formed from copper which is easily oxidized. Therefore, an oxidized layer 78 with a thickness of about 5 to about 10 nm, which is relatively thick, is formed soon on the surface 74 of the pad electrode 71 as shown in the enlarged view of FIG. 21B.

In case where wire bonding is carried out as shown in FIG. 22A, the oxidized layer 78 can not be sufficiently destructed by means of ultrasonic waves or thermo compression bonding, because the oxidized layer 78 of copper is thickly formed on the surface of the pad electrode 71. Accordingly, it is impossible to uniformly form the intermetallic compound layer 76 on the interface between the bonding wire 75 and the pad electrode 71 as shown in the enlarged view of FIG. 22B, and thus, it is hard for their contact portion to have sufficient bonding strength. This is a serious problem for a highly integrated semiconductor device because it is inevitable to reduce the size of pad electrodes and the diameter of wire more and more in association with a tendency of high degree of integration in semiconductor devices.

On the other hand, where a pad electrode is formed from aluminum which forms a relatively thin oxidized layer on the surface, a decrease in bonding strength due to the formation of the oxidized layer arises a problem in association with the tendency of high degree of integration in semiconductor devices and smaller sizes of pad electrodes.

To overcome this problem, Japanese Kokai Patent Publication No. 5-82581/1993 discloses an aluminum pad electrode covered with a gold layer which is hardly oxidized, so as to protect the surface of the pad electrode from oxidization. However, in spite of such a structure, the bonding strength is still insufficient in the pad electrode of this highly integrated semiconductor device, resulting in poor reliability of the semiconductor device.

The present inventors have intensively researched this problem, and found that an oxidation seed enters the interface between the metal layer coating the surface of the pad electrode and the insulating layer coating the periphery of the metal layer, that an oxidized layer forms particularly around the periphery of the surface of the pad electrode, and that such an oxidized layer would give adverse influence on the pad surface if the area of the pad is small, thereby degrading the bonding strength.

That is, an object of the present invention is to provide a semiconductor device in which the surfaces of the pad electrodes can be protected from oxidation despite its highly integrated structure and in which the connecting strength to external terminals is improved.

SUMMARY OF THE INVENTION

The present invention provides a semiconductor device which comprises a multilayer wiring structure including a semiconductor substrate, an insulating layer formed on the semiconductor substrate, and at least one via hole formed on the insulating layer to contact the layers of the multilayer wiring film with each other; at least one pad electrode connected to the multilayer wiring structure and for use in connection with at least one external electrode; and an insulating layer covering the pad electrode and having at least one opening over the pad electrode so as to expose the surface of the pad electrode, wherein one surface of the insulating layer is in contact with a metal layer formed from one selected from precious metals and alloys containing the precious metals as main components.

By allowing one surface of the insulating layer to contact with the metal layer as mentioned above, the oxidation of the pad electrode at the periphery of the opening of the insulating layer, one of the serious problems of highly integrated semiconductor devices, can be prevented.

Thus, sufficient connecting strength can be obtained between the pad electrode and an external electrode, even if the area of the pad electrode is reduced in association with the tendency of high degree of integration in semiconductor devices.

The multilayer wiring structure comprises a plurality of layers arranged interposing insulating layers therebetween for composing a multilayer wiring, and at least one via hole for use in connection of the layers of the multilayer wiring film with each other.

Examples of the precious metal materials include precious metals such as gold, silver, platinum, palladium, rhodium, and alloys containing these precious metals as main components.

In another aspect, the present invention provides a semiconductor device wherein an oxidation-preventive layer is formed from one selected from the above precious metals and the above alloys, and wherein such an oxidation-preventive layer is continuously formed on exposed the surface of the pad electrode within the opening and on the insulating layer within the opening.

By continuously forming the oxidation-preventive layer on not only the surface of the pad electrode but also the side wall of the opening of the insulating layer, a part of the pad electrode around the periphery of the opening of the insulating layer can be protected from oxidation.

In a further aspect, the present invention provides a semiconductor device, wherein an electrode for use in connecting an external terminal is provided, and the electrode is formed from one of the above precious metals and the above alloys, and the electrode is buried in the above opening so as to raise its upper end portion over the surface of the insulating layer.

By burying, in the opening, the electrode formed from one of the above precious metals and the above alloys for use in connection with an external electrode, the oxidization of the pad electrode around the periphery of the opening of the insulating layer can be prevented.

Further, by providing such an electrode, the connection with the external electrode can be achieved without forming any oxidized layer on the surface of the electrode.

In a further aspect of the present invention, a plurality of such openings as mentioned above may be provided and a plurality of electrodes for use in connection with external electrodes may be buried in the plurality of the openings, respectively.

By using the plurality of electrodes for use in connection with external electrodes instead of one electrode, dishing can be prevented in the polishing step, and the upper end faces of the electrodes can be formed flat and even.

It is preferable that the pad electrode is formed from aluminum or copper which is favorable in view of resistance and the like.

In a further aspect, the present invention provides a semiconductor device wherein the pad electrode is formed from one selected from the above precious metals and the above alloys.

By using such a pad electrode, the oxidization of the pad electrode around the opening of the insulating layer can be prevented.

In a further aspect, the present invention provides a semiconductor device wherein an underlying pad electrode is interposed between the pad electrode and the multilayer wiring film for connecting to them, respectively.

As described above, the pad electrode has a two-layer structure and therefore has a substantially increased thickness, so that a larger load can be applied thereto in the course of wire bonding, and therefore that the bonding strength can be enhanced.

It is preferable that the pad electrode and the underlying pad electrode are connected to each other through a via hole having a larger area than that of the former via hole connecting the layers of the multilayer wiring film. This is because the mechanical strength of the pad electrode portion can be increased.

It is preferable that the multilayer wiring structure is formed from aluminum or copper which is favorable in view of resistance and the like.

Further, the present invention provides a process for fabricating a semiconductor device in which a multilayer wiring structure is formed on a semiconductor substrate and at least one pad electrode is formed in connection with the multilayer wiring structure, and the process comprises the steps of forming at least one pad electrode connected to the multilayer wiring structure, forming an insulating layer so as to cover the pad electrode, forming at least one opening on the insulating layer so as to expose the surface of the pad electrode, and forming an oxidation-preventive layer from one selected from precious metals and alloys containing the precious metals as main components so as to cover the exposed surface of the pad electrode and the side wall of the opening.

The present invention provides another process for fabricating a semiconductor device, wherein the step of forming the above oxidation-preventive layer includes a step of forming a metal layer from one selected from the above precious metals and the above alloys on the overall surface of the insulating layer, and a step of removing the metal layer on the surface of the insulating layer by chemical mechanical polishing (CMP) so that parts of the metal layer on the exposed surface of the pad electrode and the side wall of the opening are left remaining so as to serve as the above oxidation-preventive layer.

The use of CMP is effective to prevent a variation in etching which may occur because of the residual resist.

The present invention provides a further process for fabricating a semiconductor device wherein the step of forming the oxidation-preventive layer includes a step of forming a re-deposited layer by sputtering the exposed surface of the pad electrode within the above opening so as to re-deposit the pad electrode material on the side wall of the opening, and a step of forming the above oxidation-preventive layer by selectively forming a plating layer from one selected from the above precious metals and the above alloys on the exposed surface of the pad electrode and the re-deposited layer.

The use of the selective plating is also effective to prevent a variation in etching due to the residual resist or the like.

The present invention provides a further process for fabricating a semiconductor device wherein the step of forming the above oxidation-preventive layer includes a step of depositing a metal layer of one selected from the above precious metals and the above alloys on the overall surface of the insulating layer, a step of forming an electrode for use in connecting an external electrode as well as in serving as the oxidation-preventive layer by removing the metal layer on the insulating layer by CMP so that a part of the metal layer can remain and fill the above opening, and a step of raising the above electrode over the surface of the insulating layer by selectively etching the insulating layer.

Thus, by employing CMP, the electrode for use in connecting an external electrode can be formed having a flat and even upper end face.

The present invention provides a further process for fabricating a semiconductor device which comprises a step of forming an insulating layer on the multilayer wiring structure, a step of forming an opening for pad electrode on the insulating layer so as to expose the multilayer wiring structure, a step of depositing a metal layer of one selected from precious metals and alloys containing the precious metals as main components on the overall surface of the insulating layer, and a step of forming a pad electrode by removing the metal layer on the insulating layer by CMP so that a part of the metal layer can remain in the opening and fill the same so as to serve as a pad electrode.

The use of CMP also makes it possible to prevent a variation in etching due to the remaining resist and to form an even pad electrode.

Furthermore, the present invention provides a CMP apparatus for polishing a metal layer formed from one selected from the above precious metals and the above alloys, using abrasive cloth, and the CMP apparatus comprises a means for polishing the above metal layer by pressing the abrasive cloth against the metal layer, a means for dressing the abrasive cloth, using a chemical for corroding the metal layer, and a means for conditioning the abrasive cloth by washing the chemical with pure water.

It is preferable that the chemical contains one corrosive solution selected from nitric acid, ammonium persurfate, hydrochloric acid and hydrogen peroxide.

Still furthermore, the present invention provides a method of chemical mechanical polishing (CMP) to polish a metal layer formed from one selected from the above precious metals and the above alloys, and the method comprises a step of polishing the metal layer by pressing the abrasive cloth against the metal layer, a step of dressing the abrasive cloth using a chemical corrosive to the metal layer, and a step of conditioning the abrasive cloth by washing the chemical with pure water.

As is understood from the foregoing, according to the semiconductor devices of the present invention, the surface of the pad electrode can be protected from oxidization, and therefore, the connection strength between the pad electrode and an external terminal can be enhanced to improve the reliability of the semiconductor device.

Particularly, sufficient connection strength can be obtained between a pad electrode and an external terminal even in case of a highly integrated semiconductor device which comprises very small pad electrodes.

Further, according to the process for fabricating a semiconductor device of the present invention, it becomes possible to form a pad electrode and an electrode for connecting an external terminal both having highly even upper end faces.

Furthermore, by using the CMP method and the CMP apparatus of the present invention, the layer formed from a precious metal or an alloy containing the precious metal can be effectively polished.

DETAILED DESCRIPTION OF THE PREFERRED EMBODIMENTS

Hereinbelow, the present invention will be described in more detail by way of preferred embodiments, which, however, should not be construed as limiting the scope of the present invention, any way.

First Embodiment

Figure 1:
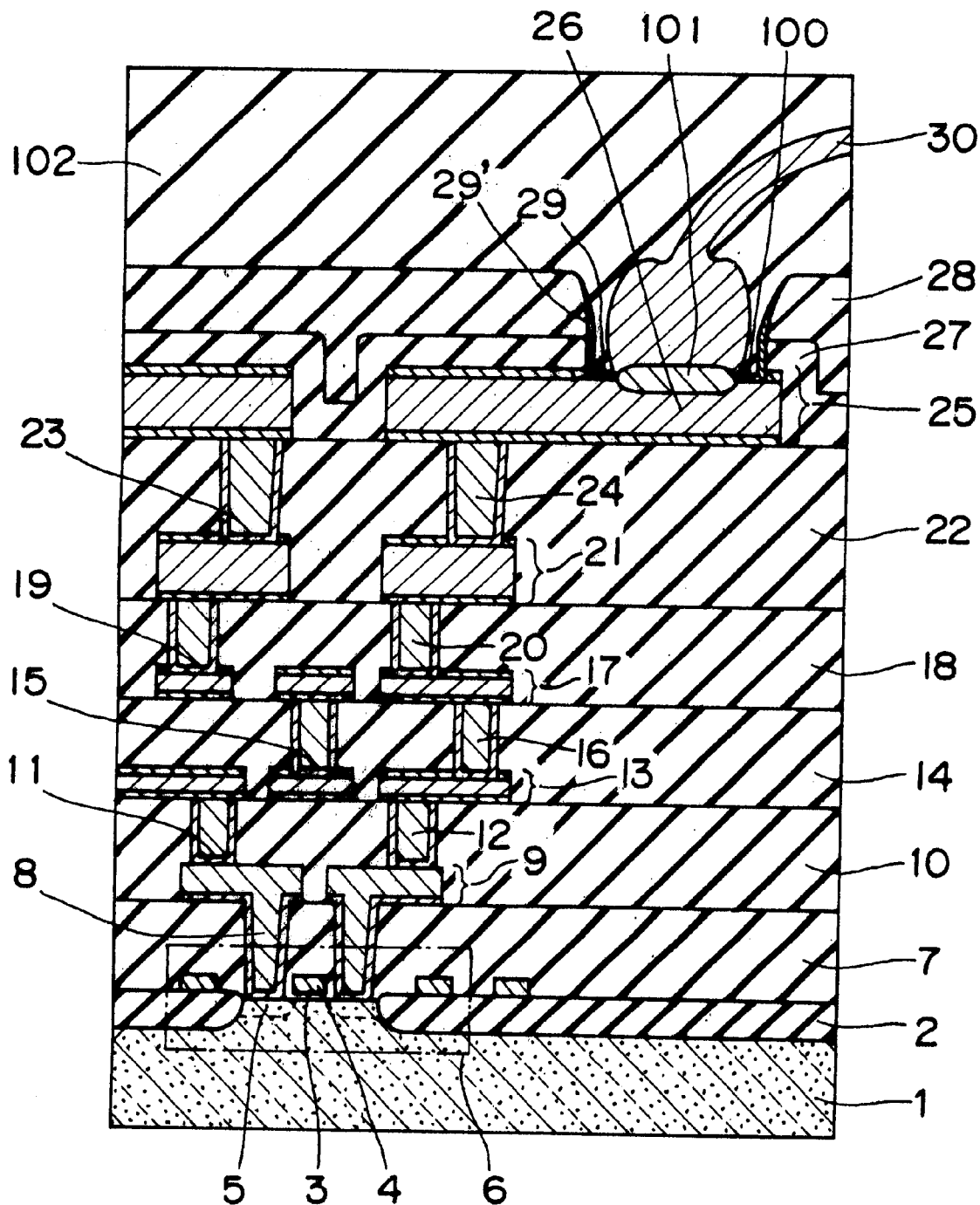
FIG. 1 is a sectional view of a semiconductor device according to the first embodiment of the present invention.
Figure 19:
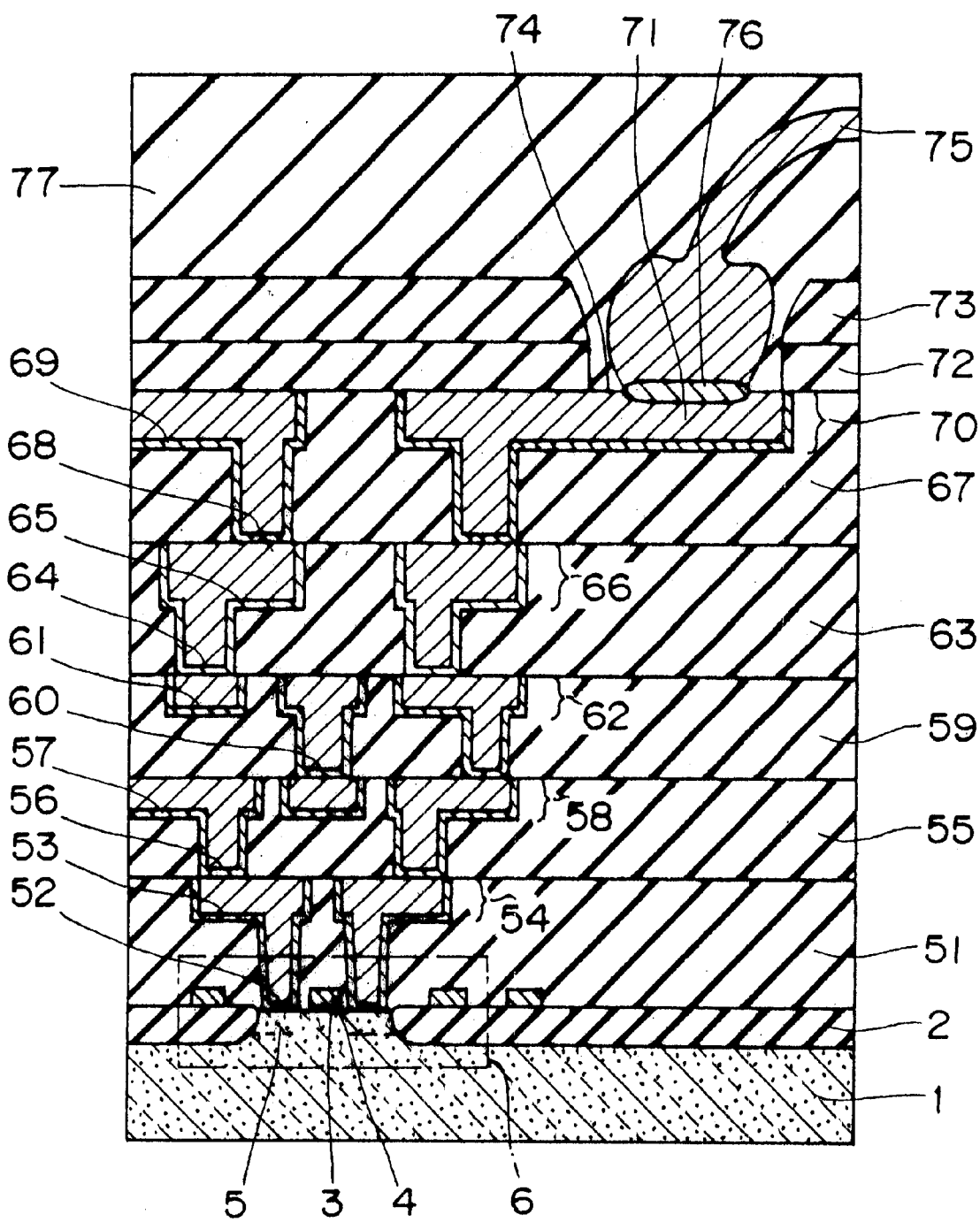
FIG. 19 shows a sectional view of a conventional semiconductor device.
Figure 20A:
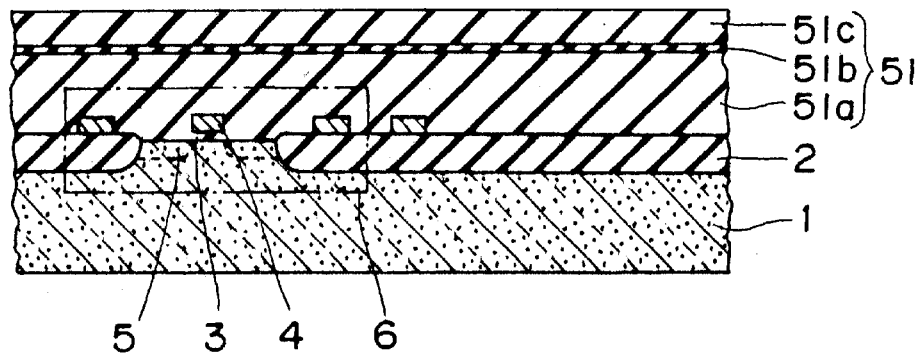
FIGS. 20A–20L show the steps of fabricating the conventional semiconductor device.
Figure 20B:
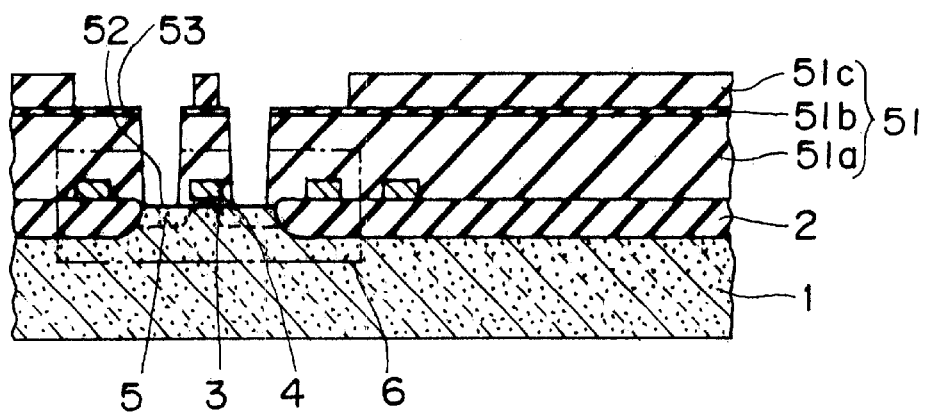
Figure 20C:
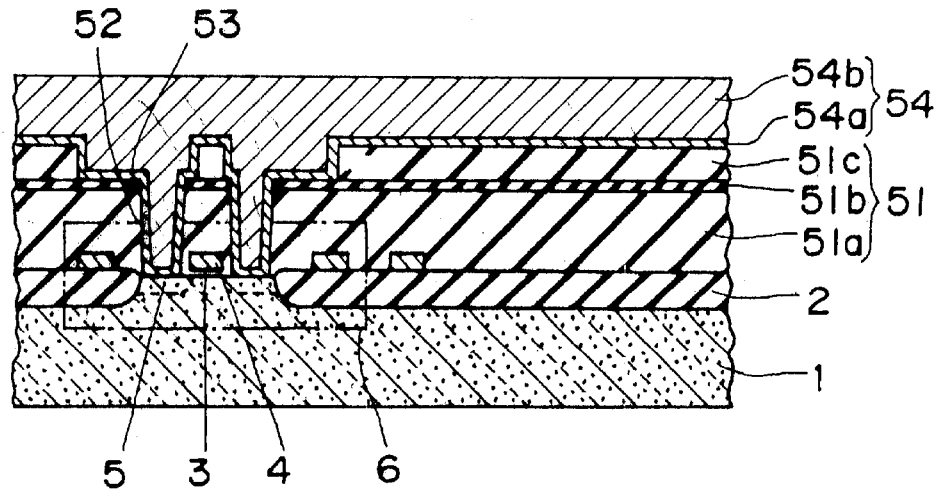
Figure 20D:
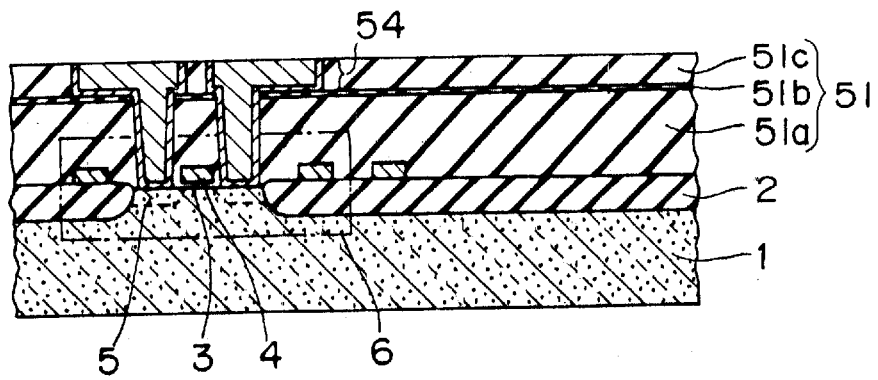
Figure 20E:
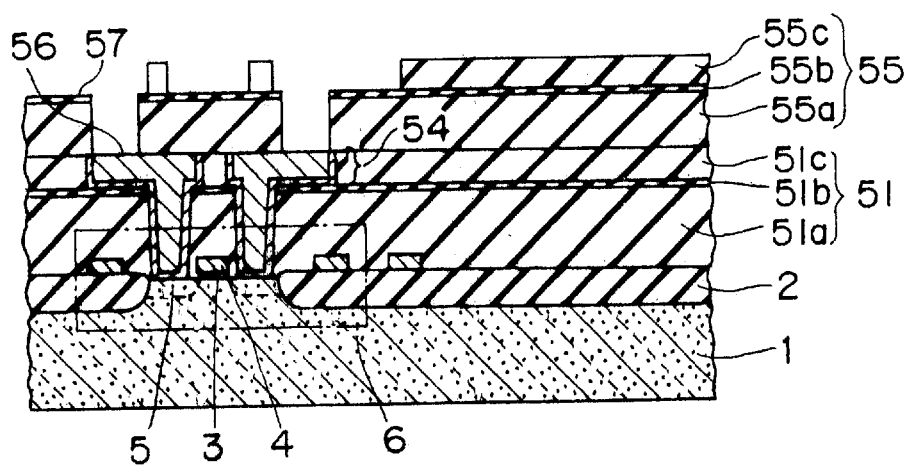
Figure 20F:
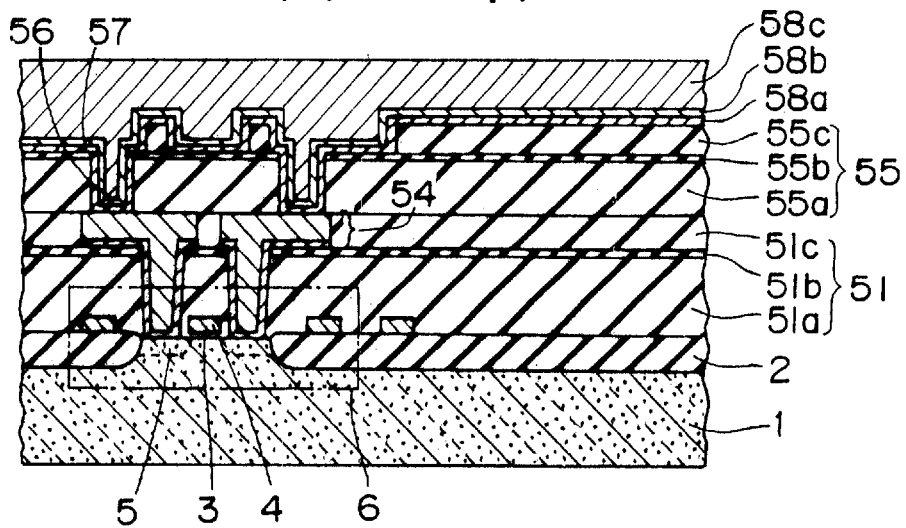
Figure 20G:
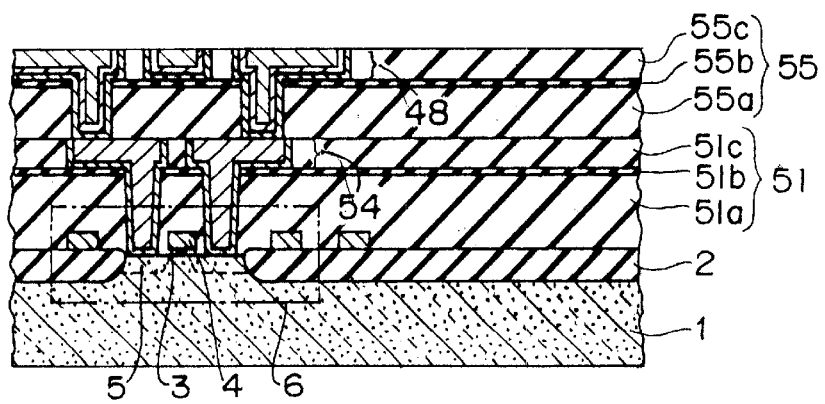
Figure 20H:
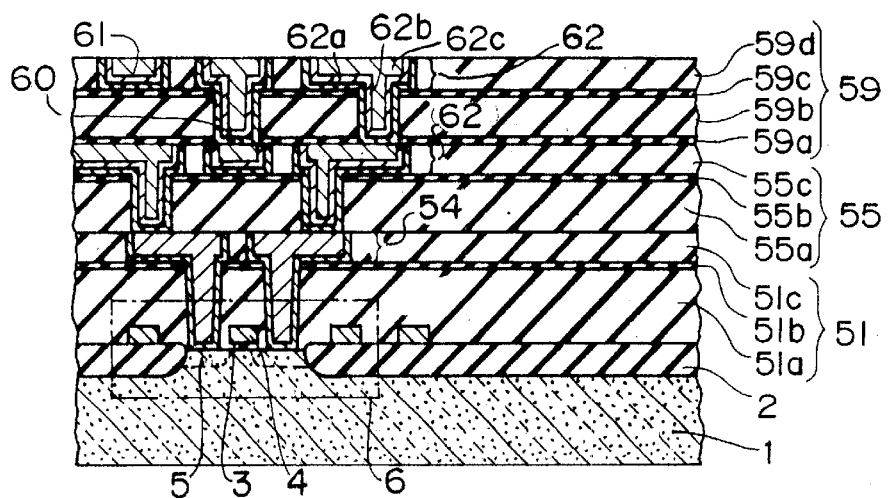
Figure 20I:
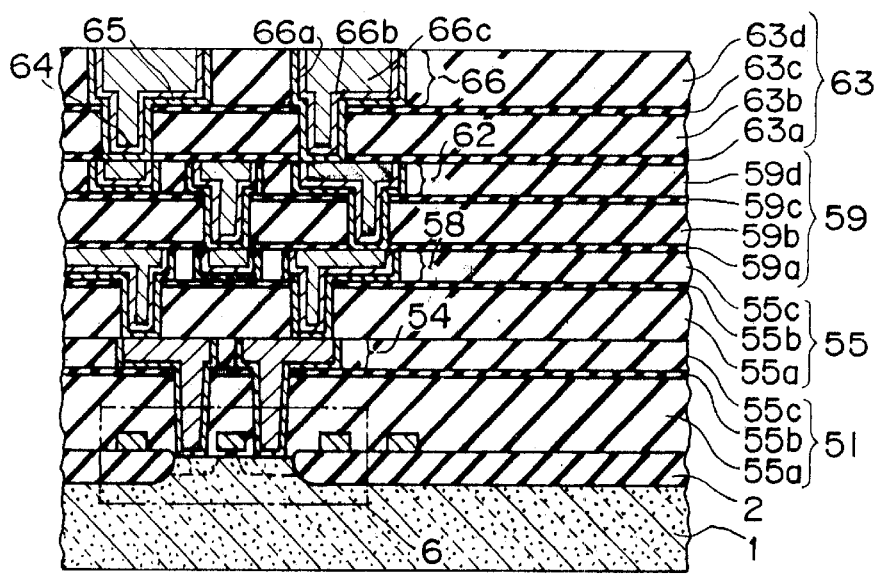
Figure 20J:
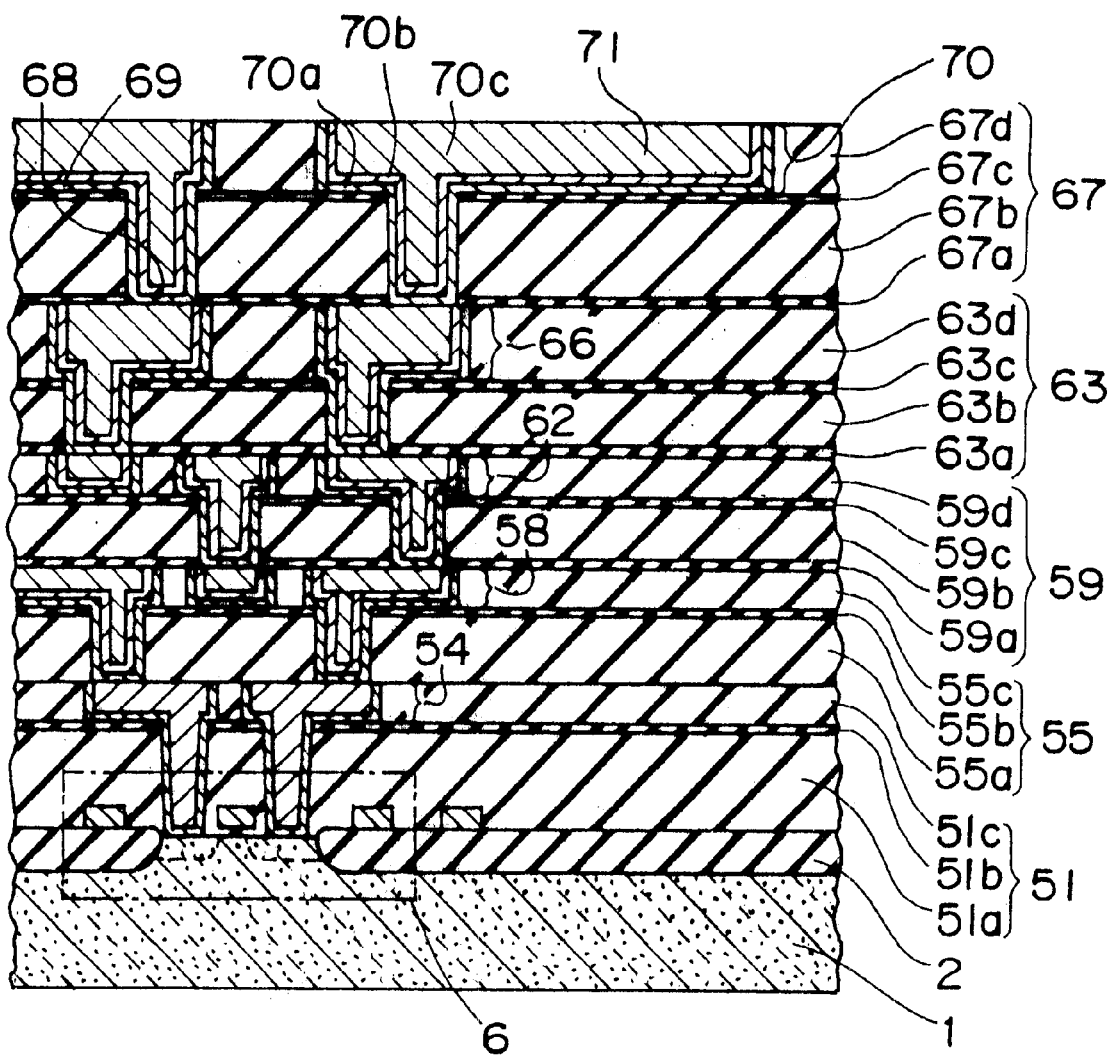
Figure 20K:
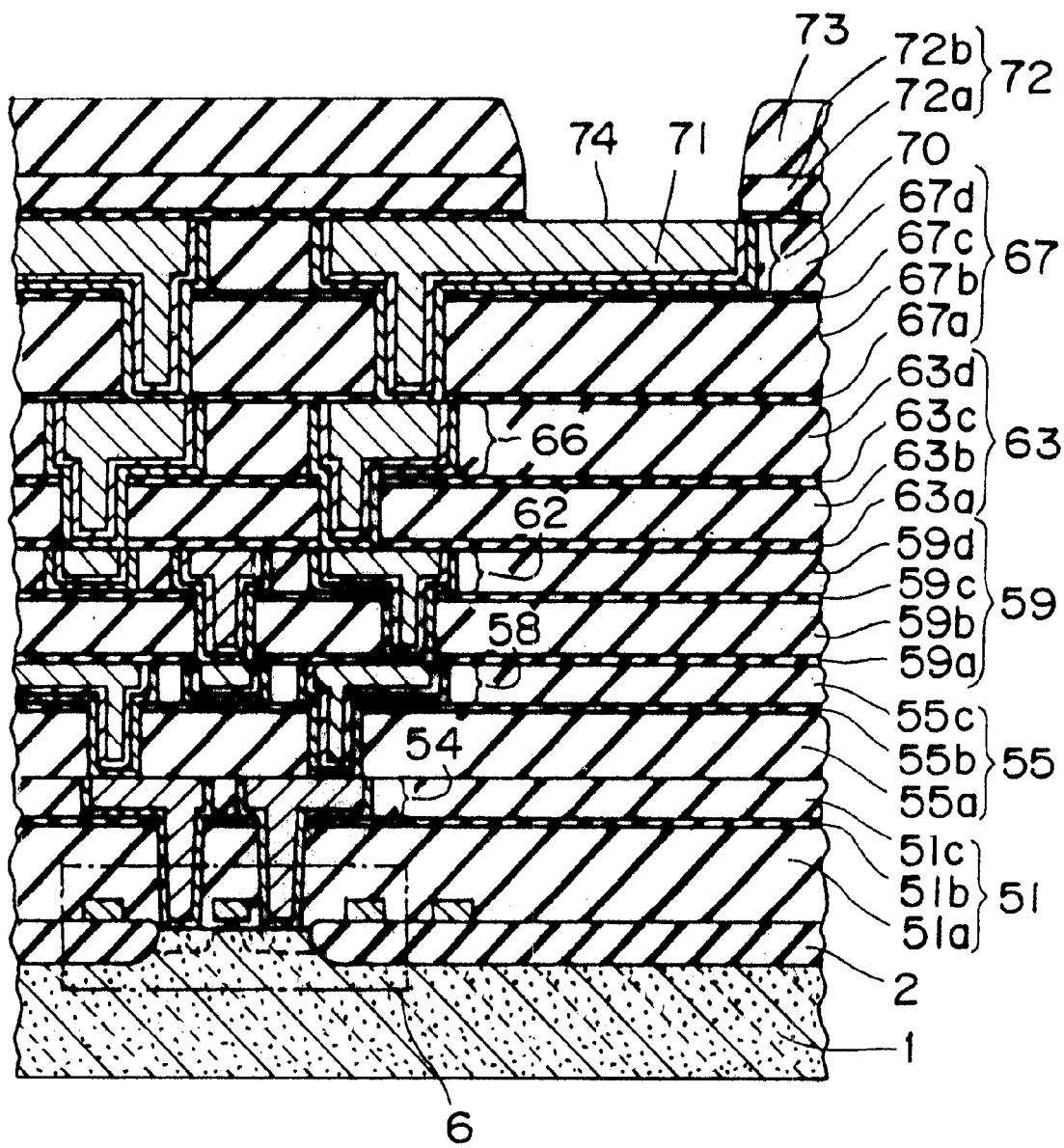
Figure 20L:
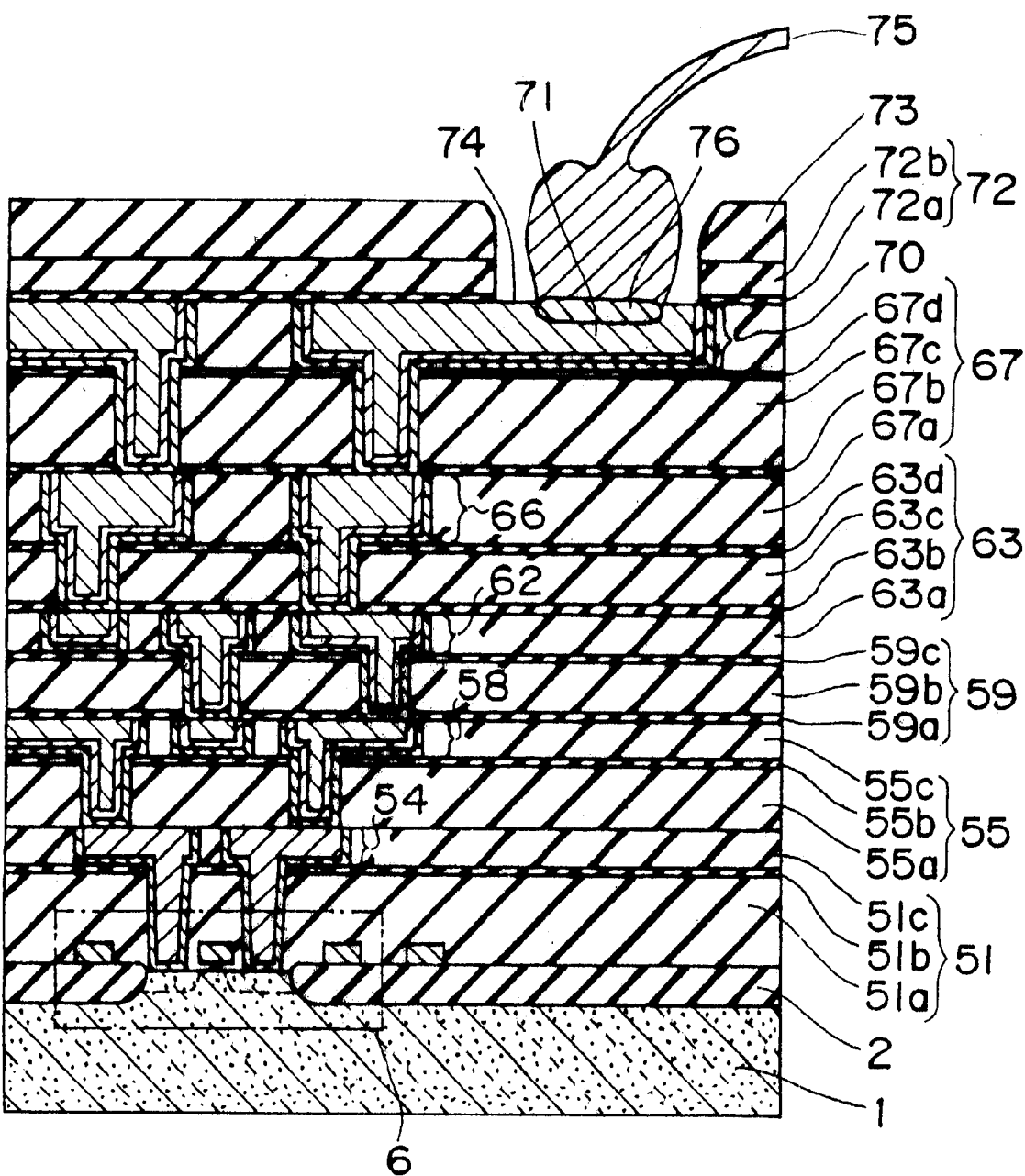
Figure 21A:
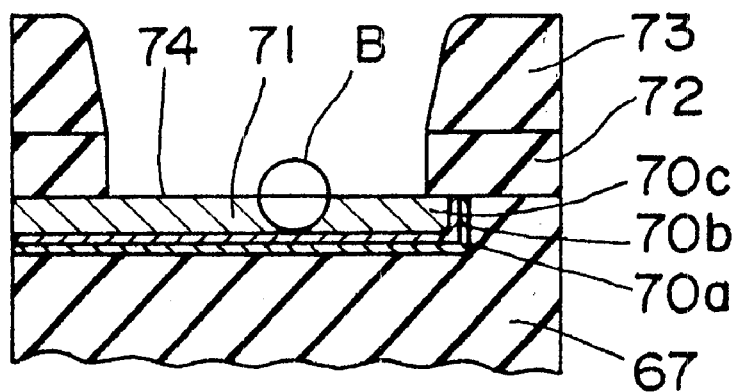
FIGS. 21A and 21B are sectional views of the conventional semiconductor device.
Figure 21B:
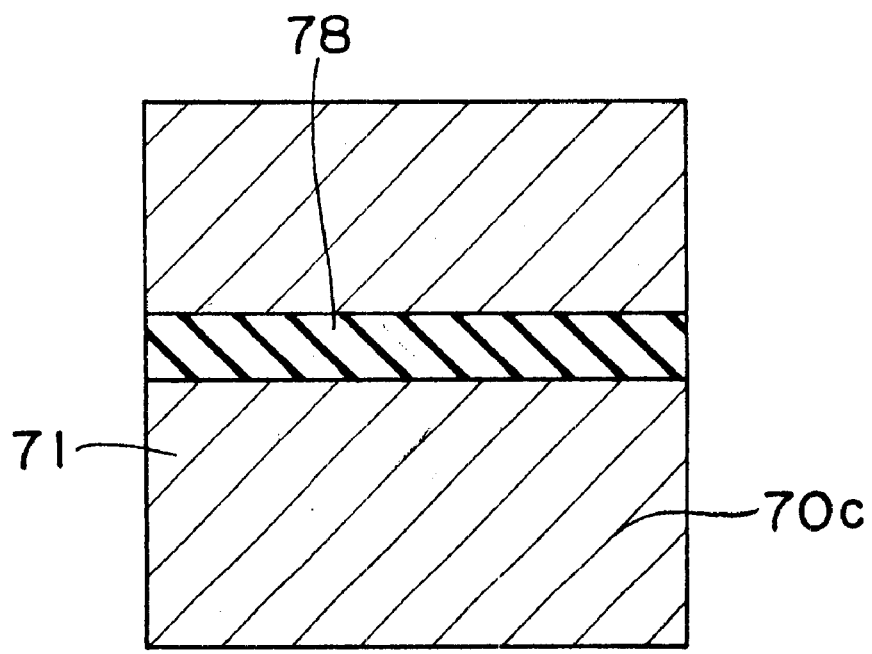
Figure 22A:
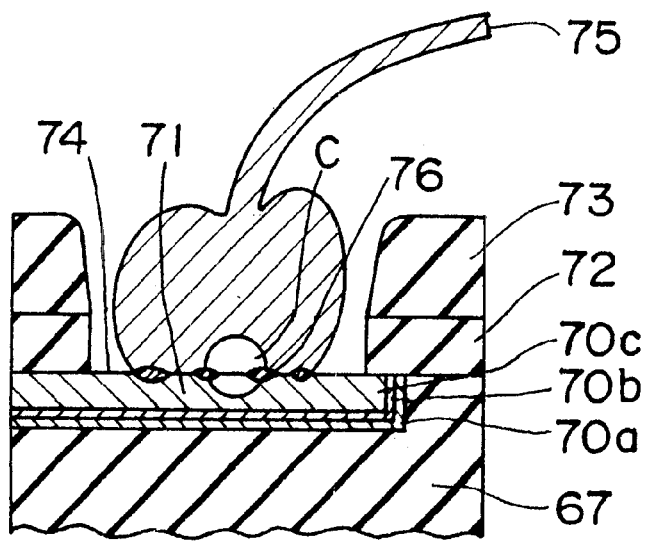
FIGS. 22A and 22B are sectional views of the conventional semiconductor device.
Figure 22B:
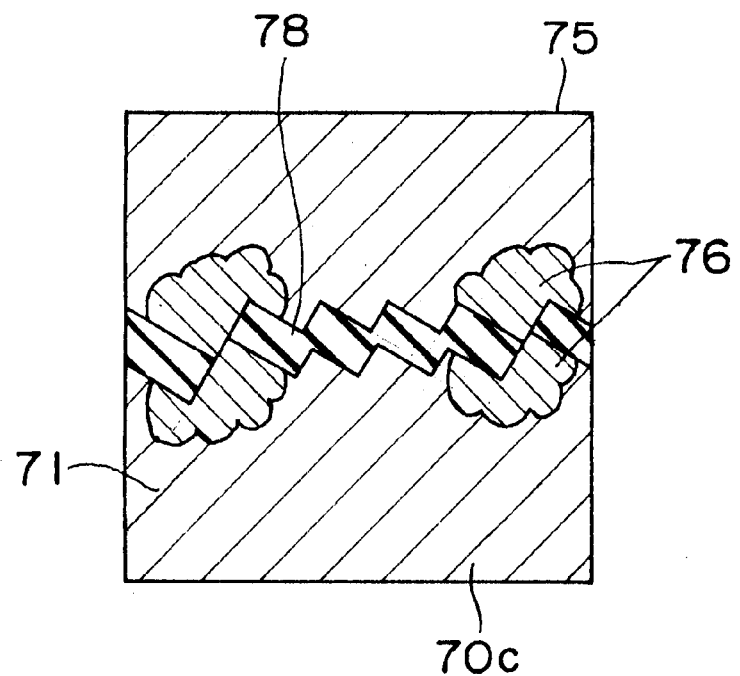

FIG. 1 is a sectional view of a semiconductor device according to the first embodiment of the present invention. FIGS. 2A to 2K show the steps of fabricating the semiconductor device. In these figures, the same reference numerals as those in FIG. 19 refer to the same or corresponding components.

Figure 2A:
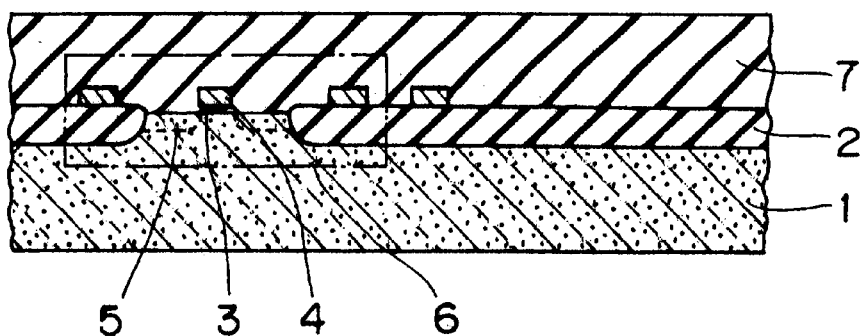
FIGS. 2A–2K show the steps of fabricating the semiconductor device according to the first embodiment of the present invention.

The steps of fabricating the semiconductor device shown in FIG. 1 is described below. First, as shown in FIG. 2A, a semiconductor element such as a MOS transistor or the like which comprises an element-separating insulating layer 2, a gate-insulating layer 3, gate electrodes 4 and an impurity-diffusion layer 5 is formed on a semiconductor substrate 1. Then, an underlying insulating layer 7 composed of a silicon oxide layer or a silicon oxide layer containing impurities such as phosphorous, boron and the like is deposited on the overall surface of the semiconductor element 6.

Figure 2B:
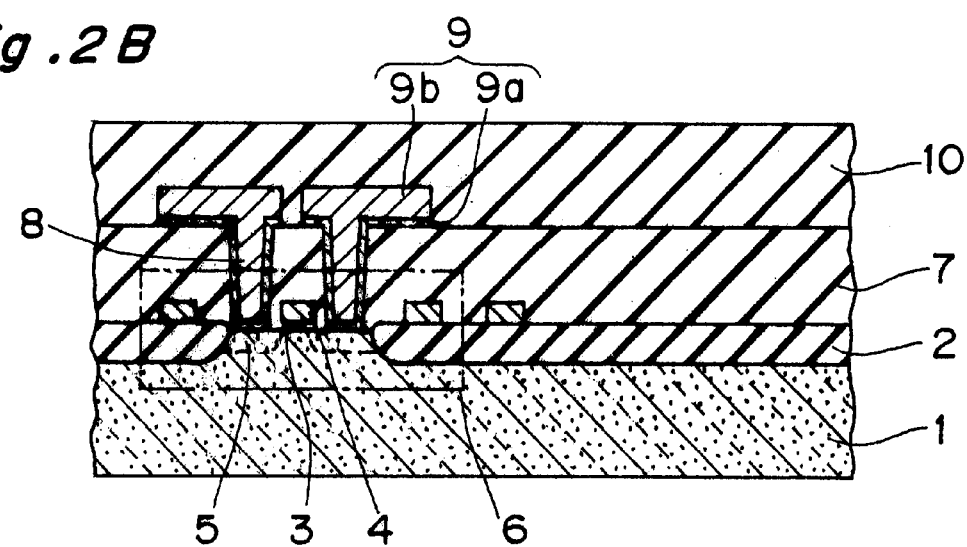

Next, as shown in FIG. 2B, contact holes 8 are formed at predetermined positions on the underlying insulating layer 7 on the semiconductor element 6 by photolithography and etching. Then, for example, a TiN/Ti barrier metal layer 9a comprising a lamination of a titanium layer with a thickness of 10 to 50 nm and a titanium nitride layer with a thickness of 50 to 100 nm is deposited on the surfaces of the contact holes by the PVD process or the CVD process so as to achieve good ohmic contact with the impurity-diffusion region 5 of the semiconductor element 6.

Next, a tungsten or wolfram layer 9b is deposited by the thermal CVD process which utilizes the reduction between tungsten hexafluoride ($WF_6$) and hydrogen. The thickness of the tungsten layer 9b is usually about 100 to about 300 nm.

By depositing the tungsten layer 9b at a temperature of about 375 to about 450° C., the step-coverage is improved so that even contact holes 8 with a high aspect ratio can be easily filled with such a layer. In addition, the titanium nitride layer for use as a barrier metal serves to protect the silicon substrate from damage due to tungsten hexafluoride in the course of forming the tungsten layer.

Next, the lamination film of the barrier metal layer 9a and the tungsten layer 9b is patterned by photolithography and etching to form a first metal wiring layer 9. The wiring 9 formed from tungsten has wiring resistance about three times higher than aluminum wiring, but it is formed by a simple process because no plug is needed. Accordingly, wiring of this type is usually used for relatively short wiring such as local wiring or the like.

Next, a first interlayer insulating layer 10 is deposited on the first metal wiring layer 9. Since this first interlayer insulating layer 10 serves as an underlying layer for a second metal wiring layer, this layer is needed to have a sufficient evenness. For example, a silicon oxide layer with a high thickness is deposited on the whole surface of the first interlayer insulating layer by the CVD process utilizing high density plasma or the like, and then, its surface is polished level by CMP using an aqueous potassium hydroxide or ammonia solution-based silica abrasive. The interlayer insulating layer usually has a thickness of about 0.5 to about 1.5 $\mu$m.

Otherwise, an interlayer insulating layer may be formed by depositing a silicon oxide layer by the CVD process and forming a coating insulating layer on the silicon oxide layer by SOG (spin on glass) or the like so as to level the silicon oxide layer.

Figure 2C:
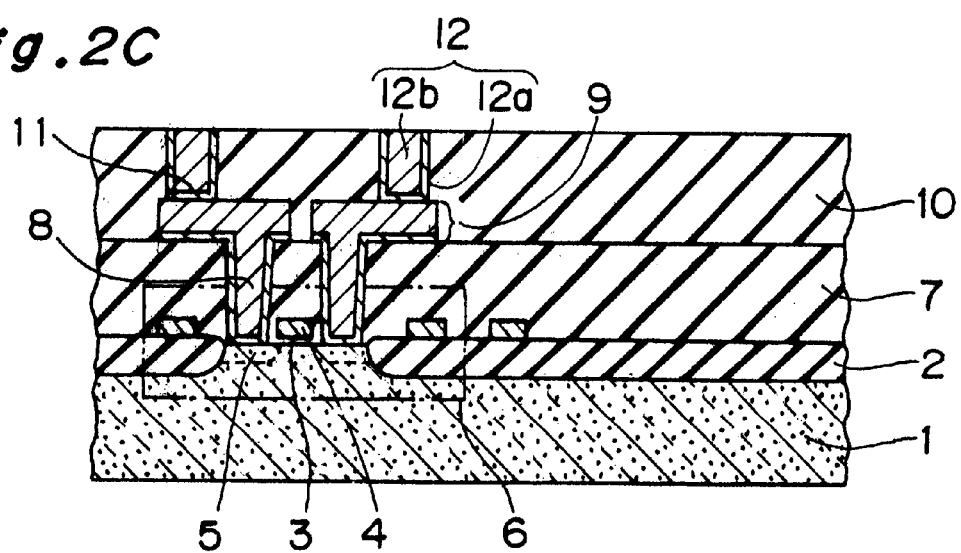

Next, as shown in FIG. 2C, first via holes 11 are formed at predetermined positions on the first interlayer insulating layer 10 by photolithography and etching. Then, a first via plug underlying film 12a comprising a lamination of a titanium layer with a thickness of 10 to 50 nm and a titanium nitride layer with a thickness of 50 to 100 nm is deposited by the PVD or CVD process in the same manner as the formation of the barrier metal layer, so that sufficient contact with the first tungsten wiring layer 9 can be achieved. Then, a tungsten layer 12b having sufficient step-coverage is deposited by the CVD process, and then, the tungsten layer 12b as the surface layer and the via plug underlying layer 12a are polished by CMP using an aqueous hydrogen peroxide solution-based alumina abrasive. Thus, a first via plug 12 is formed by leaving the metal layer in only the via holes 11.

Figure 2D:
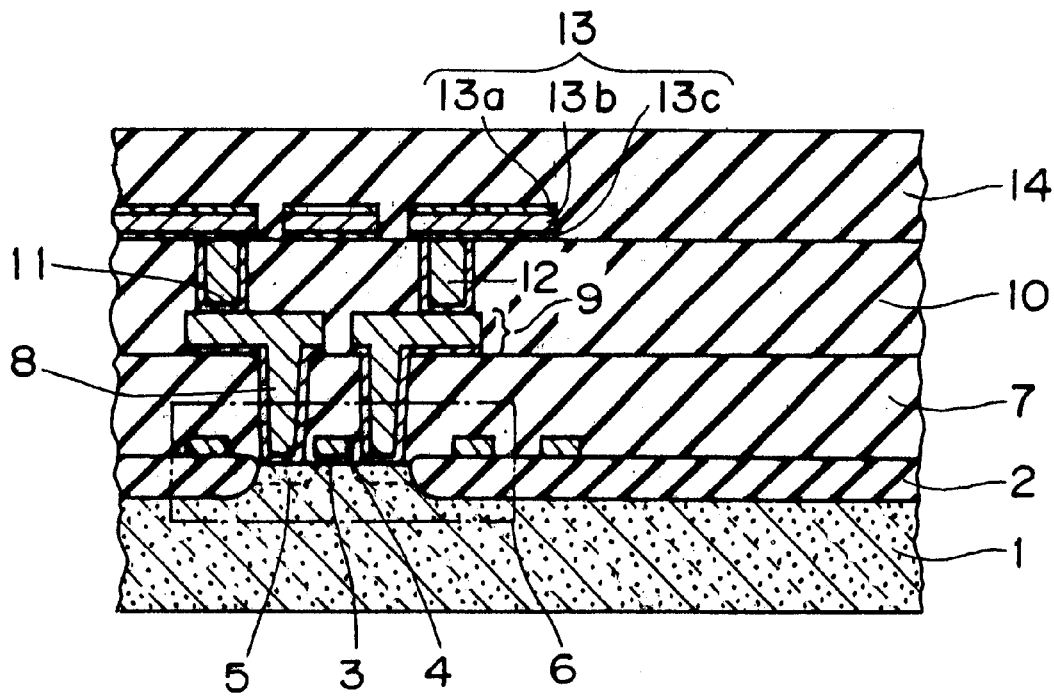

Next, as shown in FIG. 2D, as an underlying layer 13a for wiring, a titanium layer, a titanium nitride layer or their laminated layer is deposited with a thickness of 50 to 100 nm by the PVD process. Then, an aluminum alloy layer 13b of Al/Cu, Al/Si/Cu, Al/Cu/Ti or the like, and a titanium nitride layer as a wiring-coating layer (reflection-preventive layer) 13c are deposited by the PVD process. The aluminum alloy layer 13b usually has a thickness of about 300 to about 500 nm depending on the end use.

Next, an aluminum alloy wiring layer as a second metal wiring layer 13 is formed by patterning the above laminated film by photolithography and etching. Then, a second interlayer insulating layer 14 is deposited on the second metal wiring layer 13 in the same manner as in the formation of the first interlayer insulating layer 10.

Figure 2E:
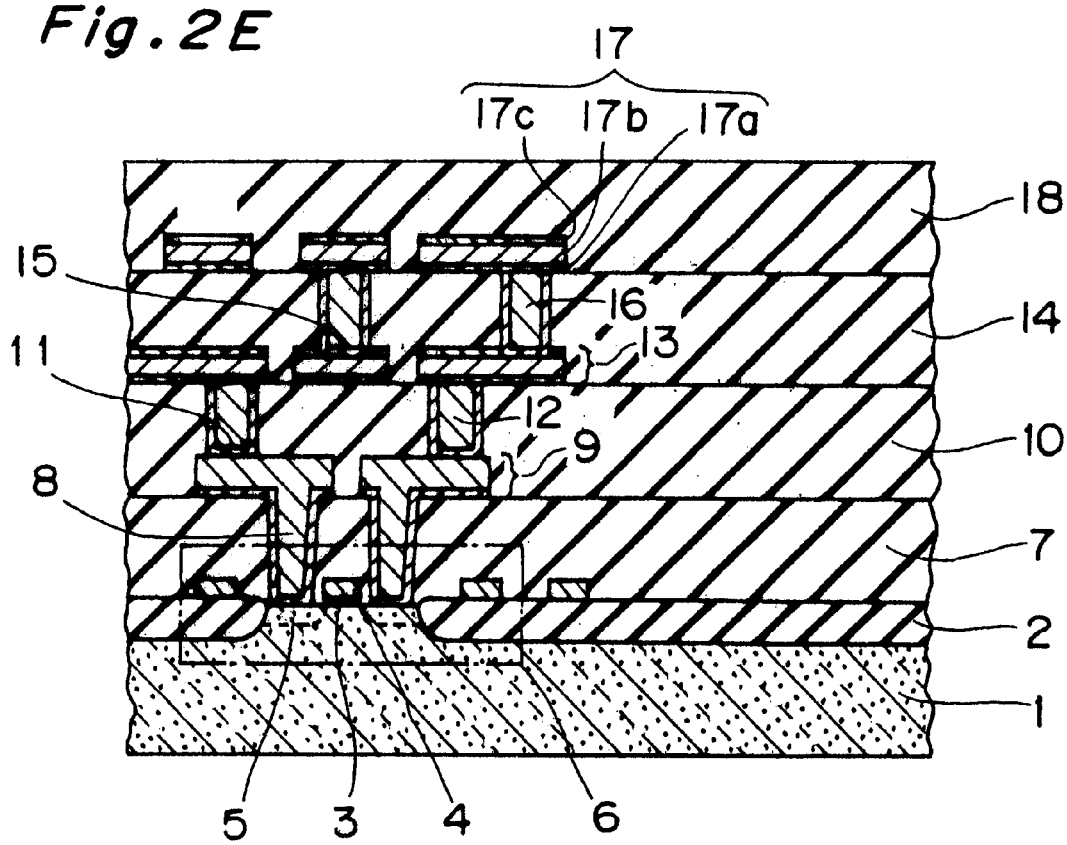

As shown in FIG. 2E, second via holes 15 are formed at predetermined positions on the second interlayer insulating layer 14 so as to form second via plugs 16. Further, a third metal wiring film 17 comprising an underlying layer 17a for wiring, an aluminum alloy layer 17b and a wiring-coating layer (reflection-preventive layer) 17c is formed, and a third interlayer insulating layer 18 is formed thereon.

Figure 2F:
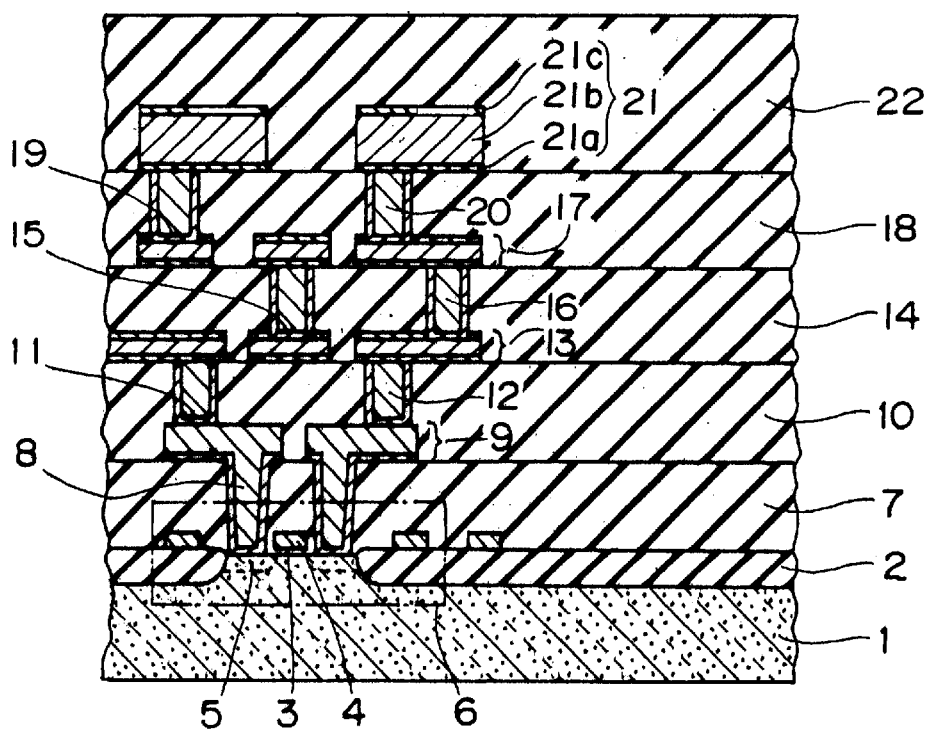

Next, as shown in FIG. 2F, third via holes 19 are formed at predetermined positions on the third interlayer insulating layer 18 so as to form third via plugs 20. Further, a fourth metal wiring film 21 comprising an underlying layer 21a for wiring, an aluminum alloy layer 21b and a wiring-coating layer (anti-reflective layer) 21c is formed, and a fourth interlayer insulating layer 22 is formed thereon.

The fourth and fifth metal wiring films are used for a long distance wiring and a power supply line, and therefore, these films are formed with higher thickness as compared with the underlying first to third metal wiring films, in order to decrease the wiring delay or increase the allowable current in the wiring.

Figure 2G:
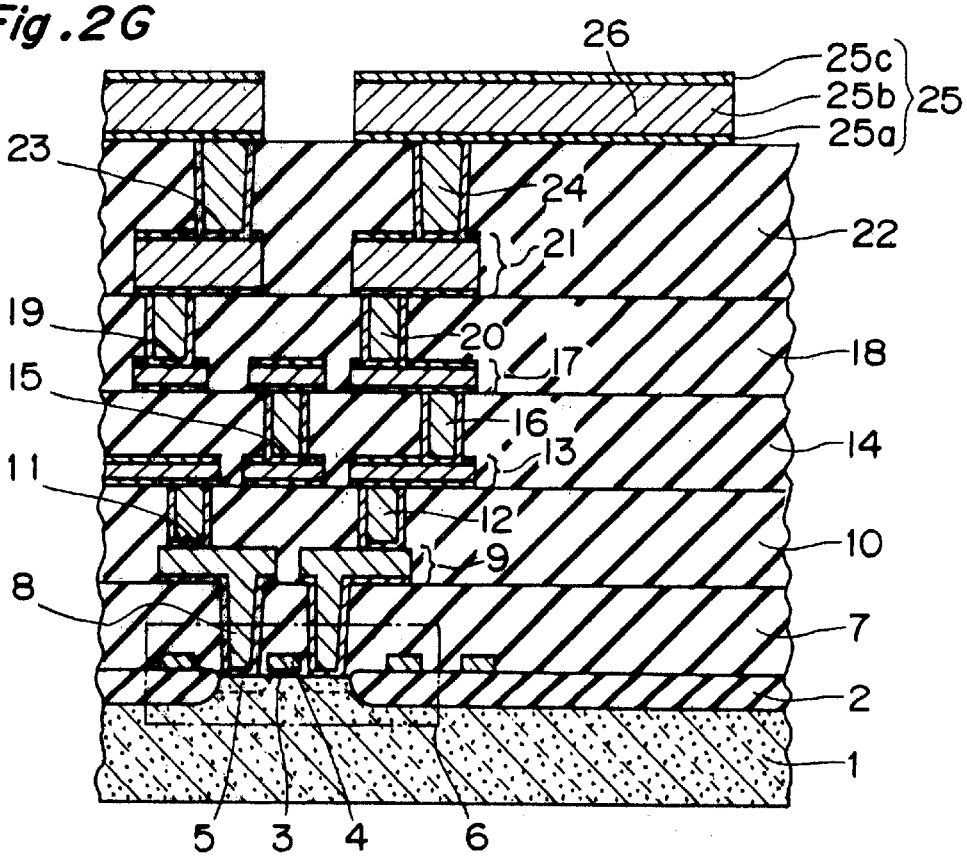

Next, as shown in FIG. 2G, fourth via holes 23 are formed at predetermined positions on the fourth interlayer insulating layer 22 so as to form fourth via plugs 24. Further, a fifth metal wiring film 25 comprising an underlying layer 25a for wiring, an aluminum alloy layer 25b and a wiring-coating layer (anti-reflective layer) 25c is formed thereon.

In general, pad electrodes 26 for use in connection with external terminals are formed concurrently with the formation of an uppermost metal wiring film. The metal wiring film 25 is generally formed with a thickness of 1.0 $\mu$m or more, taking a wire bonding step into account.

Figure 2H:
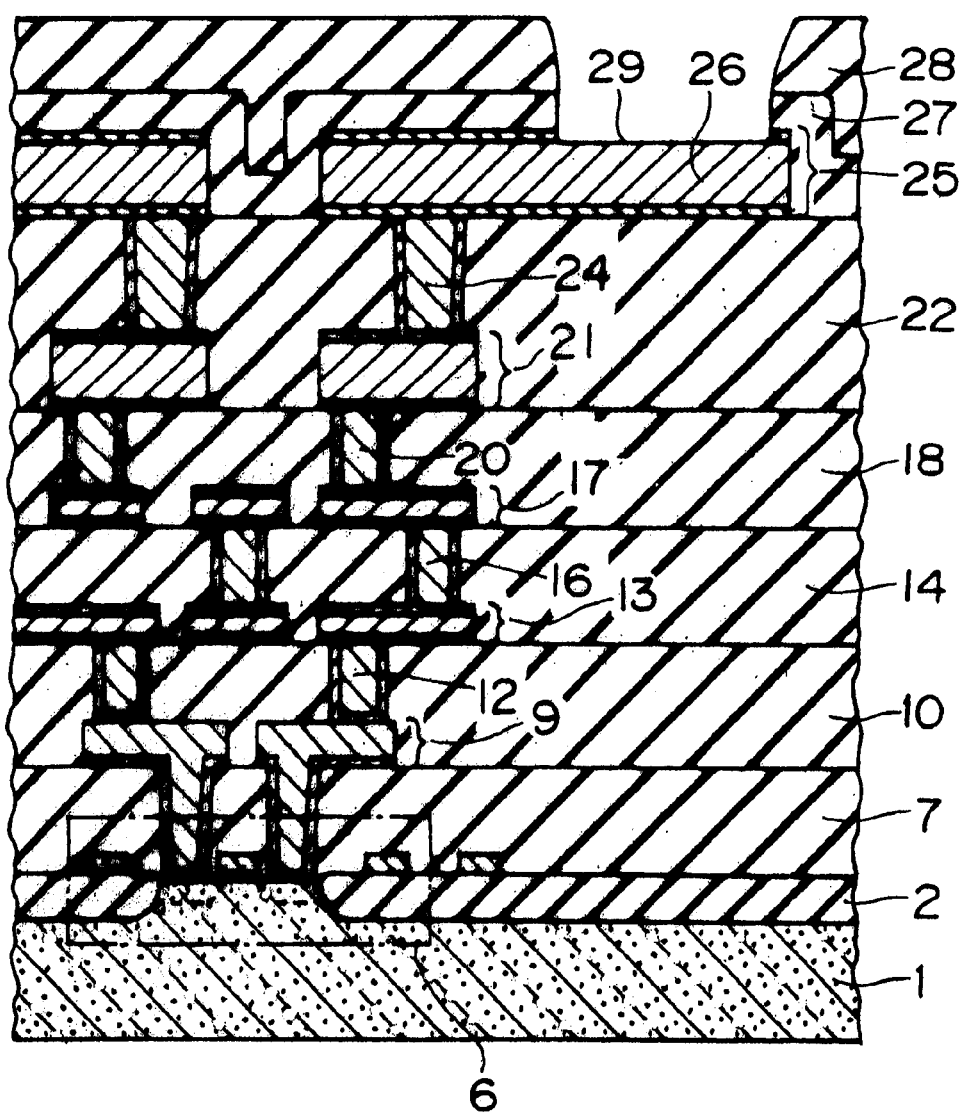

Next, as shown in FIG. 2H, a protective insulating layer 27 composed of a silicon nitride layer, a silicon oxide layer, a silicon oxy-nitride layer or their laminated film is deposited with a thickness of about 1.0 $\mu$m on the fifth metal wiring film 25 by the CVD process. Further, if needed, a buffer coating layer 28 of polyimide or the like is deposited thereon with a thickness of about 5 to about 10 $\mu$m as a second protective insulating layer. Then, an opening 29 for connecting the pad electrode 26 to an external electrode (not shown) is formed.

Figure 2I:
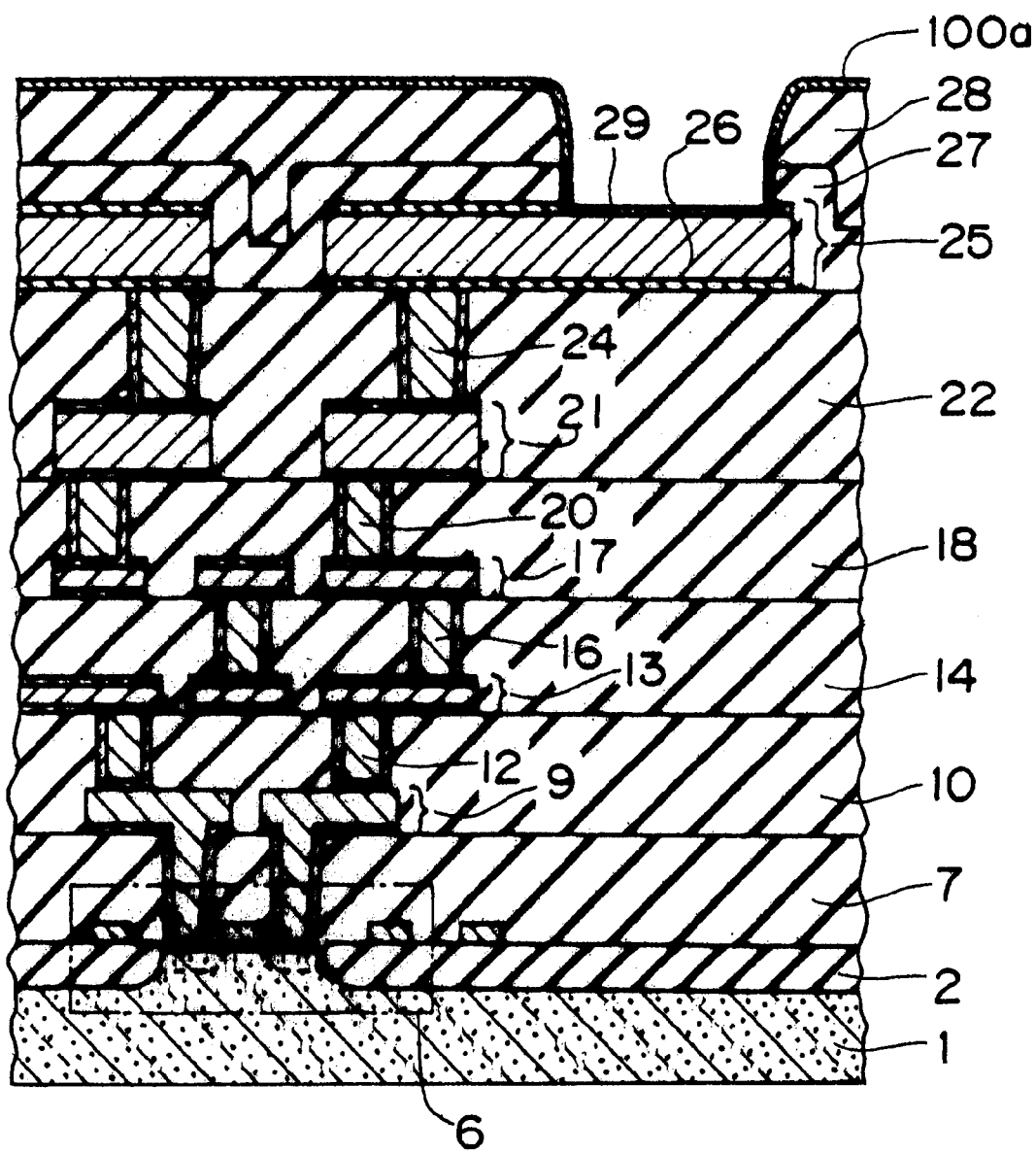

Next, as shown in FIG. 2I, a passive state layer comprising $Al_2O_3$ as a main component which is formed on the exposed surface of the pad electrode 26 within the opening 29 is removed by sputter-etching using argon ions or the like, and then, for example, a platinum layer 100a with a thickness of about 10 to about 100 nm is continuously deposited on the overall surface of the substrate in vacuum by the PVD process.

Figure 2J:
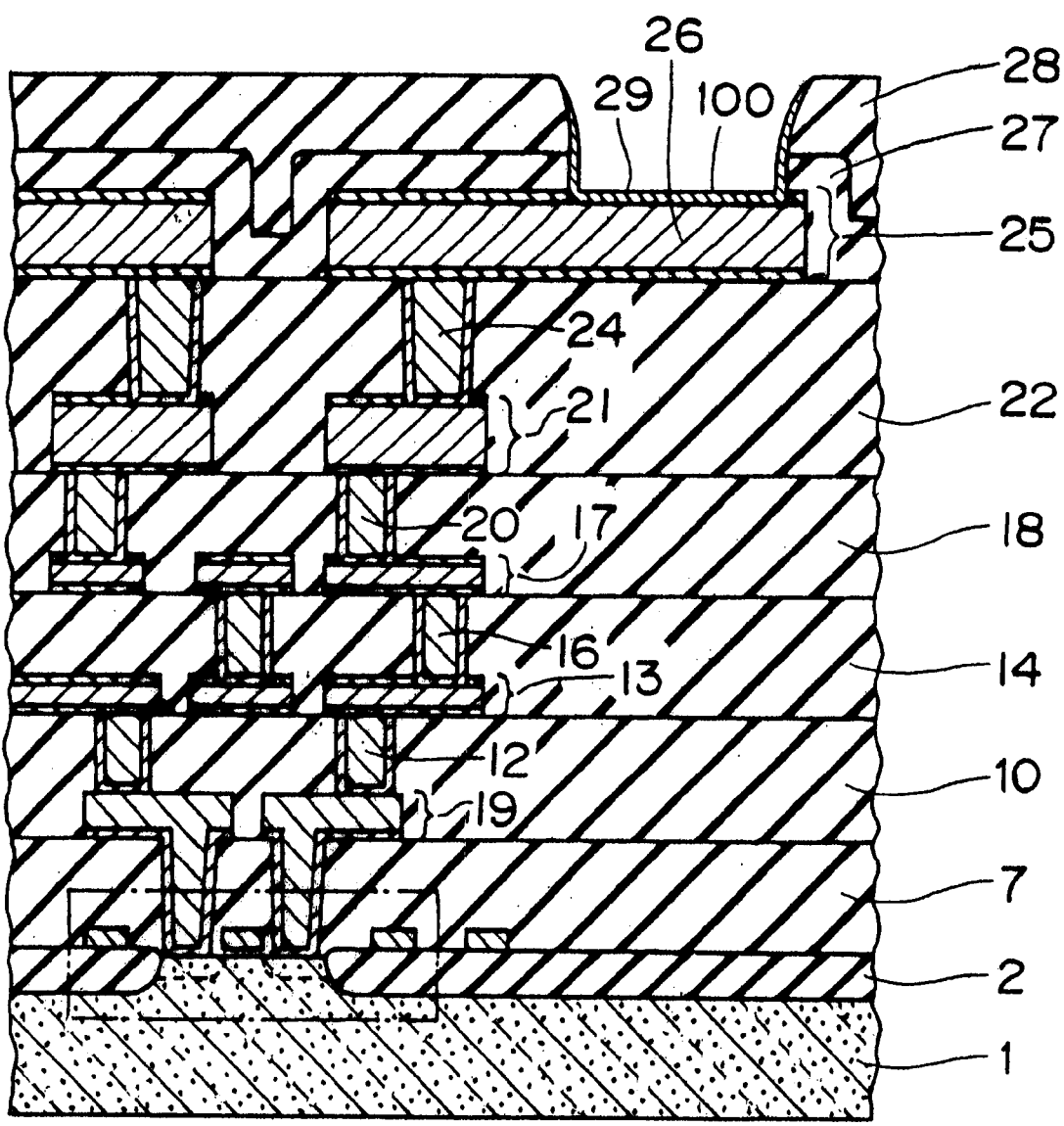

Next, as shown in FIG. 2J, the unnecessary platinum layer 100a is removed by CMP using an aqueous hydrogen peroxide solution-based alumina abrasive, so that a platinum layer as an oxidation-preventive layer 100 is left on the exposed surface and the side wall of the pad electrode 26 within the opening 29.

Figure 2K:
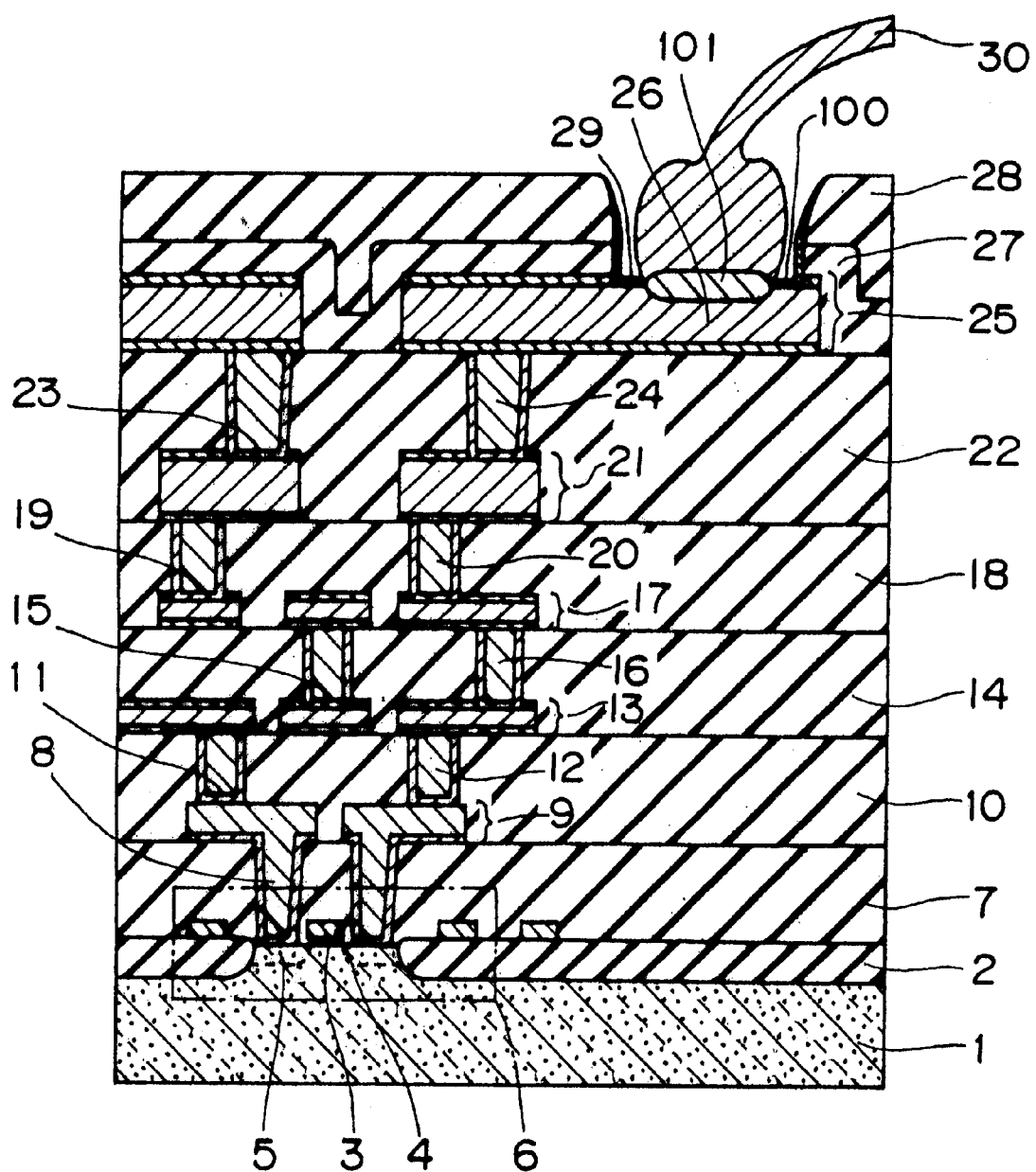

Next the reverse side of the chip divided from the semiconductor substrate 1 is bonded to a lead frame or a mount substrate (not shown) with a resin or solder. Thereafter, as shown in FIG. 2K, a gold or aluminum wire 30 is bonded to the pad electrode 26 coated with the oxidation-preventive layer 100 by means of ultrasonic waves or by thermo compression bonding, so that an intermetallic compound layer 101 comprising the elements of the pad electrode, the bonding wire and the oxidation-preventive layer 100 is formed on the interface between the pad electrode 26 and the bonding wire 30.

Finally, a whole of the chip is sealed with a mold resin 102 to complete the semiconductor device according to this embodiment of the present invention shown in FIG. 1.

In this embodiment, the oxidation-preventive layer 100 is formed from platinum, however, it may be formed from other metal such as gold, aluminum, copper or the like, which can protect the surface of the pad electrode 26 from oxidation and which is a material for bonding wire and easy to mutually diffuse and easily forms an intermetallic compound. Examples of such a metal include other precious metals such as gold, silver, palladium, rhodium, and alloys containing these precious metals as main components.

As mentioned above, in the semiconductor device according to this embodiment of the present invention, the surface of the pad electrode 26 is coated with the oxidation-preventive layer 100 of platinum, and therefore, an oxidized layer (passive-state layer) of $Al_2O_3$ or the like is hardly formed on the surface of the pad electrode.

The oxidation-preventive layer 100 is continuously formed on not only the exposed surface of the pad electrode 26 within the opening 29 but also the side wall of the opening 29, and therefore, an oxidation seed is prevented from entering the edge of the opening 29 and reaching the pad electrode 26 under the oxidation-preventive layer 100 and thus from oxidizing the end portions of the surface of the pad electrode 26.

As a result, in the course of the wire bonding step, an intermetallic compound, obtainable by homogeneously compounding the elements of the pad electrode 26 such as aluminum, the bonding wire 30 such as gold, and the oxidation-preventive layer 100 such as platinum, can be formed with high reproducibility.

Therefore, sufficient bonding strength can be obtained between the pad electrode 26 and the bonding wire 30 to improve the stability and reliability of the joint portions, even though the size of the pad electrodes 26 and the diameter of the bonding wire 30 are decreased in association with the tendency of high degree of integration in semiconductor devices.

Further, after the wire bonding, the exposed surface of the pad electrode 26 and the side wall of the opening are coated with the oxidation-preventive layer 100 so that the aluminum layer susceptible to corrosion is not exposed and that the edge of the opening is sufficiently protected. Therefore, the exposed surface of the pad electrode 26 is not corroded even when water or the like enters through the mold resin 102, and thus, the semiconductor device can have high moisture proof.

Second Embodiment

In a semiconductor device according to this embodiment, pad electrodes are formed from copper, and the internal wall of the opening on each pad electrode is coated with an oxidation-preventive layer formed from an alloy containing a precious metal as a main component.

Figure 3:
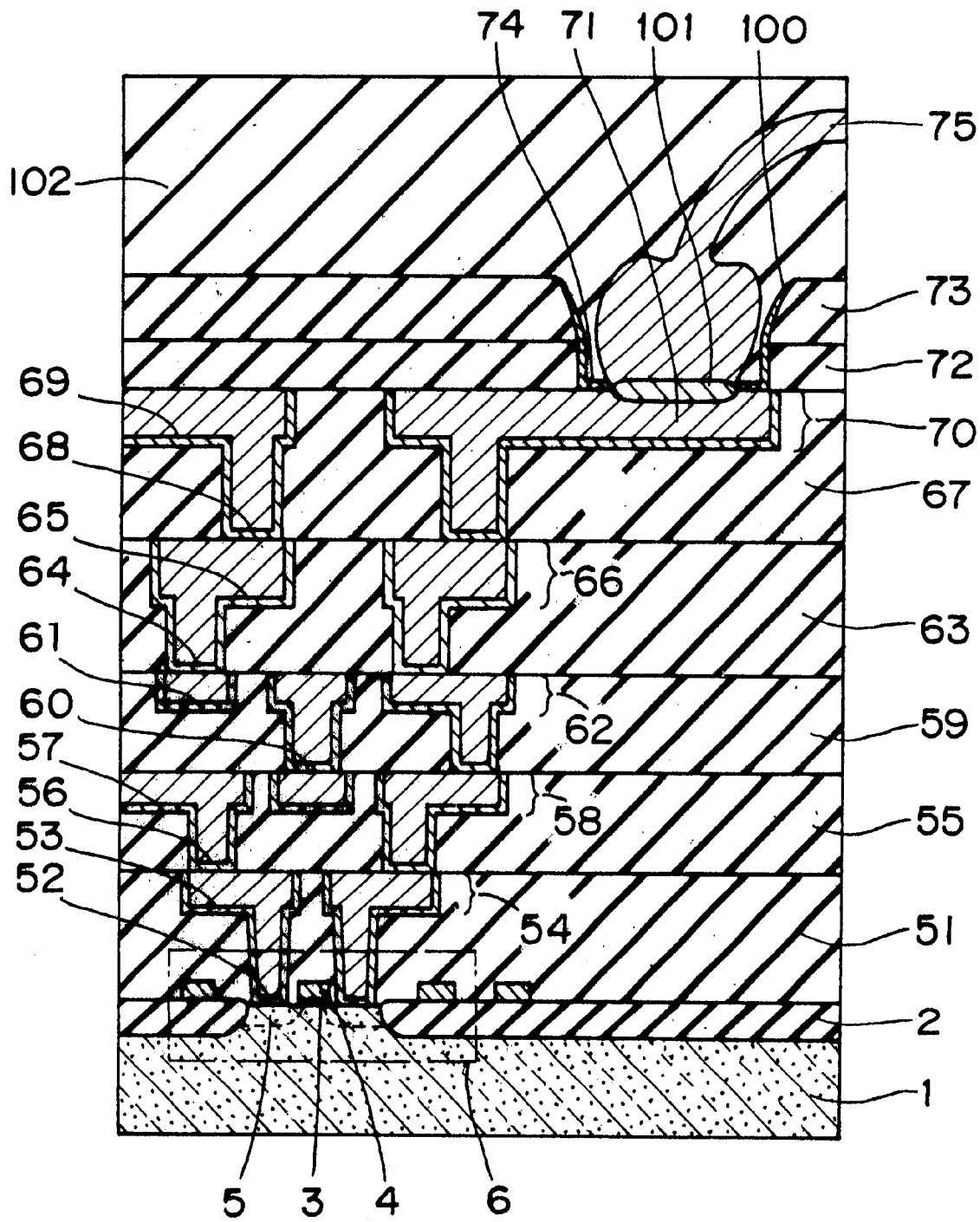
FIG. 3 is a sectional view of a semiconductor device according to the second embodiment of the present invention.

FIG. 3 is a sectional view of a semiconductor device according to the second embodiment of the present invention. In the figures, the same reference numerals as those in FIG. 19 denote the same or corresponding components, and numeral 100 refers to an oxidation-preventive layer containing a precious metal as a main component.

In the process of fabricating the semiconductor device according to this embodiment, first, buried wiring is formed in compliance with the conventional process shown in FIGS. 20A to 20K. An opening 74 is formed in a protective insulating layer 71 and a buffer coating layer 73 so as to expose a part of the surface of the pad electrode 71 formed from copper.

Then, an oxidation-preventive layer 100 is formed with a thickness of about 10 to about 100 nm from a precious metal or an alloy containing a precious metal as a main component, on the exposed surface of the pad electrode 71 within the opening 74 and the side walls of the protective insulating layer 72 and the buffer coating layer 73, by the PVD process in the same manner as in the first embodiment. In this embodiment, the oxidation-preventive layer 100 is formed from platinum.

In the semiconductor device according to this embodiment, the pad electrode 71 is protected from oxidation even when copper more susceptible to oxidation than aluminum is used as a material for wiring and pad electrodes, because the surface of the pad electrode 71 is coated with the oxidation-preventive layer 100 formed from platinum.

Since the oxidation-preventive layer 100 is continuously formed on not only the exposed surface of the pad electrode within the opening 74 but also the side wall of the opening 74, an oxidation seed is prevented from entering the edge of the opening 74 and reaching the pad electrode 71 under the oxidation-preventive layer 100 and thus from oxidizing the end portions of the surface of the pad electrode 71.

As a result, sufficient bonding strength can be ensured between the pad electrode 71 and the bonding wire 75 to thereby improve the stability and reliability of the joint portion, even though the size of the pad electrode 71 and the diameter of the bonding wire 75 tend to decrease in association with the tendency of high degree of integration in semiconductor devices.

Third Embodiment

In the first embodiment, the oxidation-preventive layer 100 is formed by depositing a platinum layer on the overall surface and removing the unnecessary portions of the platinum layer on the buffer coating layer 28 by CMP.

By contrast, in this embodiment, the oxidation-preventive layer 100 is formed by other method such as electroless plating or the like.

Figure 4:
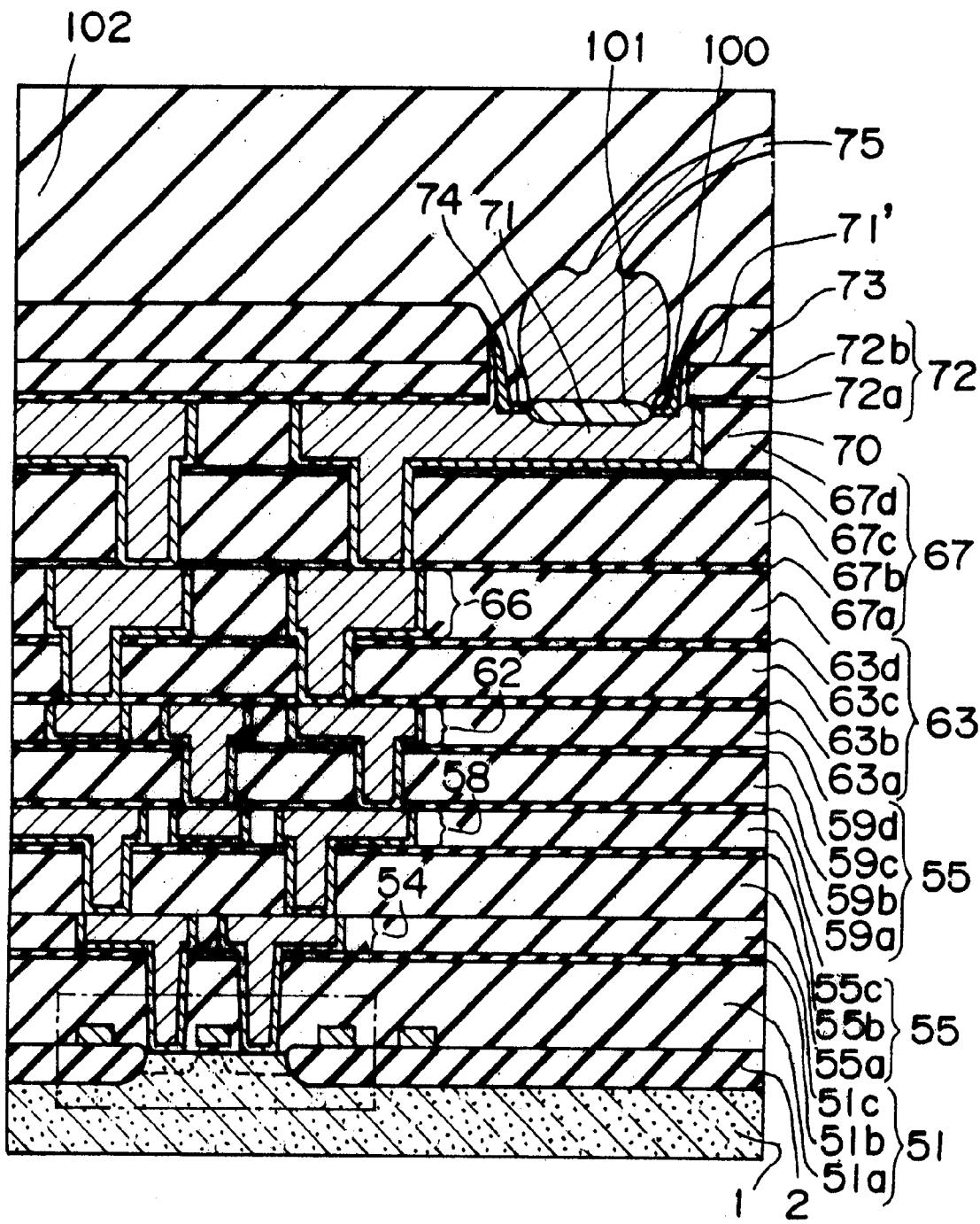
FIG. 4 is a sectional view of a semiconductor device according to the third embodiment of the present invention.
Figure 5A:
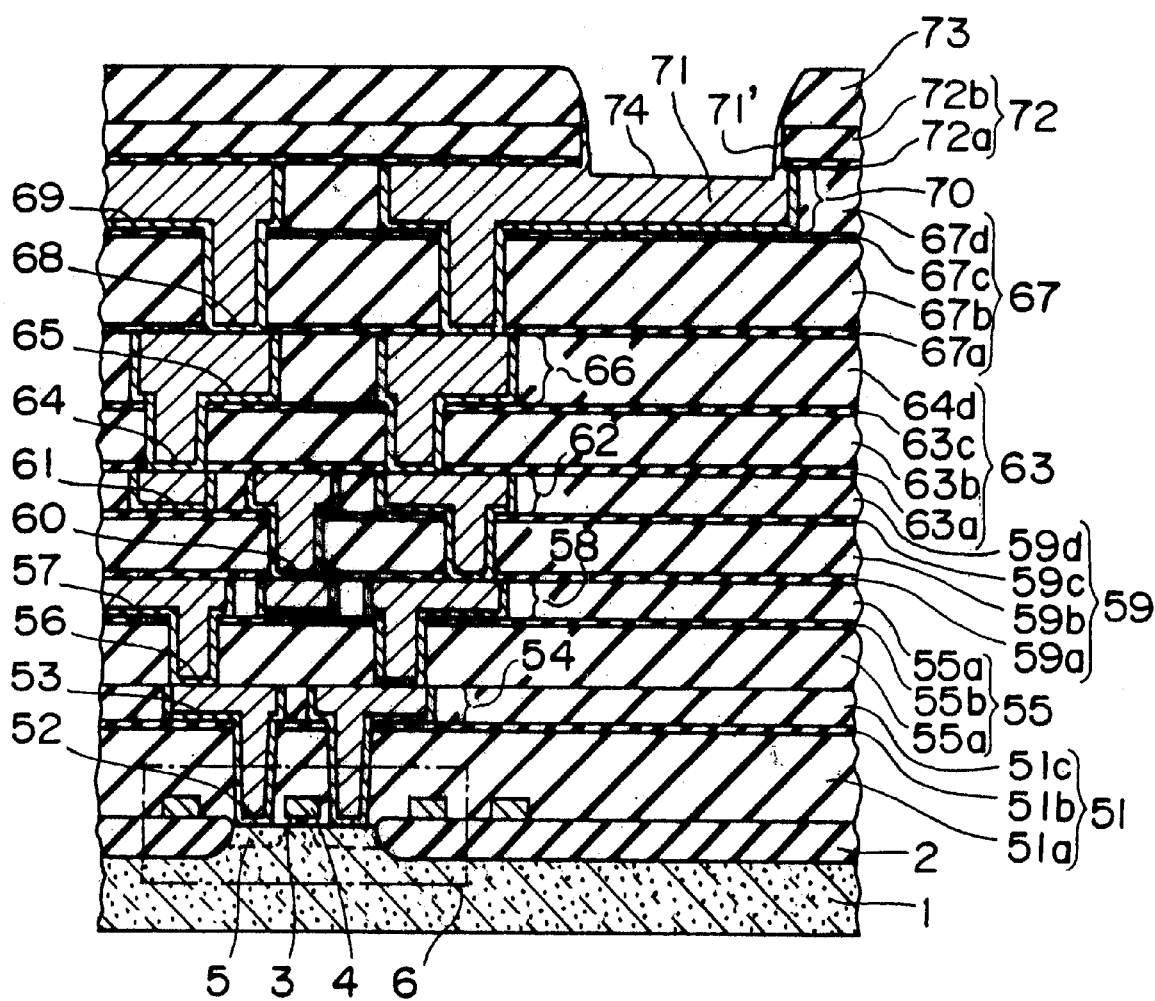
FIGS. 5A–5B show the steps of fabricating the semiconductor device according to the third embodiment of the present invention.
Figure 5B:
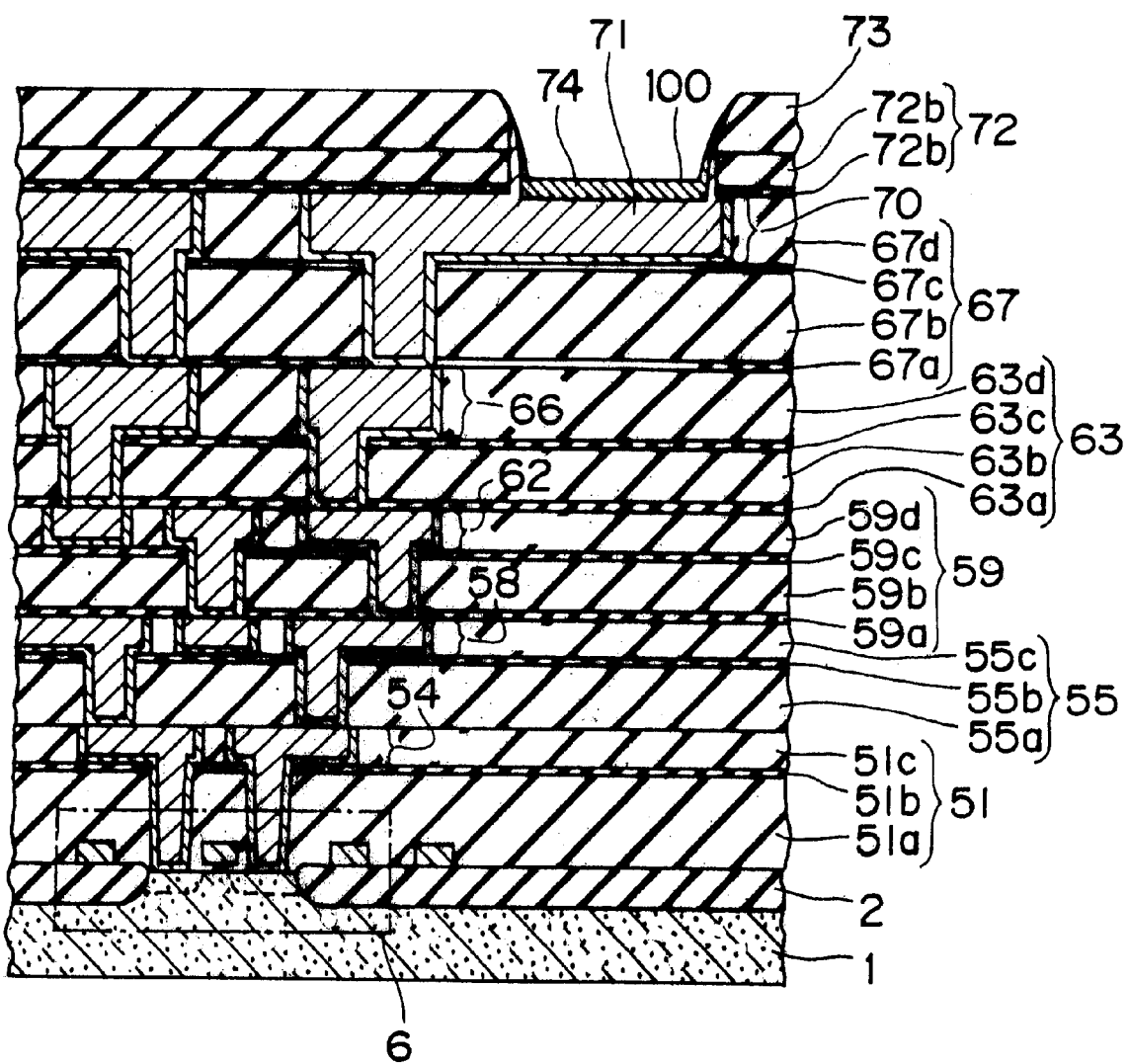

FIG. 4 is a sectional view of a semiconductor device according to the third embodiment, and FIGS. 5A and 5B show the steps of fabricating such a semiconductor device. In the figures, the same reference numerals denote the same or corresponding components as those shown in FIG. 19.

In the process according to this embodiment, buried wiring is formed by the conventional method shown in FIGS. 20A to 20K. Then, an opening 74 is formed in a protective insulating layer 72 and a buffer coating layer 73 so as to expose a part of the surface of the pad electrode 71.

Then, a whole of the surface of the substrate is subjected to sputter-etching so as to remove the passive-state layer such as the oxidized layer or the like on the surface of the pad electrode 71 formed from copper.

The sputter-etching is generally carried out in a short time under a pressure of 1 to 3 mTorr or so, using an Ar gas (for example, the etching depth in the surface of the copper pad electrode is about 5 to about 10 nm). By contrast, in the process of this embodiment, the pressure of the Ar gas is increased to about 10 to about 50 mTorr, and the etching depth is increased to about 30 to about 100 nm. As a result, re-deposition by the sputtering occurs, and a metal layer 71' is re-deposited on the side wall of the opening 74.

Next, a precious metal layer of gold or the like is selectively formed with a thickness of about 10 to about 100 nm as an oxidation-preventive layer 100 on the exposed surface of the pad electrode 71 within the opening 74 and the metal layer 71' formed on the side wall of the opening 74 by electroless plating.

Next, the reverse side of each chip divided from the semiconductor substrate 1 is bonded to a lead frame or a mount substrate (not shown) with a resin or solder. Then, a wire 75 is bonded to the pad electrode 71 coated with the oxidation-preventive layer 100 within the opening 74.

Finally, a whole of the chip is sealed with a mold resin 102 to complete the semiconductor device shown in FIG. 4.

The metal layer is formed by electroless plating in this embodiment, but it may be formed by the selective CVD process.

As mentioned above, in the fabrication process according to this embodiment, the oxidation-preventive layer 100 can be continuously formed on the exposed surface of the pad electrode 71 within the opening 74 and the side wall of the opening 74 by the electroless plating.

As a result, sufficient bonding strength can be ensured between the pad electrode 71 and the bonding wire 75 to thereby improve the stability and reliability of the joint portion, even though the size of the pad electrode 71 and the diameter of the bonding wire 75 tend to decrease in association with the tendency of high degree of integration in semiconductor devices.

In this connection, an oxidation-preventive layer 100 can be selectively formed on a pad electrode formed from other metal such as aluminum or the like by combining the above mentioned re-deposition by sputter-etching and the electroless plating or the selective CVD process.

Fourth Embodiment

Figure 6:
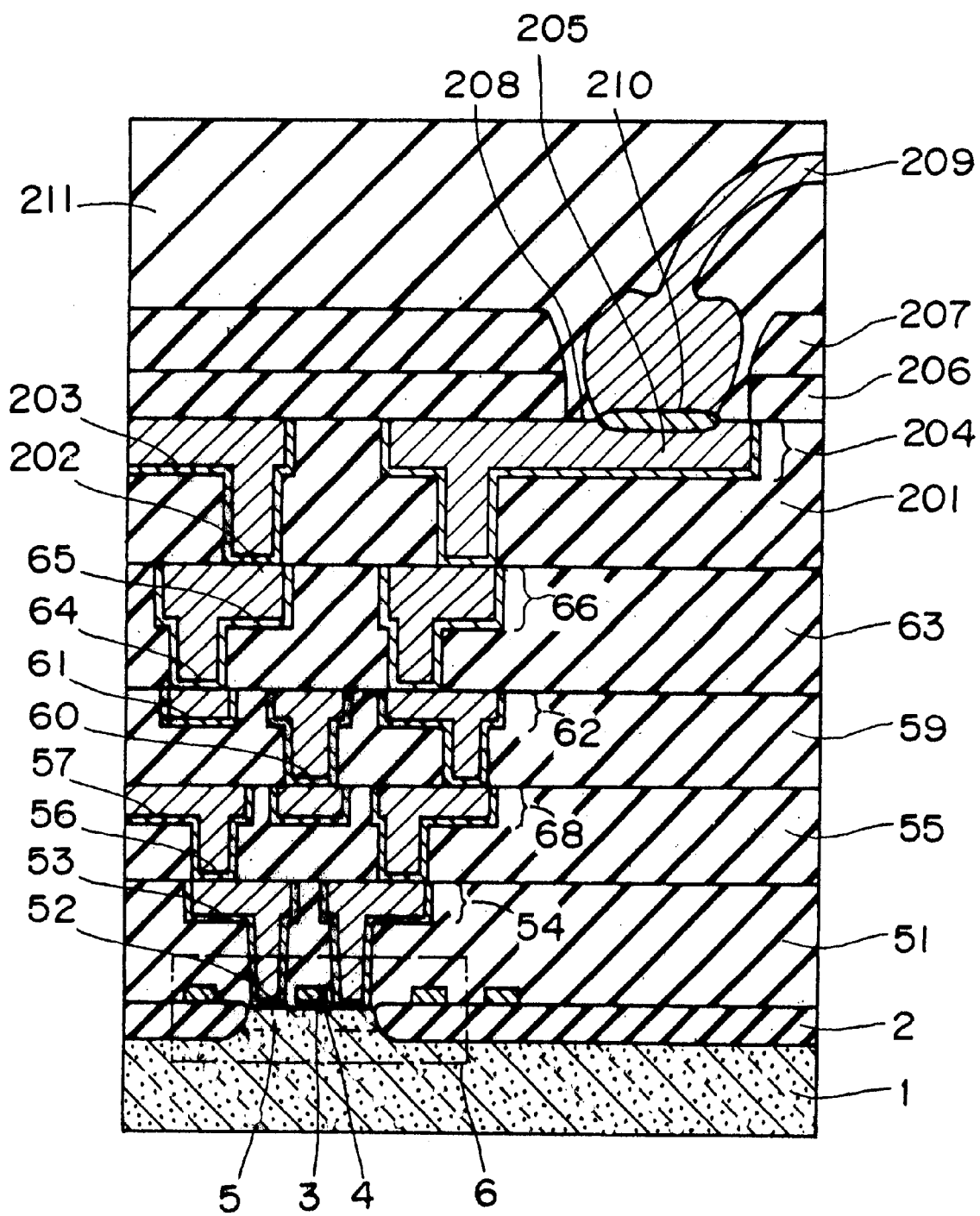
FIG. 6 is a sectional view of a semiconductor device according to the fourth embodiment of the present invention.

FIG. 6 is a sectional view of a semiconductor device according to the fourth embodiment of the present invention, and FIGS. 7A to 7F show the steps of fabricating the semiconductor device. In the figures, the same reference numerals denote the same or corresponding components as those shown in FIG. 19.

Figure 7A:
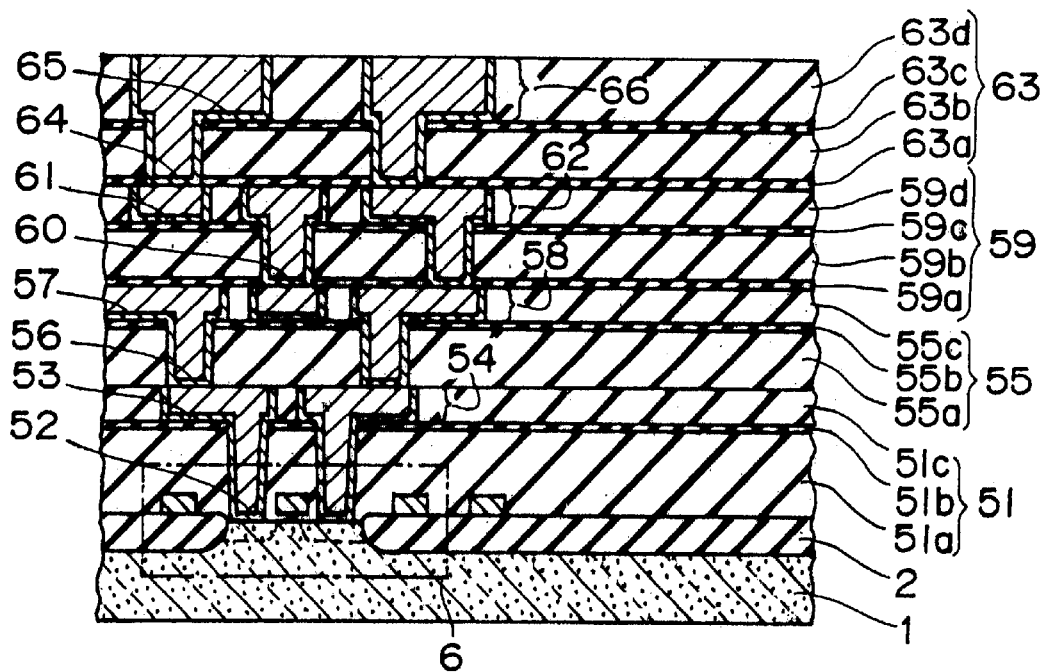
FIGS. 7A–7F show the steps of fabricating the semiconductor device according to the fourth embodiment of the present invention.

In the process according to this embodiment, first, the multilayer wiring structure shown in FIG. 7A is fabricated by the conventional method shown in FIGS. 20A to 20I.

Figure 7B:
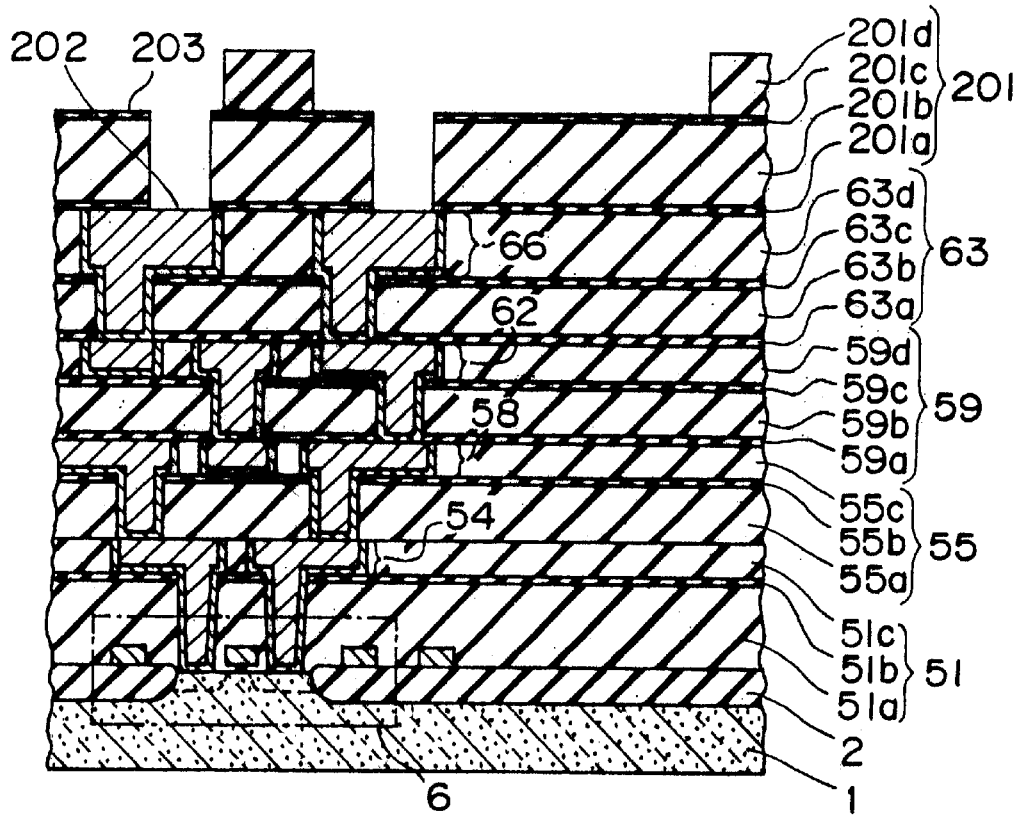

Next, as shown in FIG. 7B, a fourth interlayer insulating layer 201 with a four-layer structure comprising a silicon nitride layer 201a, an insulating layer 201b such as a silicon oxide layer, a silicon nitride layer 201c and an insulating layer 201d such as a silicon oxide layer is deposited on the fourth metal wiring layer 66. Then, fourth via holes 202 and fifth wiring grooves 203 are formed at predetermined positions on the fourth interlayer insulating layer 67 by photolithography and etching.

Figure 7C:
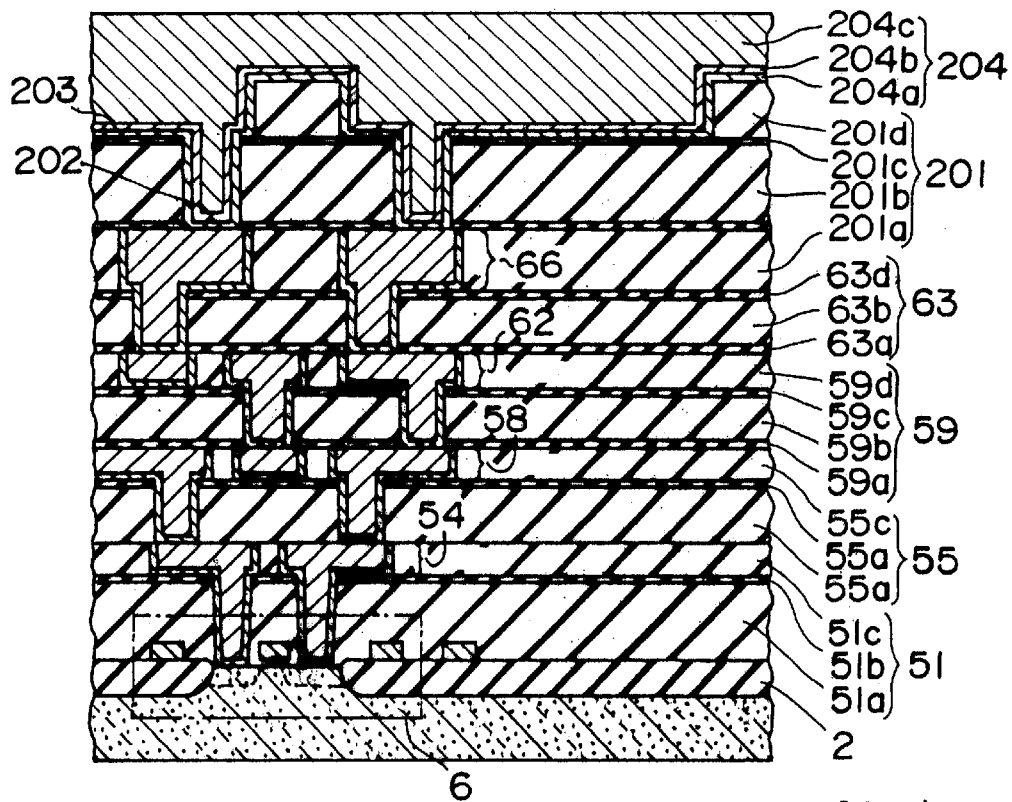

Next, as shown in FIG. 7C, an underlying layer 204a, and gold layers 204b and 204c are deposited on a whole of the surface of the substrate so as to fill the fourth via holes 202 and the fifth wiring grooves 203.

In more detail, first, the underlying layer 204a is deposited by the PVD process or the CVD process. The underlying layer 204a functions to improve the adhesion between the metal wiring layer and the underlying fourth interlayer insulating layer. It also functions to prevent gold from diffusing in the insulating layer such as a silicon oxide layer or the like as in the case of using a copper wire. The underlying layer 204a is composed of a tantalum layer, a tantalum nitride layer, a laminated film of a tantalum layer and a tantalum nitride layer, a titanium nitride layer, a laminated film of a titanium layer and a titanium nitride layer, a titanium/tungsten alloy layer, a chrome layer or the like, and has a thickness of about 50 to about 100 nm.

Then, the gold seed layer 204b is deposited as an underlying layer for electrolytic plating on the overall surface by the PVD or CVD process.

Subsequently, the gold plating layer 204c with a thickness of about 2 $\mu$m is deposited on the overall surface by electrolytic plating using a plating solution containing a cyanic solution as a main component.

Figure 7D:
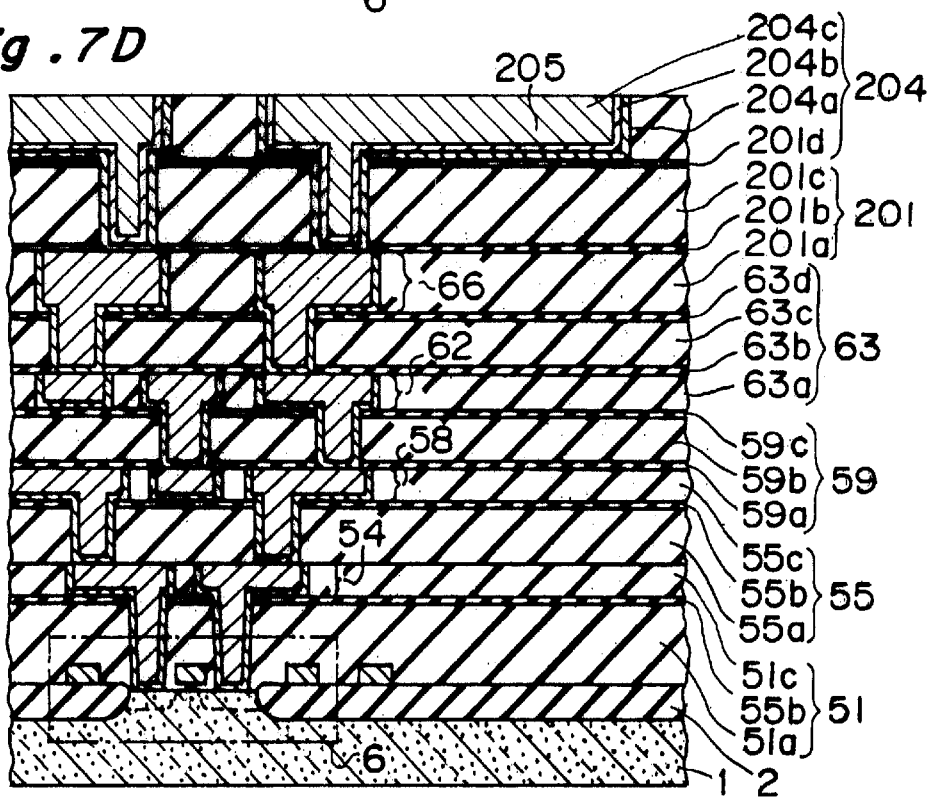

Next, as shown in FIG. 7D, the gold layers 204c and 204b and the underlying layer 204a are removed by CMP using an aqueous hydrogen peroxide solution-based alumina abrasive, with the portions of the gold layers left in the fourth via holes 202 and the fifth wiring grooves 203, so that a fifth buried metal wiring layer 204 is formed.

Concurrently with the formation of this metal wiring layer, pad electrodes 205 for connecting external terminals are formed. The thickness of the metal wiring layer is about 1.0 $\mu$m, which may vary depending on the end use. If it is needed to lower the wiring resistance, the thickness of the metal wiring layer may be further increased.

In this regard, where a precious metal such as gold is used for wiring or pad electrodes, such wiring or pad electrodes are conventionally formed by photolithography and etching, or selective plating or selective CVD process. However, there arise problems in the course of patterning such as formation of a decomposed layer such as an oxidized layer on the surface of the wiring or the pad electrode, formation of an uneven surface and the like.

In this embodiment, since the pad electrodes 205 themselves are formed from gold which is hardly oxidized, almost no oxidized layer (passive-state layer) is formed on the surfaces of the pad electrodes.

Figure 7E:
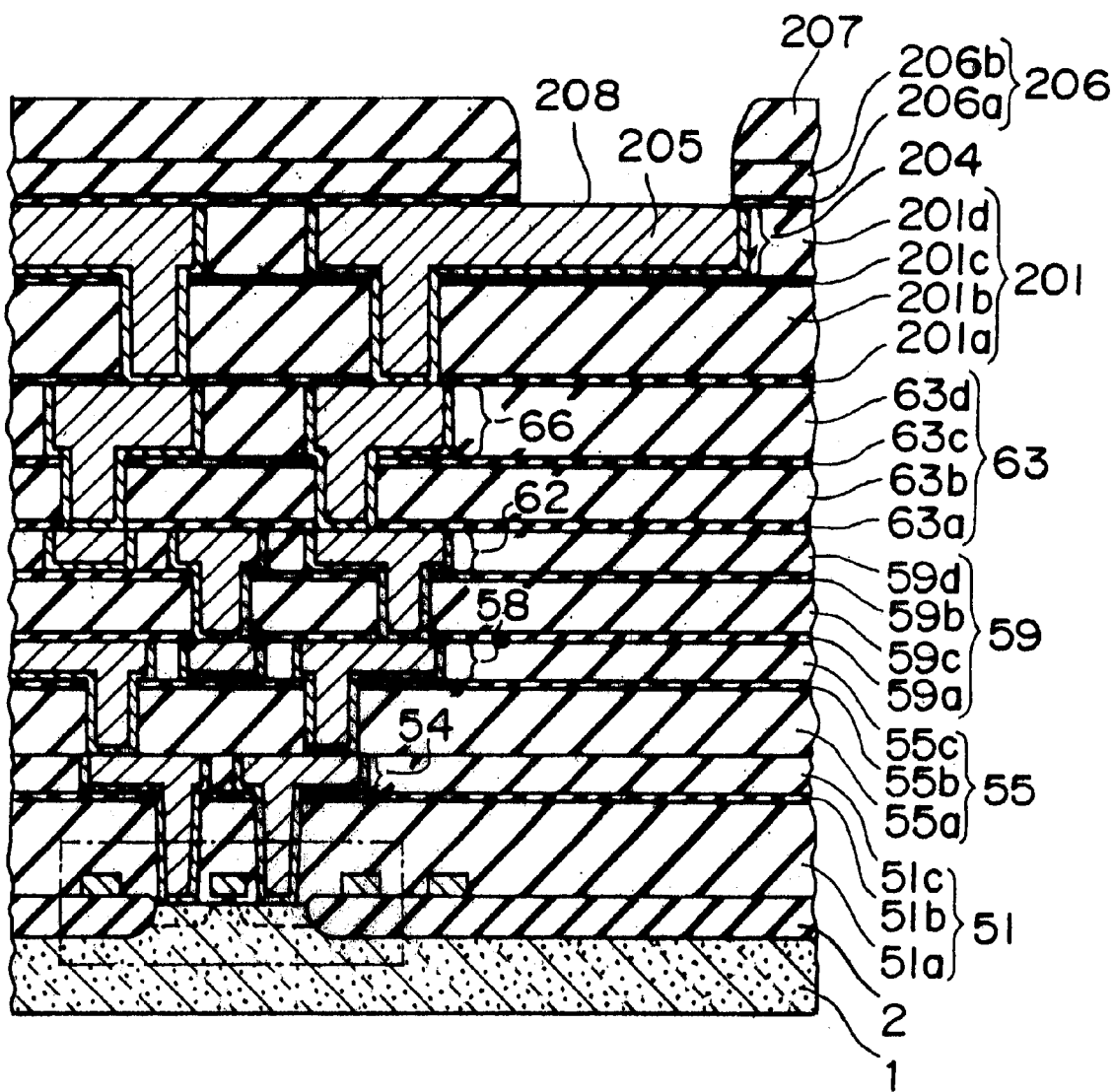

Next, as shown in FIG. 7E, a closely dense silicon nitride layer 206a is deposited on the fifth metal wiring layer 204 in order to improve the adhesion to the upper protective insulating layer or to prevent the diffusion of gold. Then, a protective insulating layer 206b such as a silicon nitride layer, a silicon oxide layer, a silicate nitride oxide layer or their laminated film is deposited with a thickness of about 1.0 $\mu$m.

Further, if necessary, a buffer coating layer 207 of polyimide or the like is formed with a thickness of about 5 to about 10 $\mu$m as a second protective insulating layer. Then, an opening 208 is formed to expose the pad electrode 205 so as to connect an external terminal (not shown).

Figure 7F:
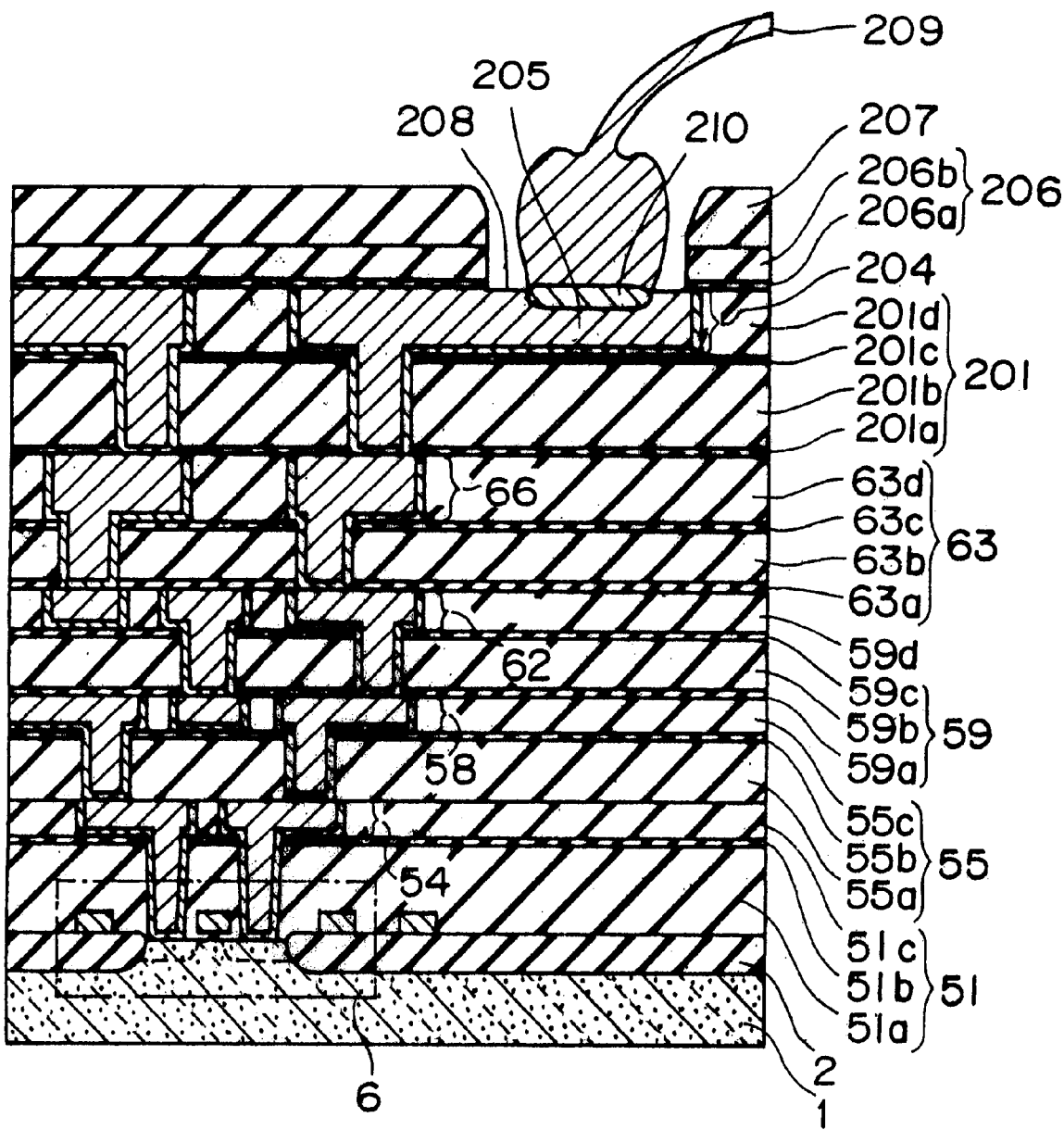

Then, the reverse side of each chip divided from the semiconductor substrate is bonded to a lead frame or a mount substrate (not shown) with a resin or solder, and then, as shown in FIG. 7F, a wire 209 is bonded to the pad electrode 205 exposed within the opening 208. Thus, an inter diffusion layer or an intermetallic compound layer 210 is formed on the contact interface between the pad electrode 205 and the bonding wire 209.

Finally, a whole of the chip is sealed with a mold resin 211 to complete the semiconductor device according to this embodiment shown in FIG. 6.

Although the pad electrode 205 is formed from gold in this embodiment, the pad electrode 205 may be formed from other precious metal such as silver, platinum, palladium, rhodium or the like, or an alloy containing one of these precious metals as a main component.

Since gold and silver have lower resistance than copper, the use of such a metal is effective to reduce the wiring delay.

As mentioned above, in the semiconductor device according to this embodiment, almost no oxidized layer (passive-state layer) is formed on the surface of the pad electrode 205 because the pad electrode 205 itself is formed from gold which is hardly oxidized. In addition, no decomposed layer is formed in the course of the patterning step, and the pad electrode can have high evenness, because the buried wiring structure is formed by CMP.

Thus, the inter diffusion layer 210 of the pad electrode material and the wire material can be homogeneously formed with high reproducibility in the course of wire bonding.

Sufficient bonding strength is obtained between the pad electrode and the bonding wire even though the size of the pad electrode and the diameter of the bonding wire are decreased in association with the tendency of higher integration in semiconductor devices. Thus, the semiconductor device can have high reliability.

Fifth Embodiment

Figure 8:
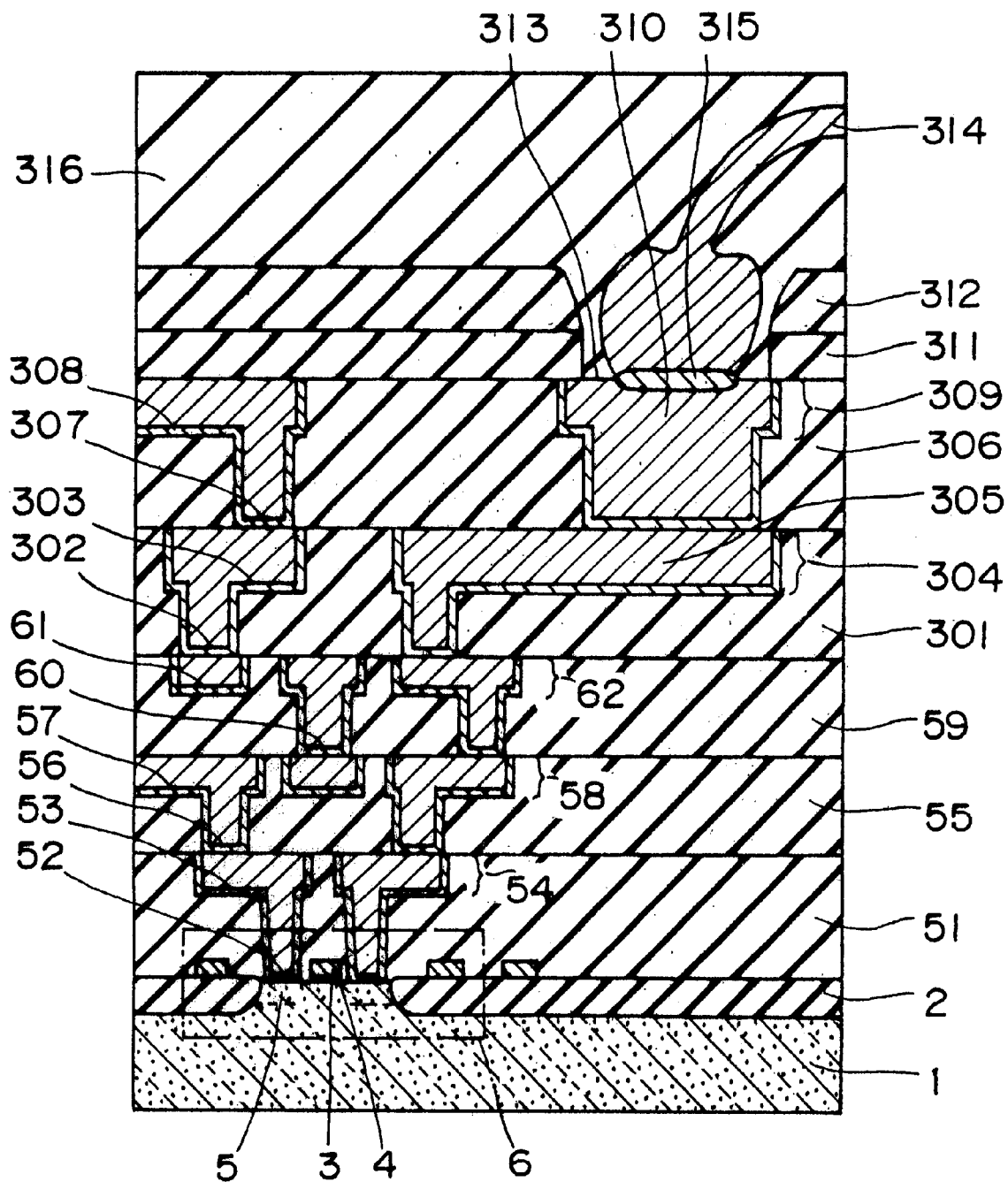
FIG. 8 is a sectional view of a semiconductor device according to the fifth embodiment of the present invention.

FIG. 8 is a sectional view of a semiconductor device according to the fifth embodiment of the present invention, and FIGS. 9A to 9E show the steps of fabricating the semiconductor device. In the figures, the same reference numerals denote the same or corresponding components as those shown in FIG. 19.

Figure 9A:
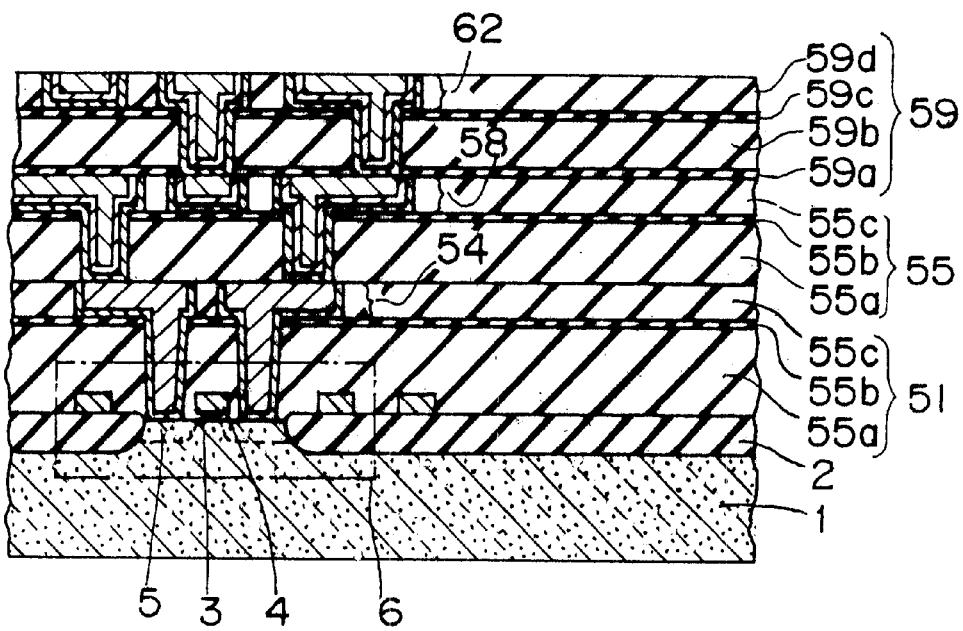
FIGS. 9A–9E show the steps of fabricating the semiconductor device according to the fifth embodiment of the present invention.

In the process according to this embodiment, first, the multilayer wiring structure shown in FIG. 9A is fabricated by the conventional process shown in FIGS. 20A to 20H.

Figure 9B:
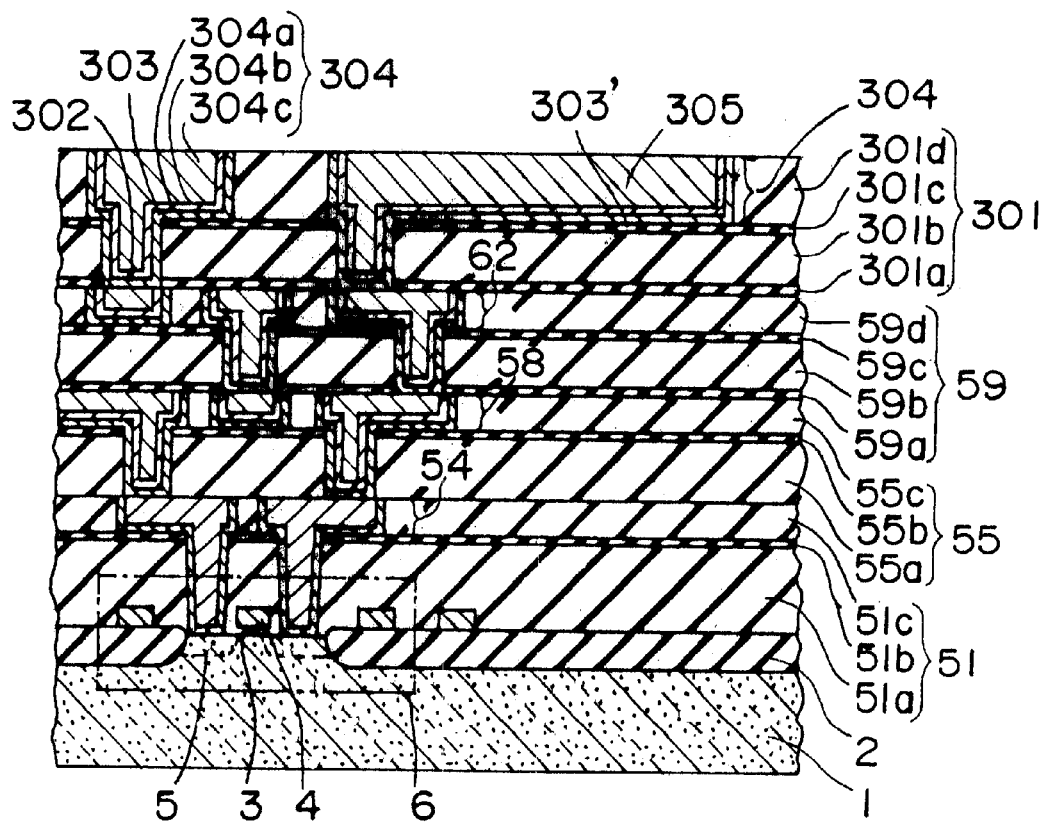

Next, as shown in FIG. 9B, a third interlayer insulating film 301 with a four-layer structure comprising a silicon nitride layer 301a, an insulating layer 301b such as a silicon oxide layer, a silicon nitride layer 301c and an insulating layer 301d such as a silicon oxide layer is deposited on the third metal wiring layer 62. Then, a third via hole 302 and a fourth wiring groove 303 are formed at predetermined positions on the third interlayer insulating film 301 by photolithography and etching. Concurrently, a wiring groove 303' for forming a first pad electrode is also formed.

Next, an underlying layer 304a and copper layers 304b and 304c are deposited on the overall surface of the substrate so as to fill the third via hole 302, the fourth wiring groove 303 and the wiring groove 303' for the first pad electrode. The thickness of the underlying layer 304a is about 50 to about 100 nm as in the conventional formation of copper wiring, and the underlying layer 304a is composed of a tantalum layer, a tantalum nitride layer, a laminated film of a tantalum layer and a tantalum nitride layer, a titanium nitride layer, or a laminated film of a titanium layer and a titanium nitride layer.

Then, the copper seed layer 304b as an underlying layer for electrolytic plating is deposited on the whole surface, and the copper plating layer 304c is deposited with a thickness of about 2 μm by electrolytic plating. Then, the copper layers 304c and 304b and the underlying layer 304a except for the third via hole 302, the fourth wiring groove 303 and the wiring groove 303' for first pad electrode are removed by CMP using an aqueous hydrogen peroxide solution-based alumina abrasive, so that a fourth buried metal wiring layer 304 and a first pad electrode 305 are formed. The thickness of the copper wiring layer is about 1.0 μm, which may vary depending on the end use.

Figure 9C:
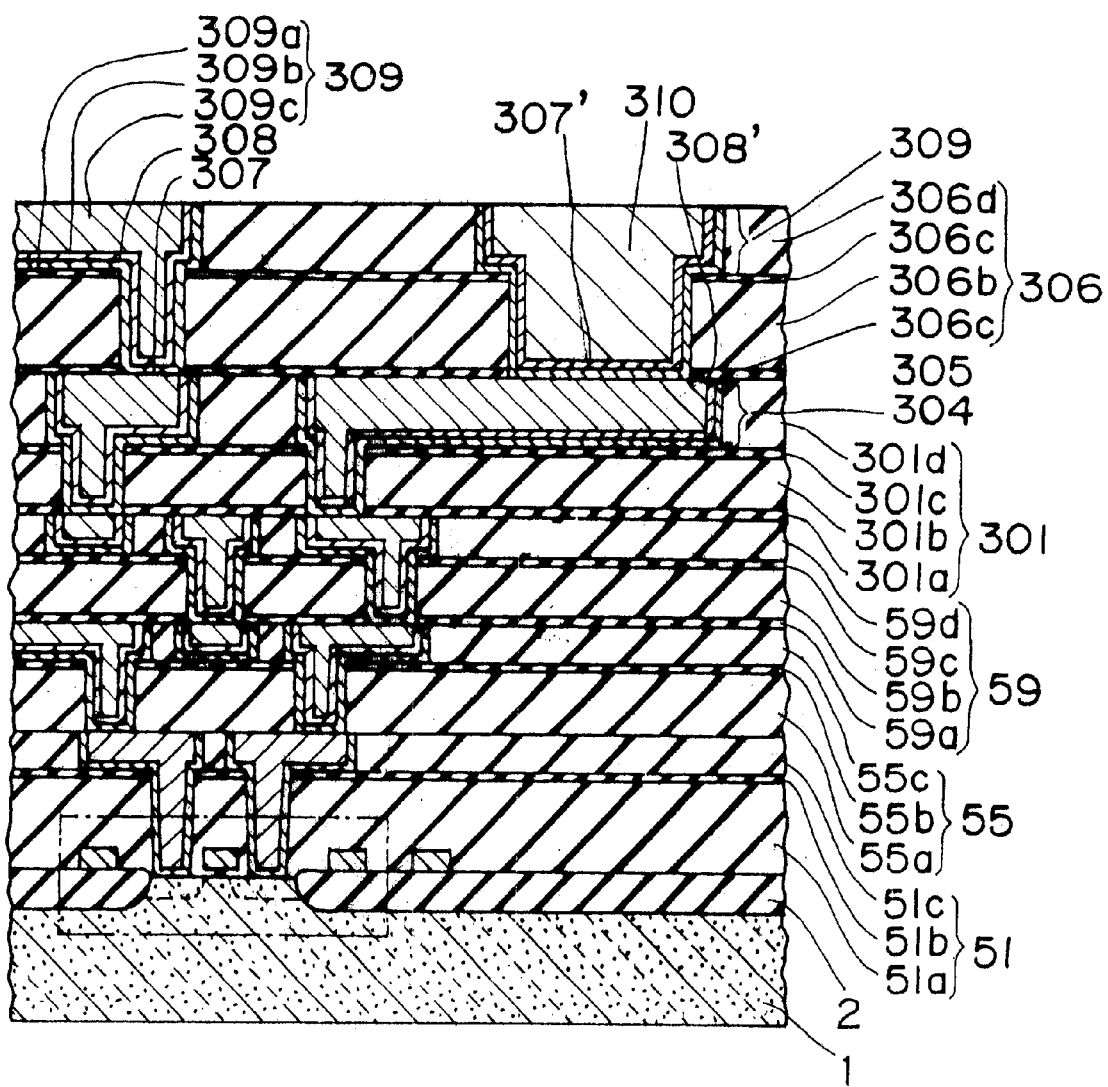

Next, as shown in FIG. 9C, a fourth interlayer insulating film 306 with a four-layer structure comprising a silicon nitride layer 306a, an insulating layer 306b such as a silicon oxide layer, a silicon nitride layer 306c and an insulating layer 306d such as a silicon oxide layer is deposited on the fourth metal wiring layer 304.

Next, a fourth via hole 307 and a fifth wiring groove 308 are formed at predetermined positions on the fourth interlayer insulating film 306 by photolithography and etching. In this step, a via hole 307' with a larger area is concurrently formed on the first pad electrode 305, and a wiring groove 308' for second pad electrode is further formed on the first pad electrode.

Next, an underlying layer 309a and gold layers 309b and 309c are deposited on the overall surface so as to fill the fourth via hole 307, the fifth wiring groove 308, and the via hole 307' with the larger area and the wiring groove 308' on the first pad electrode. The underlying layer 309a is deposited with a thickness of about 50 to about 100 nm by the PVD or CVD process. The underlying layer 309a is composed of a tantalum layer, a tantalum nitride layer, a laminated film of a tantalum layer and a tantalum nitride layer, a titanium nitride layer, a laminated film of a titanium layer and a titanium nitride layer, a titanium tungsten layer, a chrome layer or the like. The gold seed layer 309b as an underlying layer for electrolytic plating is deposited, and then, the gold plating layer 309c is deposited with a thickness of about 2 μm by electrolytic plating using a plating solution containing a cyanic solution as a main component.

Next, the gold layers 309c and 309b and the underlying layer 309a except for the fourth via hole 307, the fifth wiring groove 308, the via hole 307' and the wiring groove 308' for second pad electrode on the first pad electrode are removed by CMP using an aqueous hydrogen peroxide solution-based alumina abrasive, so that a fifth buried metal wiring layer 309 and a second pad electrode 310 are formed. The thickness of the metal wiring layer is about 1.0 μm, which may vary depending on the end use. In this connection, if it is needed to decrease the wiring resistance, the thickness of the metal wiring layer may be further increased.

As described above, when the pad electrode with the buried wiring structure is formed from a precious metal such as gold or the like, a decomposed layer such as an oxidized layer is not formed on the surface of the pad electrode, and also, the pad electrode can have high evenness.

Figure 9D:
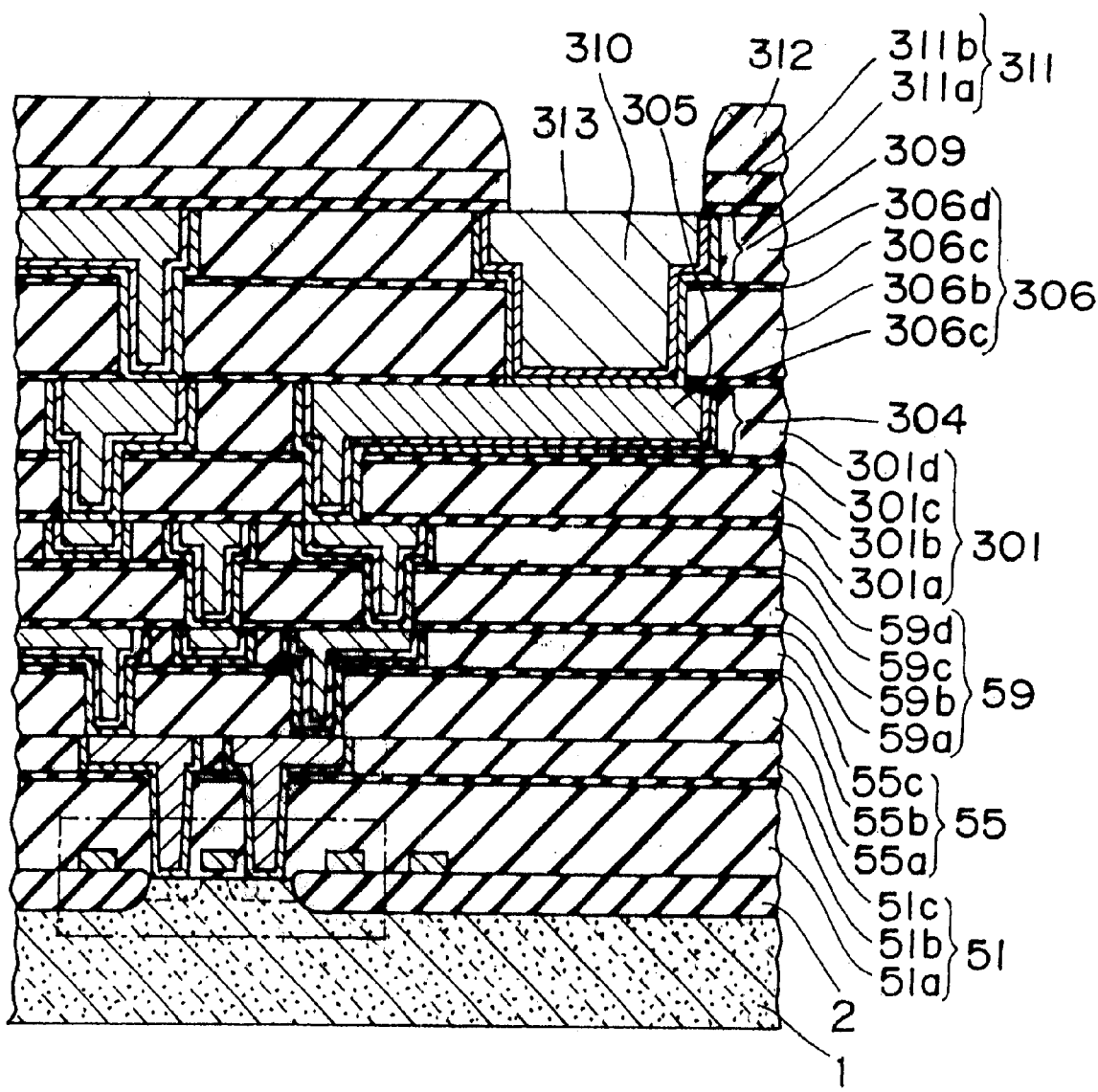

Next, as shown in FIG. 9D, a closely dense silicon nitride layer 311a is deposited on the fifth metal wiring layer 309 in order to improve the adhesion to the upper protective insulating layer or to prevent the diffusion of gold. Then, a protective insulating layer 311b such as a silicon nitride layer, a silicon oxide layer, a silicon oxy-nitride layer or their laminated film is deposited with a thickness of about 1.0 μm . Further, if necessary, a buffer coating layer 312 of polyimide or the like may be formed with a thickness of about 5 to about 10 μm as a second protective insulating layer.

Then, an opening 313 is formed to expose a predetermined portion of the second pad electrode so as to connect an external terminal (not shown).

Figure 9E:
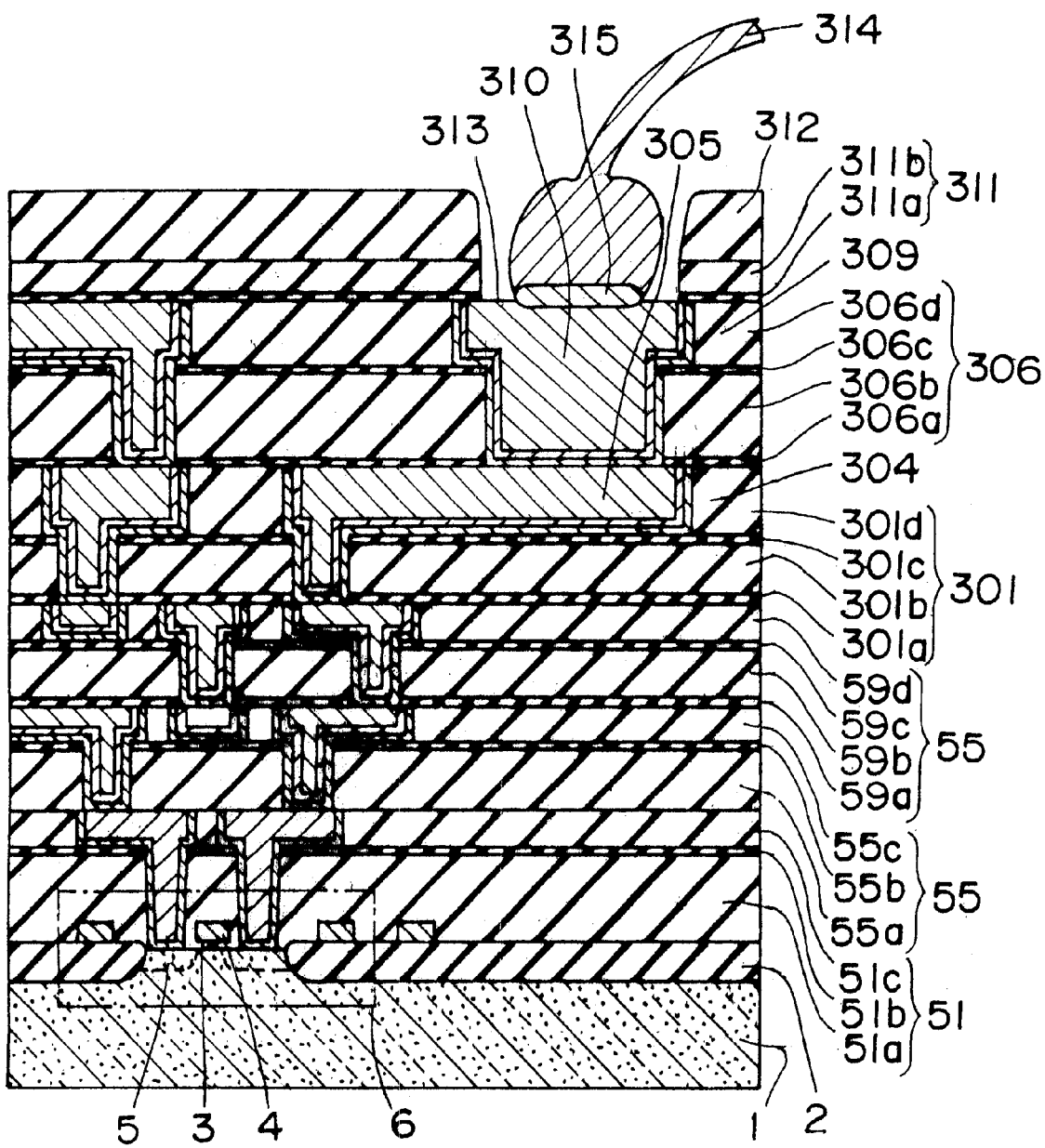

Then, the reverse side of each chip divided from the semiconductor substrate 1 is bonded to a lead frame or a mount substrate (not shown) with a resin or solder, and then, as shown in FIG. 9E, a wire 314 is bonded to the exposed portion of the metal wiring layer of the second pad electrode within the opening 313. Thus, an inter diffusion layer or an intermetallic compound layer 315 is formed on the interface between the second pad electrode 310 and the bonding wire 314.

Finally, a whole of the chip is sealed with a mold resin 316 to complete the semiconductor device shown in FIG. 8.

Although the second pad electrode 310 is formed of the gold wiring in this embodiment, the pad electrode 310 may be formed from other precious metal such as silver, platinum, palladium, rhodium or the like, or an alloy containing one of these precious metals as a main component.

Since gold and silver have lower resistance than copper, the use of such a metal is effective to decrease the wiring delay.

In the multilayer wiring structure according to this embodiment, only the uppermost layer is composed of gold wiring, which is laminated on the pad electrode as the underlying layer formed from copper. However, the underlying pad electrode may be formed of other metal wiring such as aluminum wiring. Further, gold wiring may be used for not only the uppermost layer but also the underlying wiring, and thus, pad electrodes formed of gold wiring may be laminated on each other.

While, in this embodiment, two pad electrodes are laminated, three or more pad electrodes may be laminated on each other as required.

As mentioned above, in the semiconductor device according to this embodiment, by laminating the first pad electrode 305 and the second pad electrode 310 on each other through the via hole 307' having the larger area, it becomes possible to substantially increase the thickness of the pad electrodes. As a result, it becomes possible to prevent the mechanical damage (cracks) of the underlying interlayer insulating film 301 and peeling between the pad electrode and the underlying interlayer insulating layer, even when the power of ultrasonic waves and the compression load are increased in the course of bonding so as to further increase the bonding strength.

Further, by composing at least the second pad electrode as the uppermost layer of the wiring of an alloy containing a precious metal such as gold or the like as a main component, a passive-state layer such as an oxidized layer is hardly formed on the surface of the pad electrode, so that the bonding strength is improved.

Further, since the buried wiring is formed by using CMP, no decomposed layer is formed in the course of patterning as in the conventional method, so that the pad electrode can have high evenness on the surface. Therefore, the inter diffusion layer 210 can be homogeneously formed from the pad electrode material and the gold wire and with high reproducibility.

Sixth Embodiment

Figure 10:
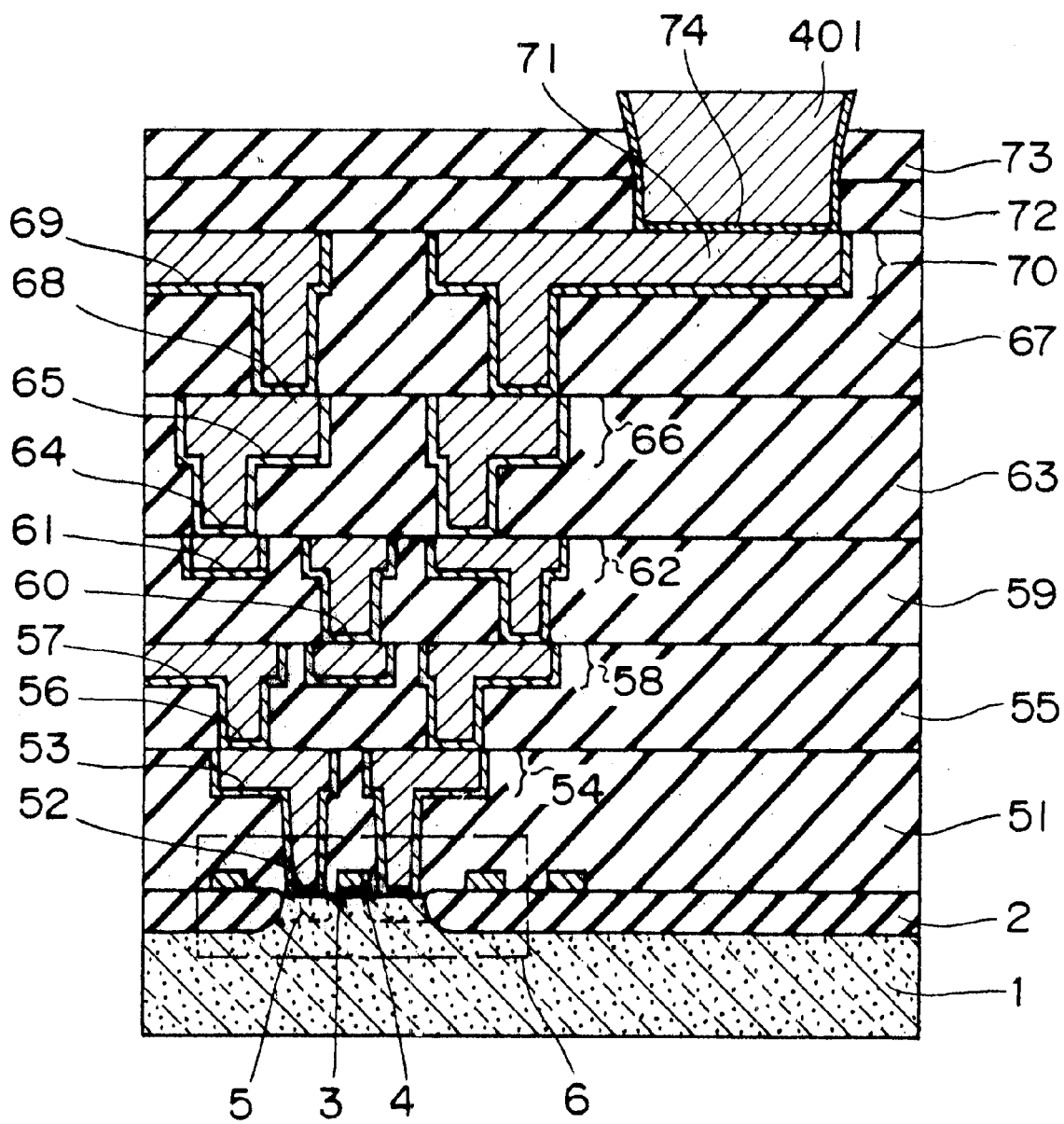
FIG. 10 is a sectional view of a semiconductor device according to the sixth embodiment of the present invention.

FIG. 10 is a sectional view of a semiconductor device according to the sixth embodiment of the present invention. FIGS. 11A to 11D show the steps of fabricating the semiconductor device. In the figures, the same reference numerals denote the same or corresponding components as those shown in FIG. 19.

Figure 11A:
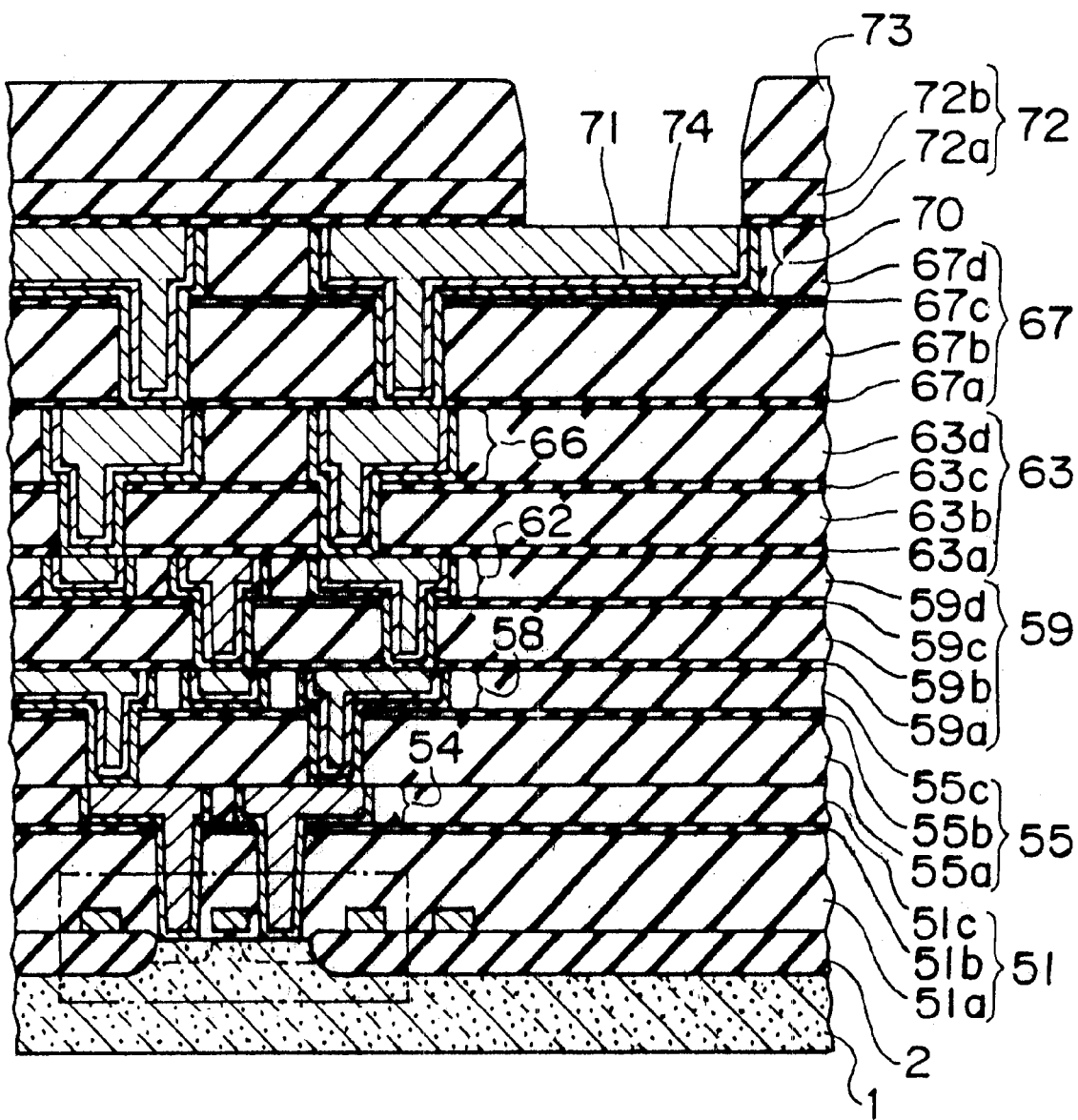
FIGS. 11A–11D show the steps of fabricating the semiconductor device according to the sixth embodiment of the present invention.

In the process of fabricating the semiconductor device according to this embodiment, first, a multilayer wiring structure shown in FIG. 11A is fabricated by the conventional process shown in FIGS. 20A to 20K.

Figure 11B:
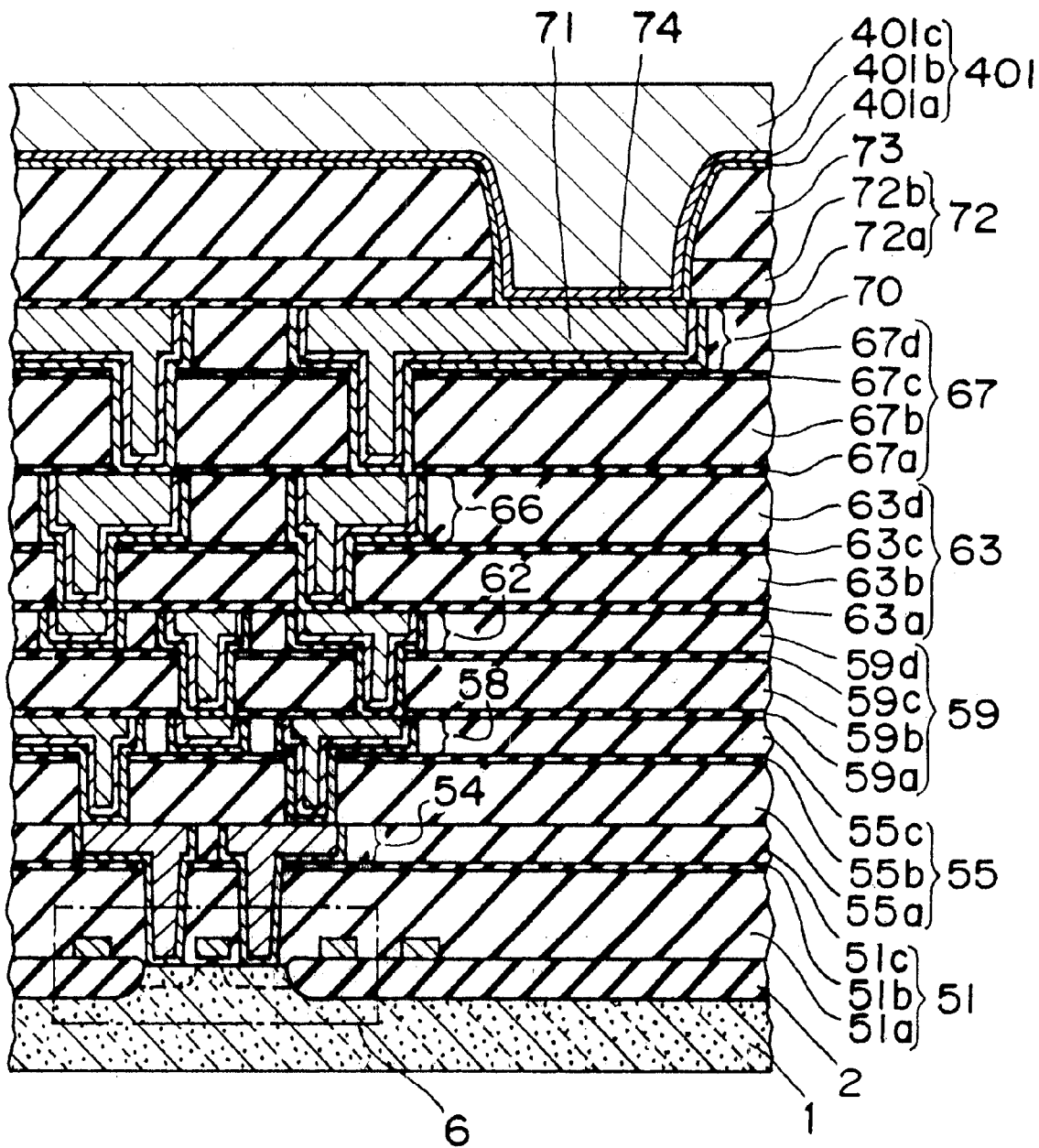

Next, as shown in FIG. 11B, an underlying layer 401a and gold layers 401b and 401c are deposited on the overall surface by the PVD or CVD process so as to fill the opening 74 of the pad electrode. The underlying layer 401a is composed of a tantalum layer, a tantalum nitride layer, a laminated film of a tantalum layer and a tantalum nitride layer, a titanium nitride layer, a laminated film of a titanium layer and a titanium nitride layer, a titanium/tungsten alloy layer or a chrome layer. The thickness of the underlying layer is about 50 to about 100 $\mu$m. The gold seed layer 401b as an underlying layer for electrolytic plating is deposited, and then, the gold layer is deposited with a thickness of about 5 to about 20 $\mu$m by electrolytic plating using a plating solution containing a cyanic solution as a main component.

Figure 11C:
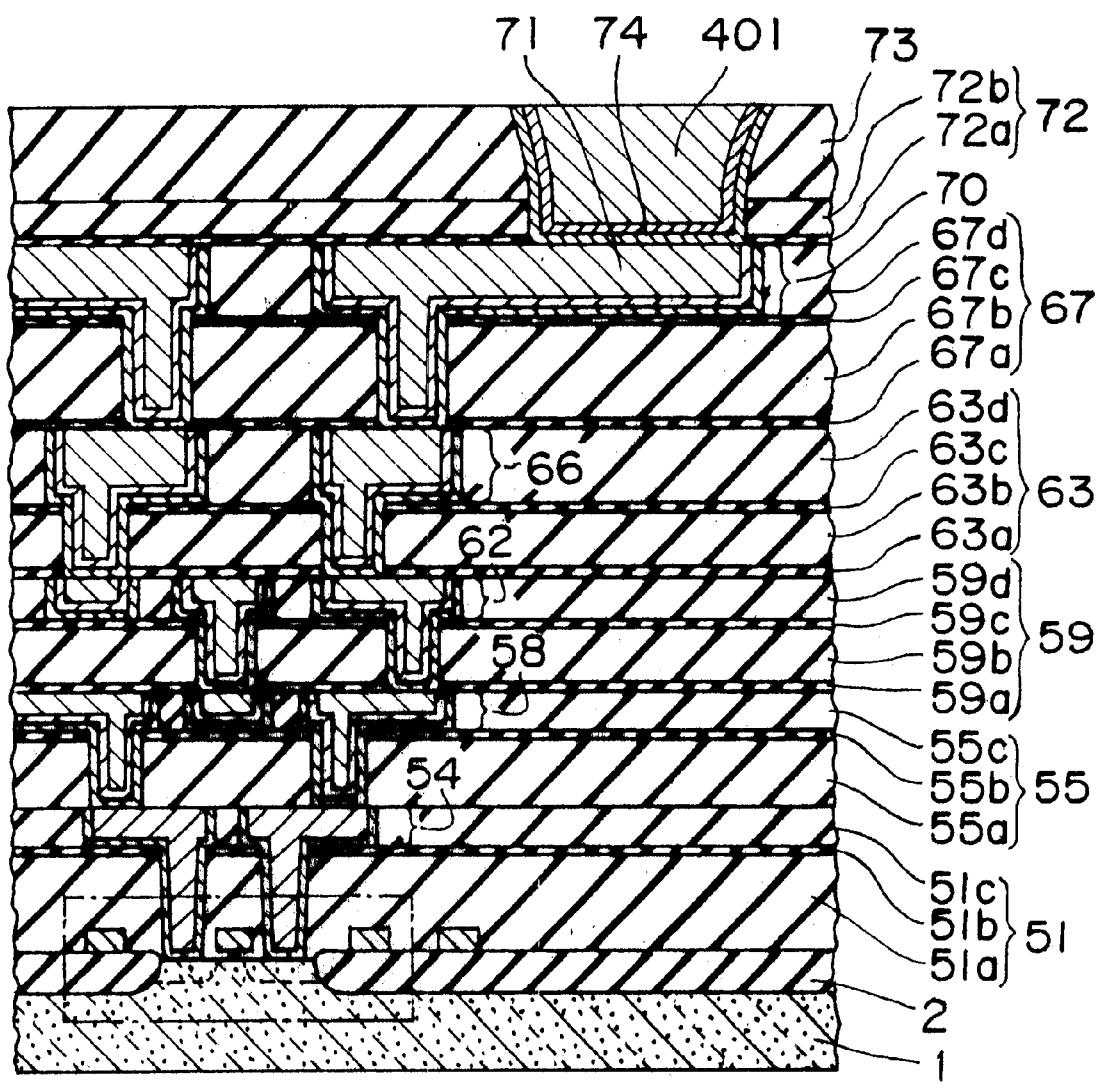

Next, as shown in FIG. 11C, the gold layers 401c and 401b and the underlying layer 401a except for the opening 74 for pad electrode are removed by CMP using an aqueous hydrogen peroxide solution-based alumina abrasive, so that an electrode 401 for connecting an external terminal is formed.

Since an electrode for connecting an external terminal, such as a bump electrode is conventionally formed by a combined process of photolithography, plating, etching and the like, a decomposed layer or an organic contaminant layer would be formed on the surface of the electrode for use in connecting an external terminal, or variation in the height of the bump would occur. For this reason, the evenness of the electrode surface is poor.

By contrast, in the method according to this embodiment, no decomposed layer or organic contaminant layer is formed on the electrode, and the controllability of the electrode height and the evenness of the electrode surface are excellent.

Figure 11D:
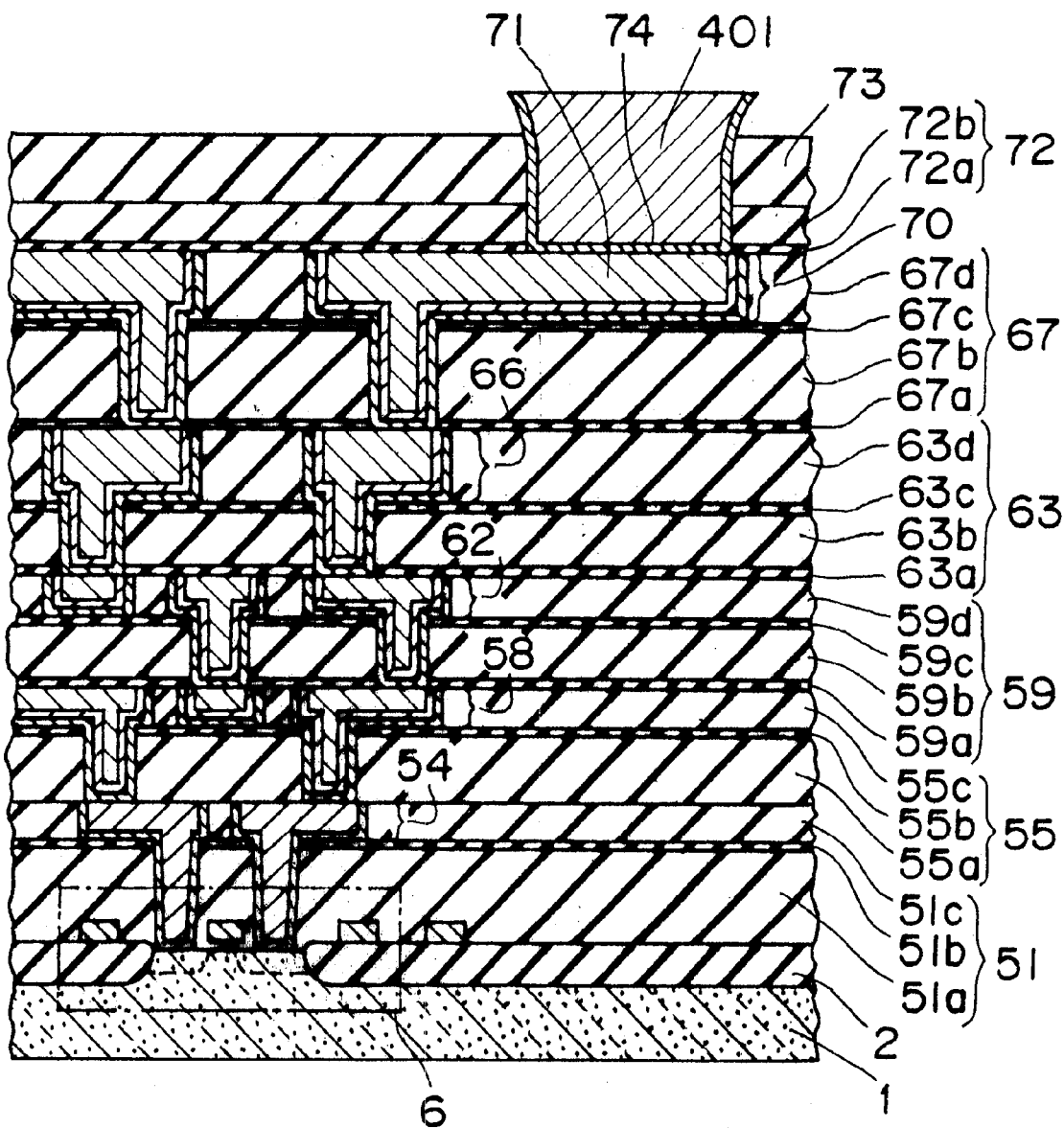

Next, as shown in FIG. 11D, a whole of the surface of the substrate is treated with, for example, oxygen plasma to etch the buffer coating layer 73 so that the electrode 401 for connecting an external terminal becomes about 0.1 to about 1.0 $\mu$m higher than the surface of the buffer coating layer 73.

In case where the buffer coating layer 73 as the uppermost protective insulating layer is not formed, in other words, where the uppermost layer is an inorganic layer such as a silicon oxide layer, a silicon nitride layer or the like, the uppermost layer is treated by etching using an fluorocarbon type etching gas.

By the above method, the electrode 401 can be formed in a self-matching manner relative to the opening 74 of the pad electrode. Particular advantages are that photolithographic process becomes unnecessary in the step of removing the uppermost protective insulating layer, and that no decomposed layer or organic contaminant layer is formed on the surface. Further, the height of the electrode 401 raised over the main surface of the semiconductor substrate can be successfully controlled, and the evenness of the electrode surface is excellent.

Therefore, by employing the above method, a semiconductor device having high stability and high reliability with respect to the connection with an external unit can be provided at lower cost.

The electrode 401 is formed from gold in this embodiment, however, it may be formed from other precious metal such as silver, platinum, palladium, rhodium or an alloy containing one of these precious metals as a main component.

The semiconductor device according to this embodiment is connected to a mount substrate, using an anisotropic conductive resin containing a dispersion of electrically conductive particles, an anisotropic conductive film in which a linear electrically conductive substance is oriented in a vertical direction, or the like.

Figure 12A:
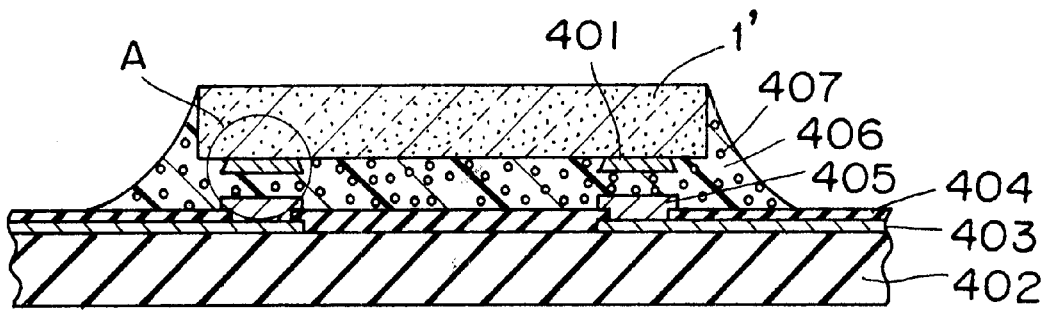
FIGS. 12A and 12B are sectional views of the semiconductor device according to the sixth embodiment of the present invention.
Figure 12B:
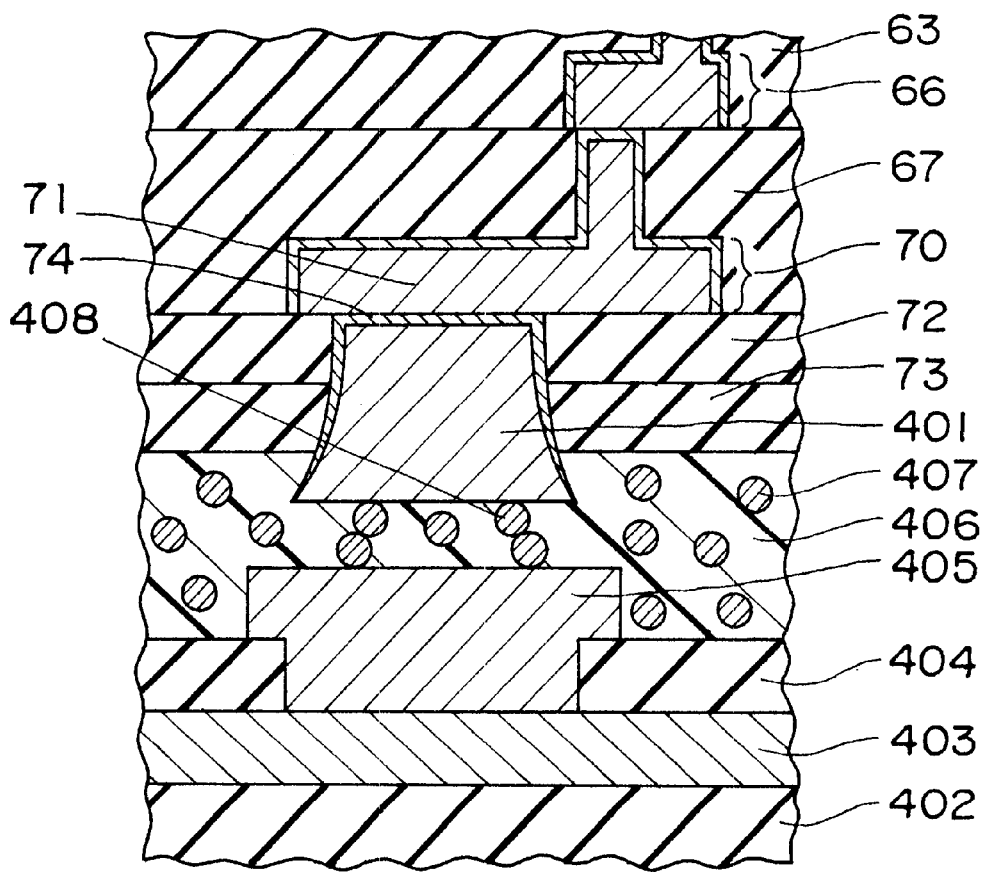

FIGS. 12A and 12B show an example of the mounting of the semiconductor device according to this embodiment.

As shown in FIG. 12A and FIG. 12B which is an enlarged view of FIG. 12A, the semiconductor device as an individual chip 1' divided from the semiconductor substrate is mounted on a mount substrate 402.

Metal wiring 403 of copper or the like, a protective insulating layer 404 of polyimide or the like and a metal electrode 405 of gold or the like for connecting the semiconductor chip 1' are formed on the mount substrate 402, and the semiconductor chip 1' is connected to the mount substrate 402 while facing down thereto.

The connection electrode 405 on the mount substrate 402 is formed from a precious metal such as gold, while the electrode on the semiconductor chip 1' is also formed from a precious metal such as gold, and therefore, no oxidized layer or the like is formed on the surfaces of the electrodes. Therefore, both electrodes can be easily connected to each other by filling the interface between both electrodes with an anisotropic conductive resin 406 containing a dispersion of conductive particles 407 and pressing the resin therebetween.

Conventionally, a metal bump electrode is formed on a pad electrode for such a use. For example, photolithographic process is needed to form a plating layer on only a necessary portion when employing the plating method, and therefore, it is impossible to prevent formation of a decomposed layer or an organic contaminant layer on the electrode surface.

The conventional method has another problem in that controllability in bump height and the evenness of the electrode surface are poor.

Therefore, it is inevitable to increase the clad strength of the device by increasing the pressing load, raising the pressing temperature or increasing the electrode area.

In contrast, according to the method of this embodiment, the electrode 401 for use in connection with an external can be formed in a self-matching manner relative to the opening 74, which makes the photolithographic process unnecessary. Accordingly, the number of production steps can be decreased, and such an electrode can be formed at lower cost.

Further, controllability in the height of the electrode 401 and the evenness of the electrode surface are excellent, and therefore, sufficient bonding strength can be obtained even if the connection is carried out at a low temperature under a low load. This is also effective for reduction in the size of the electrode.

As described above, according to the semiconductor device of this embodiment, it is possible to uniformly apply a pressure to all the electrodes 401 for use in connection with external terminals, and thus, it is possible to provide a semiconductor device having sufficient bonding strength and high stability at lower cost.

Seventh Embodiment

The sixth embodiment refers to the semiconductor device comprising the electrode having a larger area which is formed on the pad electrode and used for connection with an external electrode. In the seventh embodiment, a plurality of openings having smaller areas are formed on a pad electrode so as to form a plurality of divided electrodes for use in connection with external electrodes.

Figure 13:
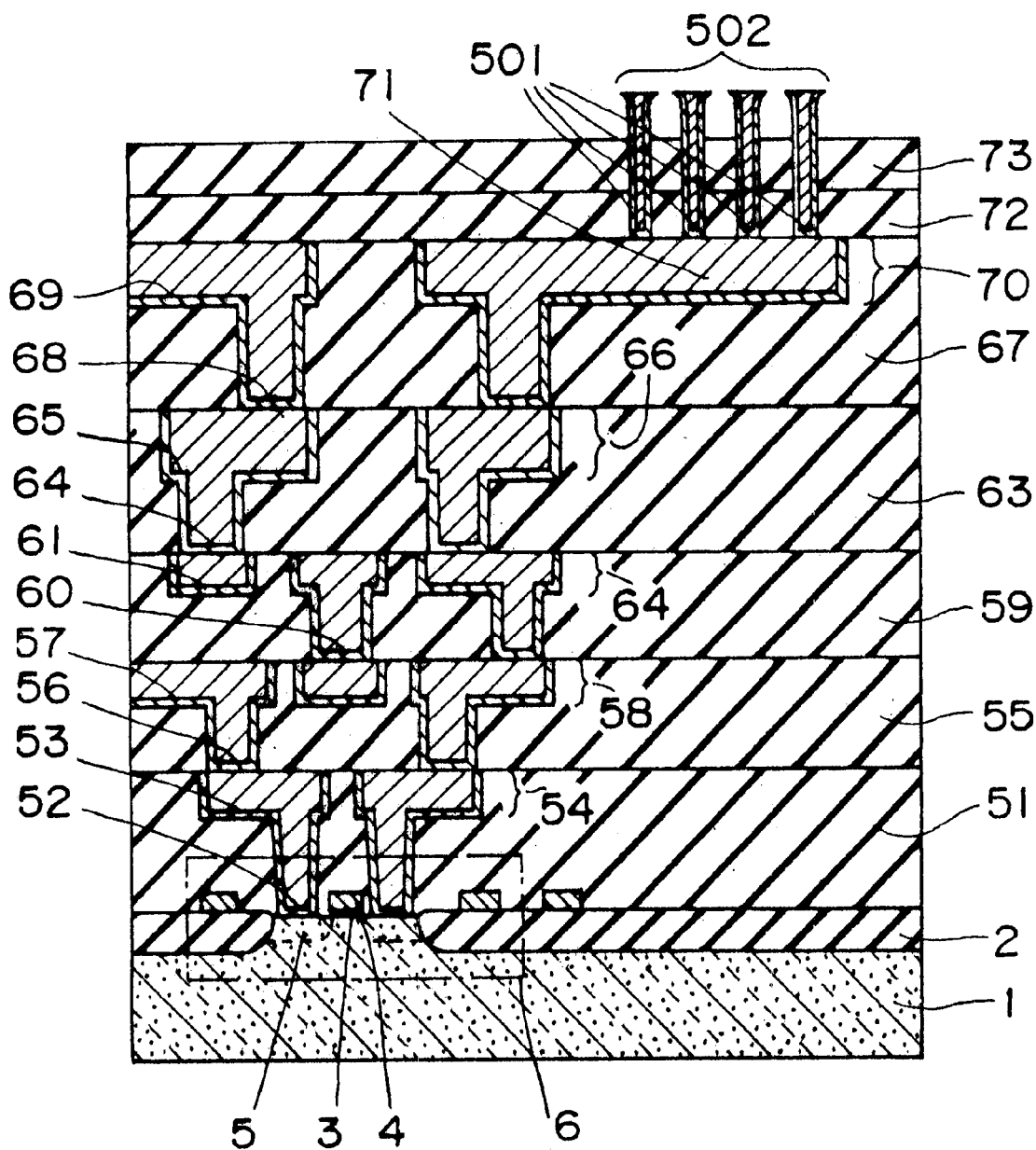
FIG. 13 is a sectional view of a semiconductor device according to the seventh embodiment of the present invention.

FIG. 13 is a sectional view of a semiconductor device according to this embodiment. In the figures, the same reference numerals as those of FIG. 19 denote the same or corresponding components.

The process of fabricating the semiconductor device according to this embodiment shown in FIG. 13 is carried out in the same manner as that for the semiconductor device according to the sixth embodiment, except that a plurality of divided openings 501 are formed on the pad electrode 71. The plurality of openings 501 are formed in the shape of about 5 to about 10-$\mu$m sided rectangle or about 5 to about 10-$\mu$m-diameter circle when the shape of the pad electrode 71 is, for example, about 100 $\mu$m-sided rectangle.

When the precious metal layer buried in the opening is removed by CMP, it is needed to take long time in perfectly removing the precious metal residue from the surface.

Figure 14B:
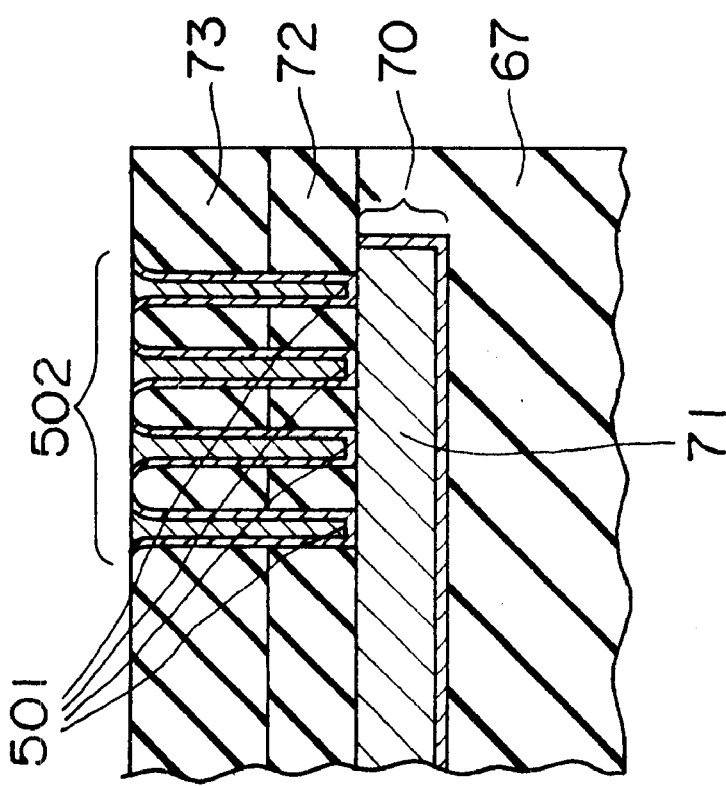
FIGS. 14A and 14B are sectional views of the semiconductor devices according to the seventh embodiment of the present invention.
Figure 14A:
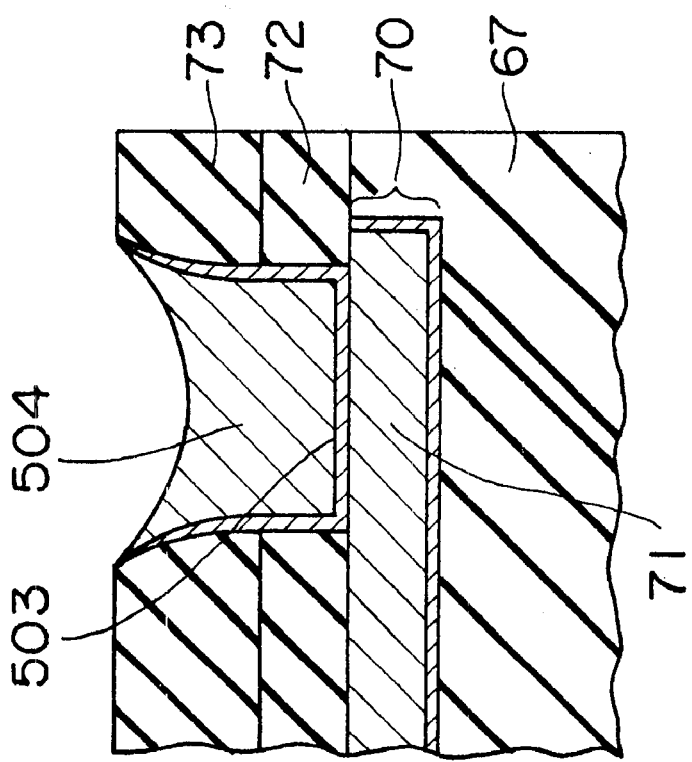

In this step, the sixth embodiment has a problem in that the electrode 504 having the larger area for use in connection with an external is excessively abraded (dishing) as shown in FIG. 14A because of the deformation of the abrasive cloth. The condition as shown in FIG. 14A permits poor stability in connection, because both electrodes can not be sufficiently pressed to each other when the electrode on the pad electrode is pressed and connected to the electrode on a mount substrate, using an anisotropic conductive resin or the like.

In contrast, in this embodiment, the opening of the pad electrode is divided into the plurality of openings 501 having small areas as shown in FIG. 14B, and thus, the dishing as mentioned above is hardly caused by polishing by CMP. Therefore, the height of the electrodes 502 for use in connection with externals can be uniform, and their surfaces can be even. Accordingly, the stability in connection with the electrodes on the mount substrate is improved even under a smaller pressing load.

Eighth Embodiment

The CMP (chemical mechanical polishing) of precious metals such as gold is essential to fabricate semiconductor integrated circuit devices such as the first to the seventh embodiments.

In the CMP of a metal layer of tungsten, copper or the like, for example, an alumina abrasive containing an oxidant such as hydrogen peroxide is used. By using such an abrasive, a metal layer of tungsten, copper or the like which is mechanically fragile (in other words, easy to polish) is polished while a metal oxide of such a metal is being produced.

In contrast, in the CMP of a precious metal such as gold or an alloy containing a precious metal as a main component, the precious metal component to be polished tends to remain on the abrasive cloth because the precious metal is hard to form an intermediate product such as an oxide, or the polished precious metal is insoluble to water, and so on. For this reason, the polishing rate is not constant, and the polished surface is non-uniform.

Figure 15A:
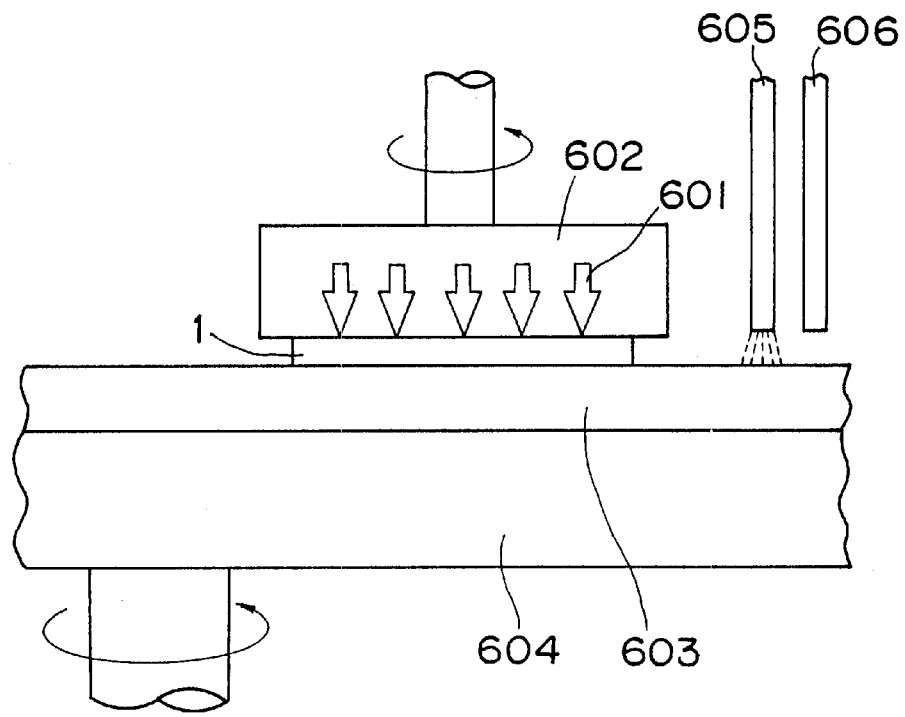
FIGS. 15A and 15B show the steps of fabricating a conventional semiconductor device.
Figure 15B:
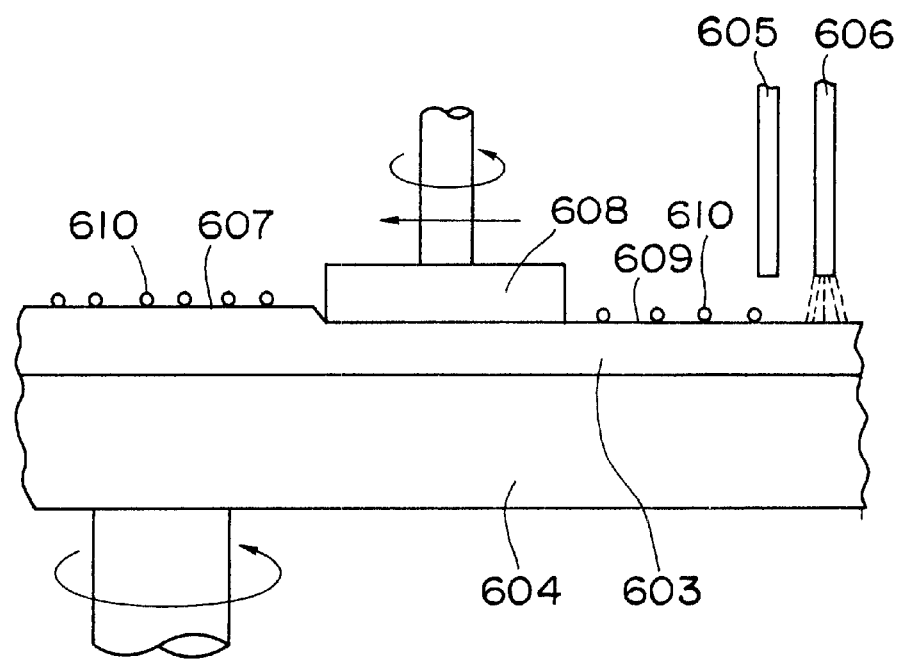

FIGS. 15A and 15B show the fabrication steps using a conventional polishing machine.

The polishing machine comprises a polishing head 602 which holds a semiconductor substrate 1 to be polished and applies a load 601 necessary for polishing, and a platen 604 to which abrasive cloth 603 made of foam polyurethane or the like is applied. The substrate is polished by rotating the polishing head 602 and the platen 604 at about 10 to about 100 rpm while supplying abrasive 605.

After the completion of polishing, pure water 606 is allowed to flow so as to clean the surface of the abrasive cloth 603, and then, the next semiconductor substrate 1 is polished.

However, if the number of semiconductor substrates 1 to be polished is increased, the surface of the abrasive cloth 603 is fatigued, which may induce a change in the polishing rate and non-uniformity in polishing. Therefore, the fatigued surface 607 of the abrasive cloth is periodically abraded with a grinding stone called a dresser 608 while flushing water 606 thereto, so as to refresh the surface 609 of the abrasive cloth (dressing operation or conditioning). As the grinding stone for a dresser, usually, diamond particles are electro-deposited on nickel for use.

As mentioned above, polishing and dressing are alternately carried out to stabilize the polishing in the conventional CMP.

However, in case of polishing a precious metal layer as in the first to seventh embodiments, the precious metal component 610 remains on the surface of the abrasive cloth because the polished precious metal is insoluble to water. Thus, the removal of the precious metal component 610 is still difficult even though the dressing is carried out.

This embodiment, therefore, relates to a method of CMP which provides stabilized polishing even when a precious metal is polished.

Figure 16A:
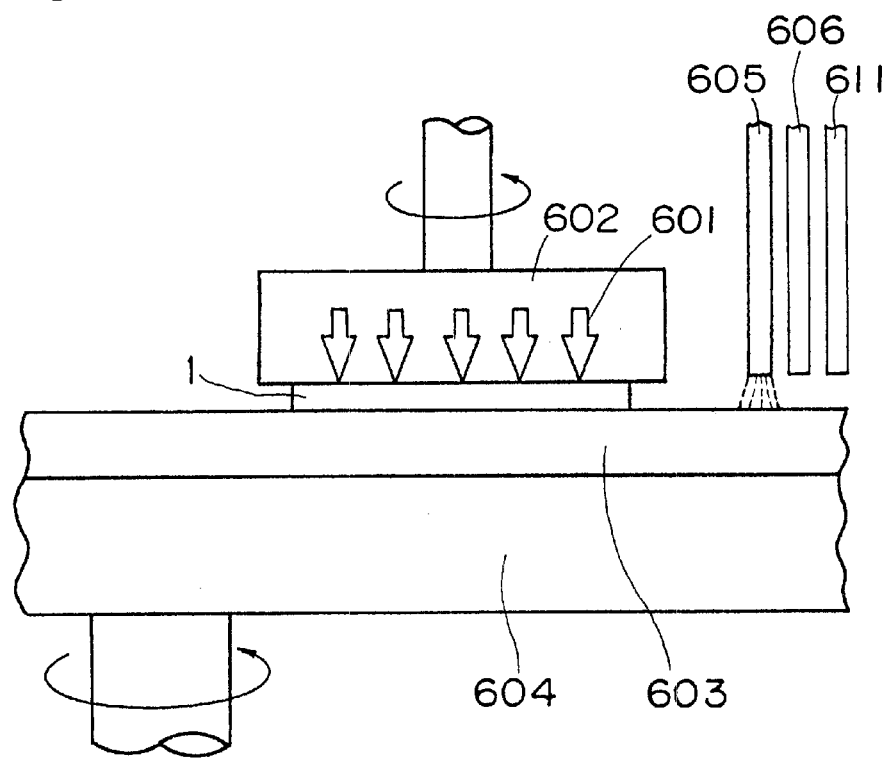
FIGS. 16A–16C show the steps of fabricating a semiconductor device according to the eighth embodiment of the present invention.
Figure 16B:
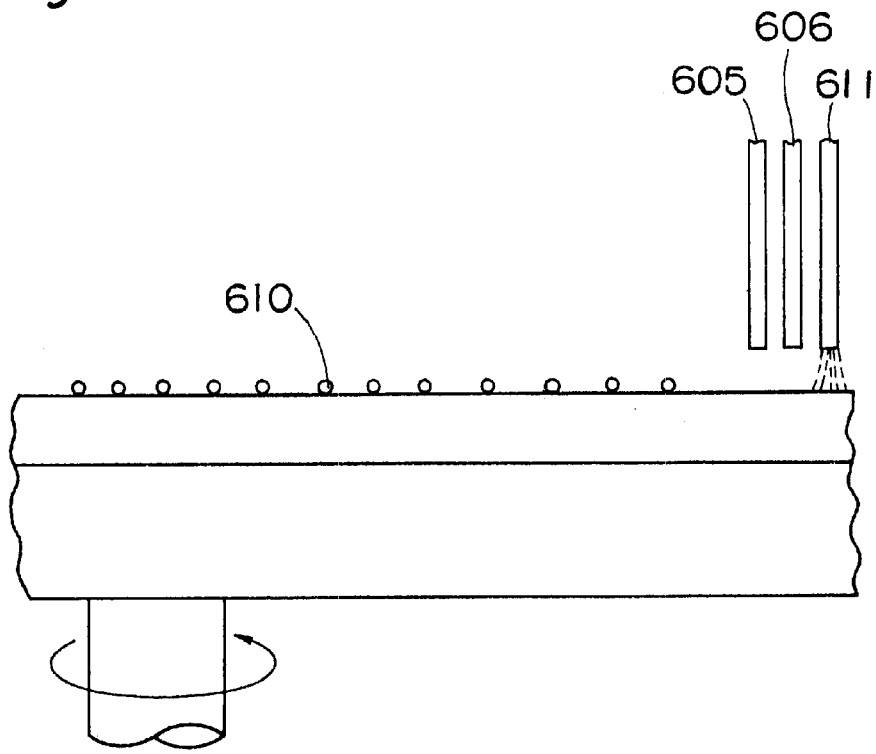
Figure 16C:
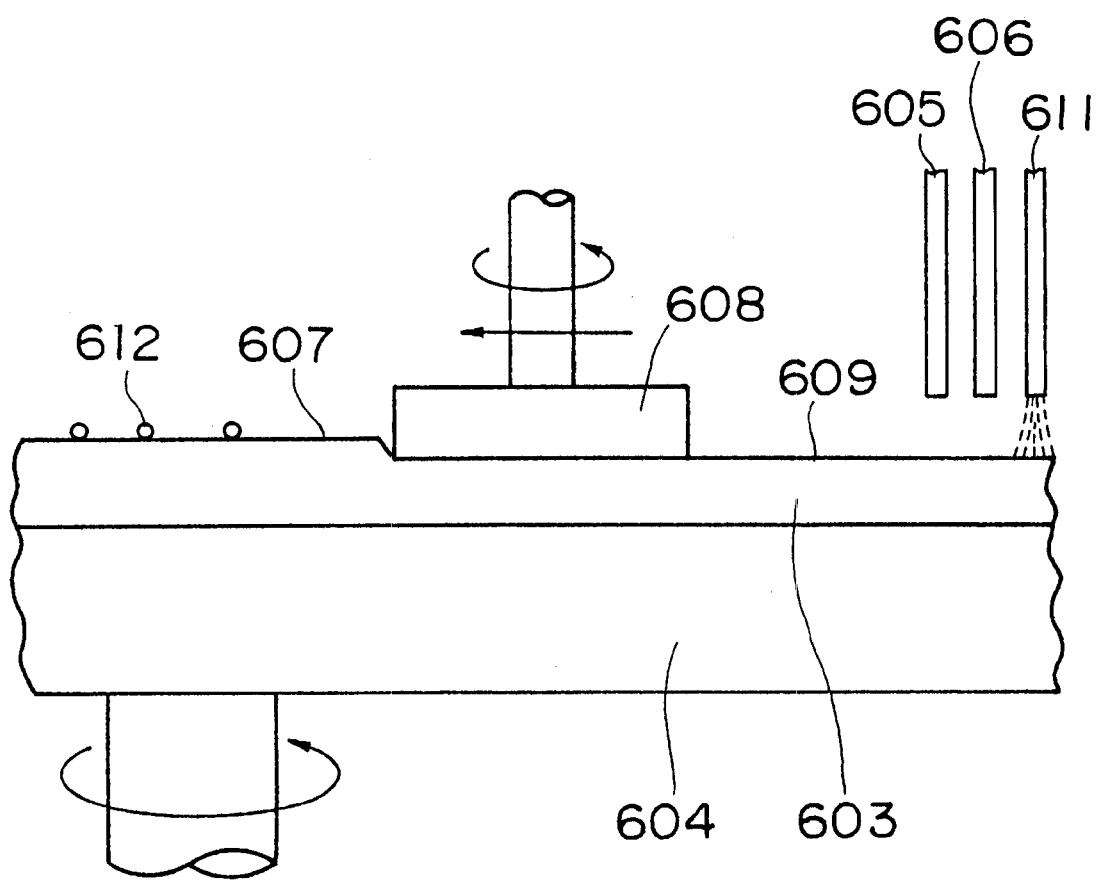

FIGS. 16A to 16C show the steps using a polishing machine according to this embodiment. In the figures, the same reference numerals as those in FIG. 15 denote the same or corresponding components.

In the method of CMP according to this embodiment, first, a precious metal layer is polished in the same manner as in the conventional CMP.

Next, as shown in FIG. 16B, after completion of the polishing, the surface of abrasive cloth 603 is washed with pure water 606 and further cleaned by allowing a chemical 611 to flow thereon.

For example, in case of CMP of gold, an aqueous mixed solution of nitric acid and hydrochloric acid (about 5 to about 20%) is allowed to flow to wash the surface of the abrasive cloth 603, so that most of the gold component 610 remaining on the surface of the abrasive cloth can be removed.

The cleaning using the chemical 611 is carried out by any of the following methods: (1) the chemical 611 is added dropwise through a nozzle and spread on the abrasive cloth by utilizing the centrifugal force of the rotation of the platen; (2) the chemical 611 is added dropwise over a whole of the surface of the abrasive cloth by making the nozzle scan the surface of the abrasive cloth; (3) the chemical 611 is sprayed as jet flow so as to enhance the cleaning power; or these methods are combined for use in cleaning.

After the treatment with the chemical 611, pure water is flushed to clean out the chemical component from the surface of the abrasive cloth 603, and then, the next semiconductor substrate 1 is polished.

When a number of semiconductor substrates 1 have been polished, the surface of the abrasive cloth 603 is fatigued, and the precious metal component 612 is accumulated on the surface of the abrasive cloth. Periodical dressing is necessary for this reason.

As shown in FIG. 16C, for example, in case of CMP of gold, the dressing is carried out while flushing an aqueous mixed solution of nitric acid and hydrochloric acid (about 5 to about 20%). The fatigued surface 607 of the abrasive cloth is abraded by dressing to remove the precious metal component 612 accumulated on the surface of the abrasive cloth and also to expose a fresh surface 609 of the abrasive cloth.

It is to be noted that a conventional grinding stone for dressing is poor in chemical resistance because it is made by electro-depositing diamond particles on nickel. Therefore, it is necessary to use a ceramic grinding stone with high chemical resistance for the dressing according to this embodiment.

After the dressing by the grinding stone, pure water 606 is flushed for slightly dressing the abrasive cloth, thereby cleaning out the chemical component from the surface of the abrasive cloth.

As described above, by employing the CMP according to this embodiment, degradation in polishing performance because of the residual precious metal component on the surface of the abrasive cloth can be prevented even when a precious metal layer of gold or the like is subjected to CMP, and thus, stabilized polishing can be carried out.

In this embodiment, chemical treatment for removing the precious metal component is carried out immediately after the polishing, and also, and in the periodical dressing, the abrasive cloth is treated with the chemical by flushing onto the abrasive cloth. However, only the latter chemical treatment may be carried out every after polishing or periodically.

As the chemical, an aqueous mixed solution of potassium cyanide and ammonium persulfate, an aqueous mixed solution of hydrochloric acid and hydrogen peroxide, etc. may be used.

The foregoing CMP can be applied to precious metals such as platinum, silver, palladium and rhodium other than gold, or alloys containing these precious metals as main components.

Further, similar effects can be obtained by using the chemical according to this embodiment in the conventional CMP of tungsten and copper.

Ninth Embodiment

Figure 17:
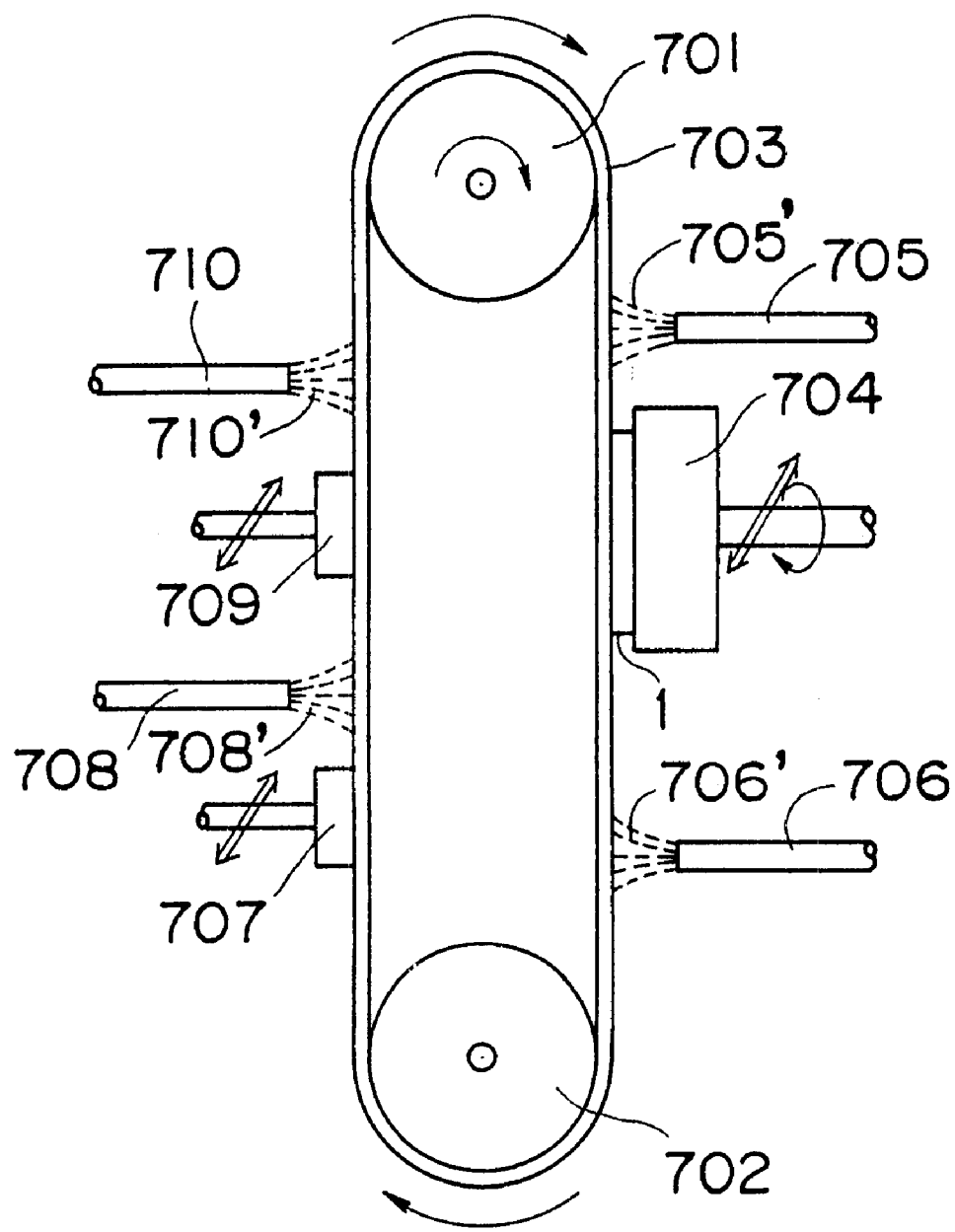
FIG. 17 is a schematic diagram of an apparatus for CMP according to the ninth embodiment of the present invention.

FIG. 17 shows a schematic diagram of a CMP apparatus according to this embodiment.

In the CMP apparatus shown in FIG. 17, a belt type abrasive cloth 703 is unidirectionally moved at a constant rate by rotating a pair of rolls 701 and 702. A semiconductor substrate 1 to be polished is secured to a polishing head 704 which rotates and scans at high speed, and the semiconductor substrate 1 is polished under a sufficient load while an abrasive 705' is being flushed from an abrasive supply nozzle 705.

For example, in case of CMP of gold, because the polished gold component tends to remain on the abrasive cloth 703 as mentioned above, an aqueous mixed solution of nitric acid and hydrochloric acid is used as a chemical 706', and it is flushed from a chemical supply nozzle 706 to remove the gold component on the surface of the abrasive cloth 703.

After the polishing of the semiconductor substrate 1, the abrasive cloth 703 is subjected to dressing, using a first dresser 707 which comprises a ceramic grinding stone and which rotates scanning, while an aqueous mixed solution of nitric acid and hydrochloric acid as the chemical 708' is being flushed from a chemical supply nozzle 708.

Further, a second dresser 709, which comprises a grinding stone of finer grains than those of the first dresser 707 and which rotates scanning, is used to softly dress the abrasive cloth 703 while pure water 710' being flushed from a pure water supply nozzle 710, so as to remove the chemical component from the surface of the abrasive cloth 703.

The polishing step and the dressing step as mentioned above are continuously carried out to thereby prevent the polished material from remaining on the surface of the abrasive cloth 703. Thus, the polishing performance can be stabilized.

In this embodiment, the step of removing the remaining substance by using the chemical (the chemical treatment and the chemical dressing) is carried out concurrently with the polishing operation. Otherwise, these steps may be separately carried out.

Alternatively, the step of removing the remaining substance by using the chemical may be carried out using only one dresser. In detail, first, one dresser is used to dress the abrasive cloth with the chemical, and then, the same dresser is used to dress the abrasive cloth with pure water.

Figure 18:
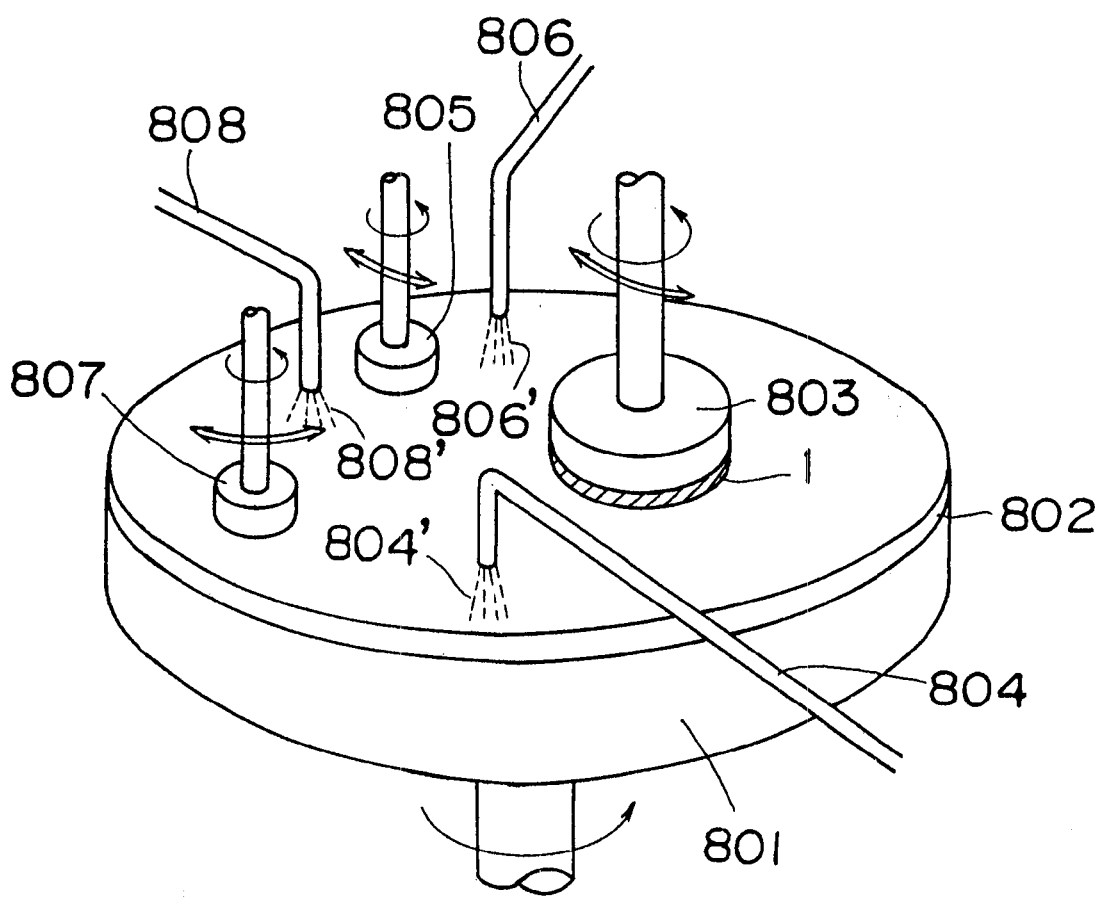
FIGS. 18 is a schematic diagram of another apparatus for CMP according to the ninth embodiment of the present invention.

FIG. 18 shows a schematic diagram of another CMP apparatus according to this embodiment.

In the CMP apparatus shown in FIG. 18, abrasive cloth 802 applied to a rotatable polishing platen 801 is moved at constant rpm. A semiconductor substrate 1 to be polished is secured to a polishing head 803 which similarly rotates and scans at high speed, and the semiconductor substrate 1 is polished under a sufficient load while an abrasive 804' is being flushed from an abrasive supply nozzle 804.

After the polishing of the semiconductor substrate 1, the abrasive cloth 802 is dressed by a first dresser 805 which comprises a ceramic grinding stone and which rotates scanning, while a chemical 806' is being flushed from a chemical supply nozzle 806.

The abrasive cloth 802 is further softly dressed by a second dresser 807 which comprises a grinding stone of finer grains than those of the first dresser 805, while pure water 808' is being flushed from a pure water supply nozzle 808, so as to remove the chemical component from the surface of the abrasive cloth 802.

By doing so, the component of the polished substrate is prevented from remaining on the surface of the abrasive cloth 802. Therefore, the polishing performance can be stabilized.

It should also be understood that the foregoing relates to only preferred embodiments of the invention, and that it is intended to cover all changes and modifications of the example of the invention herein chosen for the purposes of the disclosure, which do not constitute departures from the spirit and scope of the invention.

What is claimed is:

1. A semiconductor device comprising
   a semiconductor substrate,
   an insulating layer formed on said semiconductor substrate,
   a multilayer wiring structure buried in said insulating layer and comprising a multilayer wiring film and at least one via hole for connecting the layers of said multilayer wiring film to each other,
   at least one pad electrode connected to said multilayer wiring structure, and
   an insulating layer covering said at least one pad electrode and having at least one opening over said at least one pad electrode so as to expose the surface of said at least one pad electrode,
   wherein one surface of said insulating layer is in contact with a metal layer formed from one selected from precious metals and alloys containing the precious metals as main components.

2. The semiconductor device according to claim 1, wherein an oxidation-preventive layer composed of one selected from said precious metals and said alloys is continuously formed on the exposed surface of said pad electrode and the insulating layer within said opening.

3. The semiconductor device according to claim 1, wherein at least one electrode for use in connecting at least one external electrode is provided, said electrode being buried in said opening with its upper end face exposed over the surface of said insulating layer, and wherein said at least one electrode for use in connecting at least one external electrode is formed from one selected from said precious metals and said alloys.

4. The semiconductor device according to claim 3, wherein a plurality of said openings are formed on the insulating layer and a plurality of said electrodes for use in connecting external electrodes are buried in the plurality of said openings, respectively.

5. The semiconductor device according to claim 2, wherein said pad electrode is formed from one selected from aluminum and copper.

6. The semiconductor device according to claim 1, wherein said pad electrode is formed from one selected from said precious metals and said alloys.

7. The semiconductor device according to claim 6, wherein an underlying pad electrode is interposed between said pad electrode and said multilayer wiring film for connecting to them, respectively.

8. The semiconductor device according to claim 7, wherein said pad electrode and said underlying pad electrode are connected to each other through a via hole having a larger sectional area than that of said via hole for connecting the layers of said multilayer wiring film to each other.

9. The semiconductor device according to claim 6, wherein said multilayer wiring structure is formed from one selected from aluminum and copper.

10. A method for fabricating a semiconductor device, comprising the steps of:
    forming a multilayer wiring structure on a semiconductor substrate,
    forming at least one pad electrode connected to said multilayer wiring structure,
    forming an insulating layer so as to cover said at least one pad electrode,
    forming at least one opening on said insulating layer so as to expose the surface of said pad electrode, and
    forming an oxidation-preventive layer so as to cover the exposed surface of said pad electrode and the side wall of said opening, said oxidation-preventive layer being formed from one selected from precious metals and alloys containing said precious metals as main components.

11. The method according to claim 10, wherein the step of forming said oxidation-preventive layer includes the steps of:
    forming a metal layer on the overall surface of said insulating layer from one selected from said precious metals and said alloys, and
    removing said metal layer from the surface of said insulating layer by chemical mechanical polishing or CMP so that portions of said metal layer can remain on the exposed surface of said pad electrode and the side wall of said opening so as to serve as said oxidation-preventive layer.

12. The method according to claim 10, wherein the step of forming said oxidation-preventive layer includes the steps of:
    sputtering the exposed surface of said pad electrode within said opening to re-deposit the material of said pad electrode on the side wall of said opening so as to form a re-deposited layer thereon, and selectively forming a plating layer composed of one selected from said precious metals and said alloys on the exposed surface of said pad electrode and said re-deposited layer, thereby using said plating layer as said oxidation-preventive layer.

13. The method according to claim 10, wherein the step of forming said oxidation-preventive layer includes the steps of:

depositing a metal layer composed of one selected from said precious metals and said alloys on the overall surface of said insulating layer, removing said metal layer from said insulating layer by CMP so that a part of said metal layer can remain and fill said opening to form an electrode for use in connecting an external electrode, said electrode serving also as said oxidation-preventive layer, and selectively etching said insulating layer so as to raise said electrode for use in connecting an external electrode over said insulating layer.

* * * * *